US006645398B1

(12) United States Patent
Hampden-Smith et al.

(10) Patent No.: US 6,645,398 B1
(45) Date of Patent: *Nov. 11, 2003

(54) SULFUR-CONTAINING PHOSPHOR POWDERS, METHODS FOR MAKING PHOSPHOR POWDERS AND DEVICES INCORPORATING SAME

(75) Inventors: Mark J. Hampden-Smith, Albuquerque, NM (US); Toivo T. Kodas, Albuquerque, NM (US); James Caruso, Albuquerque, NM (US); Daniel J. Skamser, Albuquerque, NM (US); Quint H. Powell, Albuquerque, NM (US); Klaus Kunze, Albuquerque, NM (US)

(73) Assignee: Superior Micropowders LLC, Albuquerque, NM (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/718,640

(22) Filed: Nov. 22, 2000

Related U.S. Application Data

(63) Continuation of application No. 09/030,060, filed on Feb. 24, 1998, now Pat. No. 6,513,123.
(60) Provisional application No. 60/038,262, filed on Feb. 24, 1997, and provisional application No. 60/039,450, filed on Feb. 24, 1997.

(51) Int. Cl.[7] ............................................... C09K 11/56
(52) U.S. Cl. ............................. 252/301.45; 252/301.6 S
(58) Field of Search ....................... 252/301.45, 301.65; 428/403, 404

(56) References Cited

U.S. PATENT DOCUMENTS 3,676,358 A 7/1972 Dale et al. ............... 252/301.4
3,691,088 A 9/1972 Pelton ...................... 252/301.6
3,709,826 A 1/1973 Pitt et al. ................. 252/301.4

(List continued on next page.)

FOREIGN PATENT DOCUMENTS

WO WO 96/01297 1/1996

OTHER PUBLICATIONS

Abrahams et al., Nucleation of Precipitates of ZnS and (Zu, Cd)S for Phosphor Synthesis; J. Electrochem. Soc.: Solid–State Science and Technology; Jun. 1988, pp. 1578–1583.
Faria, S.; Electroluminescent Characteristics of Small Particle Size Phosphors; Silicon Epitaxial Films; Oct. 1988; vol. 135, No. 10; pp. 2627–2630.
Kawamura et al.; Extension of Phosphorescene Decay Time of CaS:Mn Phosphor; J. Electrochem. Soc., vol. 136, No. 4; Apr. 1989; pp. 1229–1232.
Kutty, T.R.N.; A Controlled Copper–Coating Method For the Preparation of ZnS:Mn DC Electroluminescent Powder Phosphor; Mat. Res. Bull., vol. 26, pp. 399–406; 1991.
Ozawa, Luuji; Preparation of Y2O2S:Eu Phosphor Particles of Different Sizes by a Flux Method; J. Electrochem. Soc.: Solid State Science and Technology; vol. 124, No. 3; pp. 413–417. No date.
Rao; The Preparation and Thermoluninescence of Alkaline Earth Sulphide Phosphors; pp. 3357–3386. No date.
Tamaki et al.; Formation of CdS Fine Particles by Spray–pyrolysis; 1995; pp. 1388–1390.
Tohge et al.; Formation of Fine Particles of Zinc Sulfide from Thiourea Complexes by Spray Pyrolysis; Jpn. J. Appl. Phys. vol. 34 (1995) Pt. 2 No. 2B; pp. 207–209.

*Primary Examiner*—C. Melissa Koslow
(74) *Attorney, Agent, or Firm*—Marsh Fischmann & Breyfogle LLP

(57) ABSTRACT

Sulfur-containing phosphor powders, methods for making phosphor powders and devices incorporating same. The powders have a small particle size, narrow particle size distribution and are substantially spherical. The method of the invention permits the continuous production of such powders. The invention also relates to products such as display devices incorporating such phosphor powders.

20 Claims, 42 Drawing Sheets

U.S. PATENT DOCUMENTS

| | | | |
|---|---|---|---|
| 3,731,353 A | 5/1973 | Vecht | 29/25.13 |
| 3,742,277 A | 6/1973 | Peters | 313/92 |
| 3,875,449 A | 4/1975 | Byler et al. | 313/466 |
| 3,981,819 A | 9/1976 | Yocom et al. | 252/301.4 |
| 3,984,586 A | 10/1976 | Kawarada et al. | 427/64 |
| 4,208,299 A | 6/1980 | Oikawa et al. | 252/301.6 |
| 4,208,461 A | 6/1980 | Vanderpool | 428/207 |
| 4,209,567 A | 6/1980 | Takahara et al. | 428/403 |
| 4,275,333 A * | 6/1981 | Kagami et al. | 252/301.4 S |
| 4,287,229 A | 9/1981 | Watanabe et al. | 427/64 |
| 4,339,501 A | 7/1982 | Inoue et al. | 428/404 |
| 4,365,184 A | 12/1982 | Higton et al. | 313/503 |
| 4,374,037 A | 2/1983 | Takahashi | 252/301.4 |
| 4,377,769 A * | 3/1983 | Beatty et al. | 252/301.6 S |
| 4,436,646 A | 3/1984 | Takahara et al. | 252/301.4 |
| 4,508,760 A | 4/1985 | Olson et al. | 427/213.34 |
| 4,515,827 A | 5/1985 | Dodds et al. | 427/68 |
| 4,724,161 A | 2/1988 | Coutts et al. | 427/57 |
| 4,806,389 A | 2/1989 | Peters et al. | 427/67 |
| 4,826,727 A | 5/1989 | Glaser | 428/403 |
| 4,853,254 A | 8/1989 | Wolfe | 427/64 |
| 4,855,189 A | 8/1989 | Simopoulos et al. | 428/690 |
| 4,874,985 A | 10/1989 | Hase et al. | 313/487 |
| 4,902,567 A | 2/1990 | Eilertsen et al. | 428/328 |
| 4,921,727 A | 5/1990 | Datta et al. | 427/57 |
| 4,948,527 A | 8/1990 | Ritsko et al. | 252/301.4 |
| 5,080,928 A | 1/1992 | Klinedinst et al. | 427/70 |
| 5,156,885 A | 10/1992 | Budd | 427/70 |
| 5,244,750 A | 9/1993 | Reilly et al. | 428/690 |
| 5,363,012 A | 11/1994 | Mizukami et al. | 313/468 |
| 5,413,736 A | 5/1995 | Nishisu et al. | 252/301.4 |
| 5,418,062 A | 5/1995 | Budd | 428/403 |
| 5,455,489 A | 10/1995 | Bhargava | 315/169.4 |
| 5,644,193 A | 7/1997 | Matsuda et al. | 313/486 |
| 5,662,831 A | 9/1997 | Chadha | 252/301.4 |
| 5,772,916 A * | 6/1998 | Jamil et al. | 252/301.4 R |
| 5,811,924 A * | 9/1998 | Okumura et al. | 313/487 |
| 6,039,894 A * | 3/2000 | Sanjurjo et al. | 252/301.4 S |
| 6,132,642 A * | 10/2000 | Kane | 252/301.4 S |
| 6,153,123 A * | 11/2000 | Hampden-Smith et al. | 252/301.4 S |
| 6,168,731 B1 * | 1/2001 | Hampden-Smith et al. | |
| 6,193,908 B1 * | 2/2001 | Hampden-Smith et al. | 252/301.4 S |
| 6,210,604 B1 * | 4/2001 | Hampden-Smith et al. | 252/301.4 S |
| 2001/0052589 A1 * | 12/2001 | Hampden-Smith et al. | 252/301.4 S |

\* cited by examiner

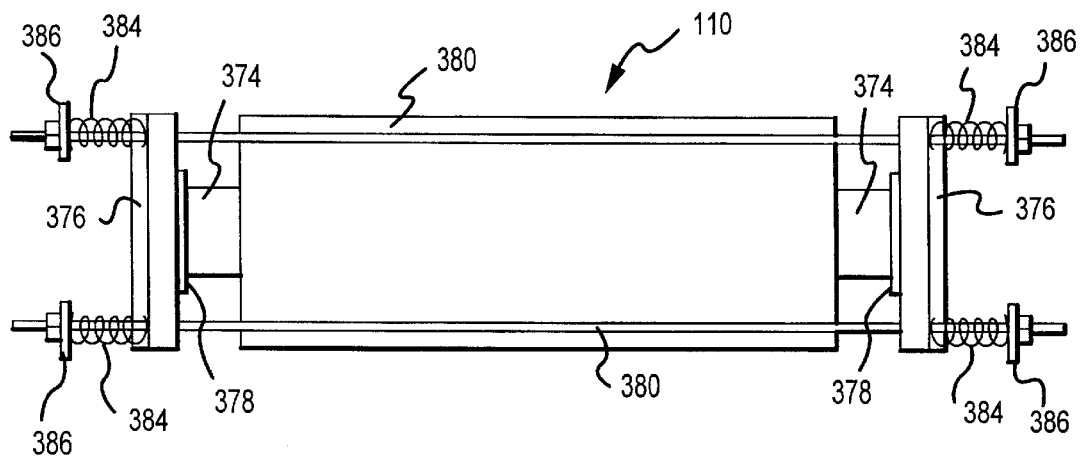
FIG.2
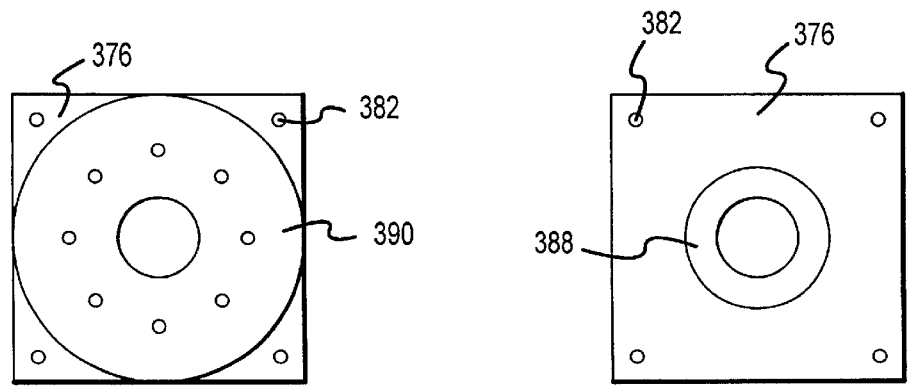
FIG.3
FIG.4

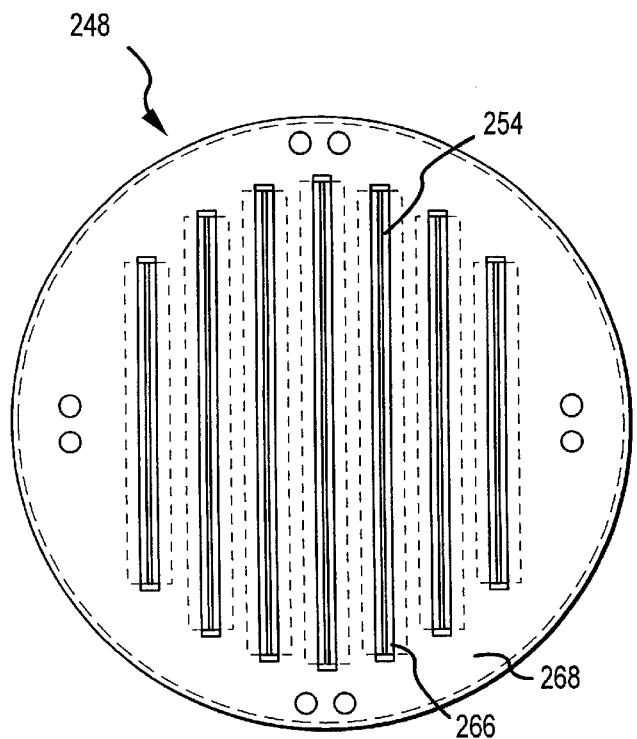
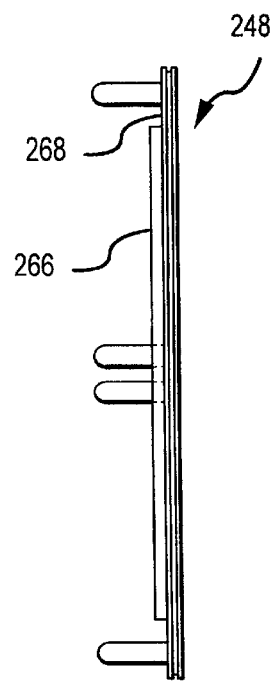
FIG.27    FIG.29
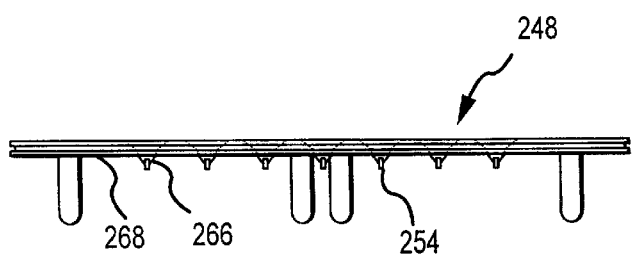
FIG.28

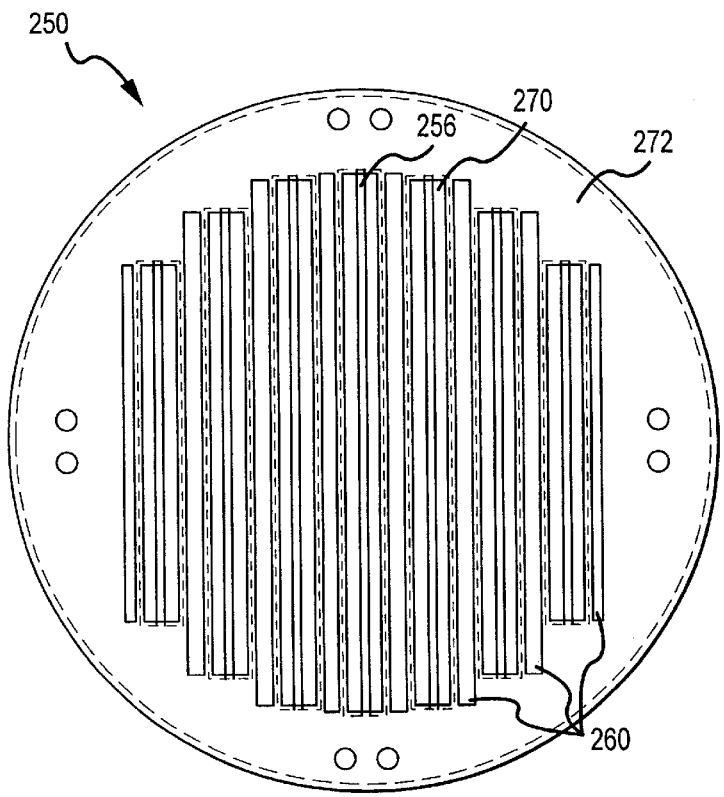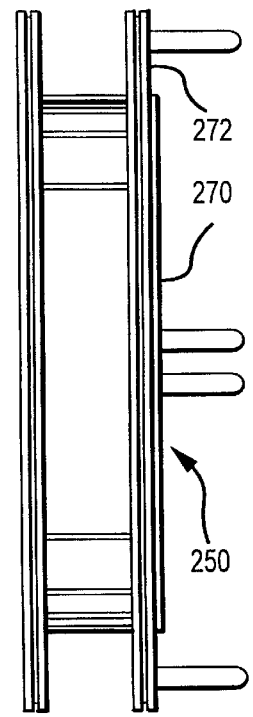
FIG.30
FIG.32
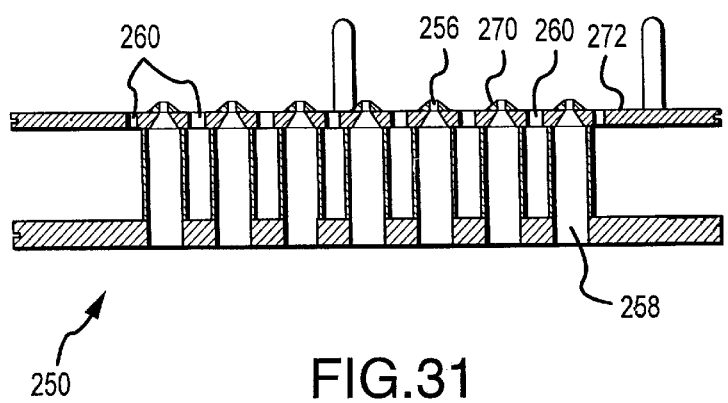
FIG.31

SULFUR-CONTAINING PHOSPHOR POWDERS, METHODS FOR MAKING PHOSPHOR POWDERS AND DEVICES INCORPORATING SAME

This application is a continuation application of U.S. patent application Ser. No. 09/030,060 filed Feb. 24, 1998, now U.S. Pat. No. 6,513,123, which claims priority from U.S. Provisional Application Nos. 60/038,262 and 60/039,450, both filed on Feb. 24, 1997.

BACKGROUND OF THE INVENTION

1. Field of the Invention

The present invention is directed to phosphor powders, methods for producing phosphor powders and devices incorporating the powders. In particular, the present invention is directed to sulfur-containing phosphor powders having small average particle size, a narrow particle size distribution, high crystallinity and a spherical morphology. The present invention also relates to a method for continuously producing such sulfur-containing phosphor powders and to devices that incorporate the powders, such as flat panel display devices.

2. Description of Related Art

Phosphors are compounds that are capable of emitting useful quantities of radiation in the visible and/or ultraviolet spectrums upon excitation of the phosphor compound by an external energy source. Due to this property, phosphor compounds have long been utilized in cathode ray tube (CRT) display devices, such as televisions, computers and similar devices. Typically, inorganic phosphor compounds include a host material doped with a small amount of an activator ion.

More recently, phosphor compounds, including phosphors in particulate form, have been utilized in many advanced display devices that provide illuminated text, graphics or video output. In particular, there has been significant growth in the field of flat panel display devices such as liquid crystal displays, plasma displays, thick film and thin film electroluminescent displays and field emission displays.

Liquid crystal displays (LCD) use a low power electric field to modify a light path and are commonly used in wristwatches, pocket televisions, gas pumps, pagers and similar devices. Active matrix liquid crystal displays (AMLCD) are commonly used for laptop computers. Plasma display panels (PDP) utilize a gas, trapped between transparent layers, that emits ultraviolet light when excited by an electric field. The ultraviolet light stimulates phosphors on the screen to emit visible light. Plasma displays are particularly useful for larger displays, such as greater than about 20 diagonal inches. Thin film and thick film electroluminescent displays (TFEL) utilize a film of phosphorescent material trapped between glass plates and electrodes to emit light in an electric field. Such displays are typically used in commercial transportation vehicles, factory floors and emergency rooms. Field emission displays (FED) are similar in principle to CRT's, wherein electrons emitted from a tip excite phosphors, which then emit light of a preselected color. Phosphor powders are also utilized in electroluminescent lamps (EL), which include phosphor powder deposited on a polymer substrate which emits light when an electric field is applied.

There are a number of requirements for phosphor powders, which can vary dependent upon the specific application of the powder. Generally, phosphor powders should have one or more of the following properties: high purity; high crystallinity; small particle size; narrow particle size distribution; spherical morphology; controlled surface chemistry; homogenous distribution of the activator ion; good dispersibility, and low porosity. The proper combination of the foregoing properties will result in a phosphor powder with high luminescent intensity and long lifetime that can be used in many applications. It is also advantageous for many applications to provide phosphor powders that are surface passivated or coated, such as with a thin, uniform dielectric or semiconducting coating.

Numerous methods have been proposed for producing sulfur-containing phosphor particles. One such method is referred to as the solid-state method. In this process, solid phosphor precursor materials are mixed and are heated so that the precursors react in the solid-state and form a powder of the phosphor material. It is difficult to produce a uniform and homogenous phosphor powder by solid state methods. Further, solid-state routes, and many other production methods, utilize a grinding step to reduce the particle size of the powders. Mechanical grinding damages the surface of the phosphor, forming dead layers which inhibit the brightness of the phosphor powders.

Phosphor powders have also been made by liquid precipitation methods. In these methods, a solution which includes phosphor particle precursors is chemically treated to precipitate phosphor particles or phosphor particle precursors. The precipitated compounds are typically calcined at an elevated temperature to produce the final phosphor material. An example of this type of preparation is disclosed in U.S. Pat. No. 5,413,736 by Nishisu et al. In yet another method, phosphor particle precursors or phosphor particles are dispersed in a solution which is then spray dried to evaporate the liquid. The phosphor particles are thereafter sintered in the solid state at an elevated temperature to crystallize the powder and form the phosphor compound. Such a process is exemplified by U.S. Pat. No. 4,948,527 by Ritsko et al. and U.S. Pat. No. 3,709,826 by Pitt et al.

International Application No. PCT/US95/07869 by Kane discloses a process for preparing oxysulfide phosphor particles having a particle, size of 1 $\mu$m or less that are spherical in shape. In this process, hydroxycarbonate compounds are precipitated from solution. The hydroxycarbonates are then heated in oxygen to form an oxide which is then heated in a sulfur-containing flux to form the oxysulfide phosphor.

U.S. Pat. No. 3,676,358 discloses a process wherein a solution of precursor nitrates are atomized and heated at 400° F. to dry the particles. The particles are then passed through a flame to react and form the phosphor.

Tohge et al. in an article entitled "Formation of Fine Particles of Zinc Sulfide from Thiourea Complexes by Spray Pyrolysis" (Japanese Journal of Applied Physics, Vol. 34, 1995, pgs. 207–209) disclose particles of ZnS fabricated by ultrasonic spray pyrolysis of an aqueous solution. The particles are spherical with a smooth surface and have a size range of from 0.5 to 1.3 $\mu$m. It is disclosed that particles reacted at 400° C. are amorphous whereas particles reacted at 600° C. and higher show crystalline phases. Partial oxidation of the zinc sulfide above 900° C. was also observed. Tohge et al. have also disclosed the formation of cadmium sulfide by a similar process in an article entitled "Formation of CdS fine particles by spray-pyrolysis" journal Material Science Letter, Vol. 14, 1995, pgs. 1388–1390).

Despite the foregoing, there remains a need for phosphor powder batches that include particles having a small size, substantially spherical morphology, narrow particle size distribution, a high degree of crystallinity and good homogeneity, which result in high luminescent intensity. The powder should have good dispersibility and the ability to be fabricated into thin layers having uniform thickness, resulting in a device with high brightness.

SUMMARY OF THE INVENTION

The present invention is directed to sulfur-containing phosphor powder batches preferably having a small particle size, narrow particle size distribution, spherical morphology and high crystallinity. The present invention also provides methods for producing such sulfur-containing phosphor powder batches and devices incorporating the powders.

BRIEF DESCRIPTION OF THE DRAWINGS

FIG. 2 is a side view of a furnace and showing one embodiment of the present invention for sealing the end of a furnace tube.

FIG. 3 is a view of the side of an end cap that faces away from the furnace shown in FIG. 2.

FIG. 4 is a view of the side of an end cap that faces toward the furnace shown in FIG. 2.

FIG. 27 is a front view of an upstream plate assembly of the virtual impactor shown in FIG. 26.

FIG. 28 is a top view of the upstream plate assembly shown in FIG. 27.

FIG. 29 is a side view of the upstream plate assembly shown in FIG. 27.

FIG. 30 is a front view of a downstream plate assembly of the virtual impactor shown in FIG. 26.

FIG. 31 is a top view of the downstream plate assembly shown in FIG. 30.

FIG. 32 is a side view of the downstream plate assembly shown in FIG. 30.

DESCRIPTION OF THE INVENTION

Figure 1:
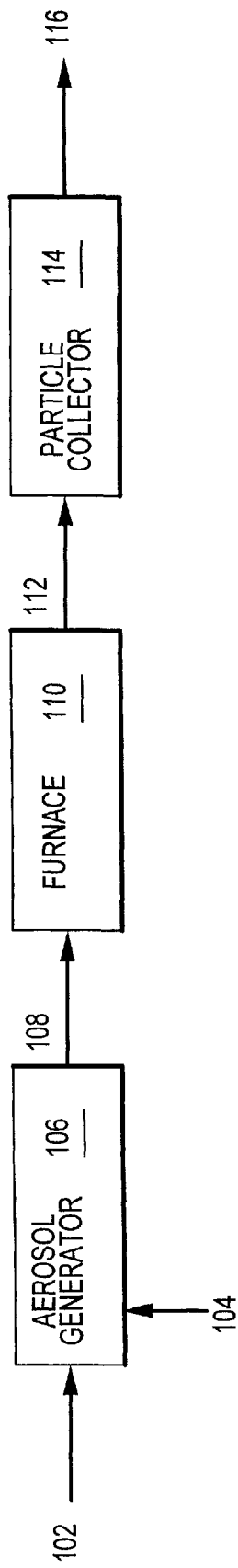
FIG. 1 is a process block diagram showing one embodiment of the process of the present invention.

The present invention is generally directed to sulfur-containing phosphor powders and methods for producing the powders, as well as devices which incorporate the powders. As used herein, sulfur-containing phosphor powders, particles and compounds are those which incorporate the host material which is a metal sulfide, oxysulfide or thiogallate. Specific examples of such sulfur-containing phosphor compounds are detailed hereinbelow.

In one aspect, the present invention provides a method for preparing a particulate product. A feed of liquid-containing, flowable medium, including at least one precursor for the desired particulate product, is converted to aerosol form, with droplets of the medium being dispersed in and suspended by a carrier gas. Liquid from the droplets in the aerosol is then removed to permit formation in a dispersed state of the desired particles. Typically, the feed precursor is pyrolyzed in a furnace to make the particles. In one embodiment, the particles are subjected, while still in a dispersed state, to compositional or structural modification, if desired. Compositional modification may include, for example, coating the particles. Structural modification may include, for example, crystallization, recrystallization or morphological alteration of the particles. The term powder is often used herein to refer to the particulate product of the present invention. The use of the term powder does not indicate, however, that the particulate product must be dry or in any particular environment. Although the particulate product is typically manufactured in a dry state, the particulate product may, after manufacture, be placed in a wet environment, such as in a paste or slurry.

The process of the present invention is particularly well suited for the production of particulate products of finely divided particles having a small weight average size. In addition to making particles within a desired range of weight average particle size, with the present invention the particles may be produced with a desirably narrow size distribution, thereby providing size uniformity that is desired for many applications.

In addition to control over particle size and size distribution, the method of the present invention provides significant flexibility for producing particles of varying composition, crystallinity and morphology. For example, the present invention may be used to produce homogeneous particles involving only a single phase or multi-phase particles including multiple phases. In the case of multi-phase particles, the phases may be present in a variety of morphologies. For example, one phase may be uniformly dispersed throughout a matrix of another phase. Alternatively, one phase may form an interior core while another phase forms a coating that surrounds the core. Other morphologies are also possible, as discussed more fully below.

Referring now to FIG. 1, one embodiment of the process of the present invention is described. A liquid feed 102, including at least one precursor for the desired particles, and a carrier gas 104 are fed to an aerosol generator 106 where an aerosol 108 is produced. The aerosol 108 is then fed to a furnace 110 where liquid in the aerosol 108 is removed to produce particles 112 that are dispersed in and suspended by gas exiting the furnace 110. The particles 112 are then collected in a particle collector 114 to produce a particulate product 116.

As used herein, the liquid feed 102 is a feed that includes one or more flowable liquids as the major constituent(s), such that the feed is a flowable medium. The liquid feed 102 need not comprise only liquid constituents. The liquid feed 102 may comprise only constituents in one or more liquid phase, or it may also include particulate material suspended in a liquid phase. The liquid feed 102 must, however, be capable of being is atomized to form droplets of sufficiently small size for preparation of the aerosol 108. Therefore, if the liquid feed 102 includes suspended particles, those particles should be relatively small in relation to the size of droplets in the aerosol 108. Such suspended particles should typically be smaller than about 1 μm in size, preferably smaller than about 0.5 μm in size, and more preferably smaller than about 0.3 μm in size and most preferably smaller than about 0.1 μm in size. Most preferably, the suspended particles should be able to form a colloid. The suspended particles could be finely divided particles, or could be agglomerate masses comprised of agglomerated smaller primary particles. For example, 0.5 μm particles could be agglomerates of nanometer-sized primary particles. When the liquid feed 102 includes suspended particles, the particles typically comprise no greater than about 25 to 50 weight percent of the liquid feed.

As noted, the liquid feed 102 includes at least one precursor for preparation of the particles 112. The precursor may be a substance in either a liquid or solid phase of the liquid feed 102. Frequently, the precursor will be a material, such as a salt, dissolved in a liquid solvent of the liquid feed 102. The precursor may undergo one or more chemical reactions in the furnace 110 to assist in production of the particles 112. Alternatively, the precursor material may contribute to formation of the particles 112 without undergoing chemical reaction. This could be the case, for example, when the liquid feed 102 includes, as a precursor material, suspended particles that are not chemically modified in the furnace 110. In any event, the particles 112 comprise at least one component originally contributed by the precursor.

The liquid feed 102 may include multiple precursor materials, which may be present together in a single phase or separately in multiple phases. For example, the liquid feed 102 may include multiple precursors in solution in a single liquid vehicle. Alternatively, one precursor material could be in a solid particulate phase and a second precursor material could be in a liquid phase. Also, one precursor material could be in one liquid phase and a second precursor material could be in a second liquid phase, such as could be the case when the liquid feed 102 comprises an emulsion. Different components contributed by different precursors may be present in the particles together in a single material phase, or the different components may be present in different material phases when the particles 112 are composites of multiple phases. Specific examples of preferred precursor materials are discussed more fully below.

The carrier gas 104 may comprise any gaseous medium in which droplets produced from the liquid feed 102 may be dispersed in aerosol form. Also, the carrier gas 104 may be inert, in that the carrier gas 104 does not participate in formation of the particles 112. Alternatively, the carrier gas may have one or more active component(s) that contribute to formation of the particles 112. In that regard, the carrier gas may include one or more reactive components that react in the furnace 110 to contribute to formation of the particles 112. Preferred carrier gas compositions are discussed more fully below.

The aerosol generator 106 atomizes the liquid feed 102 to form droplets in a manner to permit the carrier gas 104 to sweep the droplets away to form the aerosol 108. The droplets comprise liquid from the liquid feed 102. The droplets may, however, also include nonliquid material, such as one or more small particles held in the droplet by the liquid. For example, when the particles 112 are composite, or multi-phase, particles, one phase of the composite may be provided in the liquid feed 102 in the form of suspended precursor particles and a second phase of the composite may be produced in the furnace 110 from one or more precursors in the liquid phase of the liquid feed 102. Furthermore the precursor particles could be included in the liquid feed 102, and therefore also in droplets of the aerosol 108, for the purpose only of dispersing the particles for subsequent compositional or structural modification during or after processing in the furnace 110.

An important aspect of the present invention is generation of the aerosol 108 with droplets of a small average size, narrow size distribution. In this manner, the particles 112 may be produced at a desired small size with a narrow size distribution, which are advantageous for many applications.

The aerosol generator 106 is capable of producing the aerosol 108 such that it includes droplets having a weight average size in a range having a lower limit of about 1 μm and preferably about 2 μm; and an upper limit of about 10 μm; preferably about 7 μm, more preferably about 5 μm and most preferably about 4 μm. A weight average droplet size in a range of from about 2 μm to about 4 μm is more preferred for most applications, with a weight average droplet size of about 3 μm being particularly preferred for some applications. The aerosol generator is also capable of producing the aerosol 108 such that it includes droplets in a narrow size distribution. Preferably, the droplets in the aerosol are such that at least about 70 percent (more preferably at least about 80 weight percent and most preferably at least about 85 weight percent) of the droplets are smaller than about 10 μm and more preferably at least about 70 weight percent (more preferably at least about 80 weight percent and most preferably at least about 85 weight percent) are smaller than about 5 μm. Furthermore, preferably no greater than about 30 weight percent, more preferably no greater than about 25 weight percent and most preferably no greater than about 20 weight percent, of the droplets in the aerosol 108 are larger than about twice the weight average droplet size.

Another important aspect of the present invention is that the aerosol 108 may be generated without consuming excessive amounts of the carrier gas 104. The aerosol generator 106 is capable of producing the aerosol 108 such that it has a high loading, or high concentration, of the liquid feed 102 in droplet form. In that regard, the aerosol 108 preferably includes greater than about $1\times10^6$ droplets per cubic centimeter of the aerosol 108, more preferably greater than about $5\times10^6$ droplets per cubic centimeter, still more preferably greater than about $1\times10^7$ droplets per cubic centimeter, and most p preferably greater than about $5\times10^7$ droplets per cubic centimeter. That the aerosol generator 106 can produce such a heavily loaded aerosol 108 is particularly surprising considering the high quality of the aerosol 108 with respect to small average droplet size and narrow droplet size distribution. Typically, droplet loading in the aerosol is such that the volumetric ratio of liquid feed 102 to carrier gas 104 in the aerosol 108 is larger than about 0.04 milliliters of liquid feed 102 per liter of carrier gas 104 in the aerosol 108, preferably larger than about 0.083 milliliters of liquid feed 102 per liter of carrier gas 104 in the aerosol 108, more preferably larger than about 0.167 milliliters of liquid feed 102 per liter of carrier gas 104, still more preferably larger than about 0.25 milliliters of liquid feed 102 per liter of carrier gas 104, and most preferably larger than about 0.333 milliliters of liquid feed 102 per liter of carrier gas 104.

This capability of the aerosol generator 106 to produce a heavily loaded aerosol 108 is even more surprising given the high droplet output rate of which the aerosol generator 106 is capable, as discussed more fully below. It will be appreciated that the concentration of liquid feed 102 in the aerosol 108 will depend upon the specific components and attributes of the liquid feed 102 and, particularly, the size of the droplets in the aerosol 108. For example, when the average droplet size is from about 2 μm to about 4 μm, the droplet loading is preferably larger than about 0.15 milliliters of aerosol feed 102 per liter of carrier gas 104, more preferably larger than about 0.2 milliliters of liquid feed 102 per liter of carrier gas 104, even more preferably larger than about 0.2 milliliters of liquid feed 102 per liter of carrier gas 104, and most preferably larger than about 0.3 milliliters of liquid feed 102 per liter of carrier gas 104. When reference is made herein to liters of carrier gas 104, it refers to the volume that the carrier gas 104 would occupy under conditions of standard temperature and pressure.

The furnace 110 may be any suitable device for heating the aerosol 108 to evaporate liquid from the droplets of the aerosol 108 and thereby permit formation of the particles 112. The maximum average stream temperature, or reaction temperature, refers to the maximum average temperature that an aerosol stream attains while flowing through the furnace. This is typically determined by a temperature probe inserted into the furnace. Preferred reaction temperature according to the present invention are discussed more fully below. According to one embodiment, the reaction temperature is from about 500° C. to about 1400 ° C.

Although longer residence times are possible, for many applications, residence time in the heating zone of the furnace 110 of shorter than about 4 seconds is typical, with shorter than about 2 seconds being preferred, shorter than about 1 second being more preferred, shorter than about 0.5 second being even more preferred, and shorter than about 0.2 second being most preferred. The residence time should be long enough, however, to assure that the particles 112 attain the desired maximum stream temperature for a given heat transfer rate. In that regard, with extremely short residence times, higher furnace temperatures could be used to increase the rate of heat transfer so long as the particles 112 attain a maximum temperature within the desired stream temperature range. That mode of operation, however, is not preferred. Also, it is preferred that, in most cases, the maximum stream temperature not be attained in the furnace 110 until substantially at the end of the heating zone in the furnace 110. For example, the heating zone will often include a plurality of heating sections that are each independently controllable. The maximum stream temperature should typically not be attained until the final heating section, and more preferably until substantially at the end of the last heating section. This is important to reduce the potential for thermophoretic losses of material. Also, it is noted that as used herein, residence time refers to the actual time for a material to pass through the relevant process equipment. In the case of the furnace, this includes the effect of increasing velocity with gas expansion due to heating.

Typically, the furnace 110 will be a tube-shaped furnace, so that the aerosol 108 moving into and through the furnace does not encounter sharp edges on which droplets could collect. Loss of droplets to collection at sharp surfaces results in a lower yield of particles 112. More important, however, the accumulation of liquid at sharp edges can result in re-release of undesirably large droplets back into the aerosol 108, which can cause contamination of the particulate product 116 with undesirably large particles. Also, over time, such liquid collection at sharp surfaces can cause fouling of process equipment, impairing process performance.

The furnace 110 may include a heating tube made of any suitable material. The tube material may be a ceramic material, for example, mullite, silica or alumina. Alternatively, the tube may be metallic. Advantages of using a metallic tube are low cost, ability to withstand steep temperature gradients and large thermal shocks, machinability and weldability, and ease of providing a seal between the tube and other process equipment. Disadvantages of using a metallic tube include limited operating temperature and increased reactivity in some reaction systems.

When a metallic tube is used in the furnace 110, it is preferably a high nickel content stainless steel alloy, such as a 330 stainless steel, or a nickel-based super alloy. As noted, one of the major advantages of using a metallic tube is that the tube is relatively easy to seal with other process equipment. In that regard, flange fittings may be welded directly to the tube for connecting with other process equipment. Metallic tubes are generally preferred for making particles that do not require a maximum tube wall temperature of higher than about 1100° C. during particle manufacture.

When higher temperatures are required, ceramic tubes are typically used. One major problem with ceramic tubes, however, is that the tubes can be difficult to seal with other process equipment, especially when the ends of the tubes are maintained at relatively high temperatures, as is often the case with the present invention.

One configuration for sealing a ceramic tube is shown in FIGS. 2, 3 and 4. The furnace 110 includes a ceramic tube 374 having an end cap 376 fitted to each end of the tube 374, with a gasket 378 disposed between corresponding ends of the ceramic tube 374 and the end caps 376. The gasket may be of any suitable material for sealing at the temperature encountered at the ends of the tubes 374. Examples of gasket materials for sealing at temperatures below about 250° C. include silicone, TEFLON™ and VITON™. Examples of gasket materials for higher temperatures include graphite, ceramic paper, thin sheet metal, and combinations thereof.

Tension rods 380 extend over the length of the furnace 110 and through rod holes 382 through the end caps 376. The tension rods 380 are held in tension by the force of springs 384 bearing against bearing plates 386 and the end caps 376. The tube 374 is, therefore, in compression due to the force of the springs 384. The springs 384 may be compressed any desired amount to form a seal between the end caps 376 and the ceramic tube 374 through the gasket 378. As will be appreciated, by using the springs 384, the tube 374 is free to move to some degree as it expands upon heating and contracts upon cooling. To form the seal between the end caps 376 and the ceramic tube 374, one of the gaskets 378 is seated in a gasket seat 388,on the side of each end cap 376 facing the tube 374. A mating face 390 on the side of each of the end caps 376 faces away from the tube 374, for mating with a flange surface for connection with an adjacent piece of equipment.

Also, although the present invention is described with primary reference to a furnace reactor, which is preferred, it should be recognized that, except as noted, any other thermal reactor, including a flame reactor or a plasma reactor, could be used instead. A furnace reactor is, however, preferred, because of the generally even heating characteristic of a furnace for attaining a uniform stream temperature.

The particle collector 114, may be any suitable apparatus for collecting particles 112 to produce the particulate product 116. One preferred embodiment of the particle collector 114 uses one or more filter to separate the particles 112 from gas. Such a filter may be of any type, including a bag filter. Another preferred embodiment of the particle collector uses one or more cyclone to separate the particles 112. Other apparatus that may be used in the particle collector 114 includes an electrostatic precipitator. Also, collection should normally occur at a temperature above the condensation temperature of the gas stream in which the particles 112 are suspended. Also, collection should normally be at a temperature that is low enough to prevent significant agglomeration of the particles 112.

Figure 5:
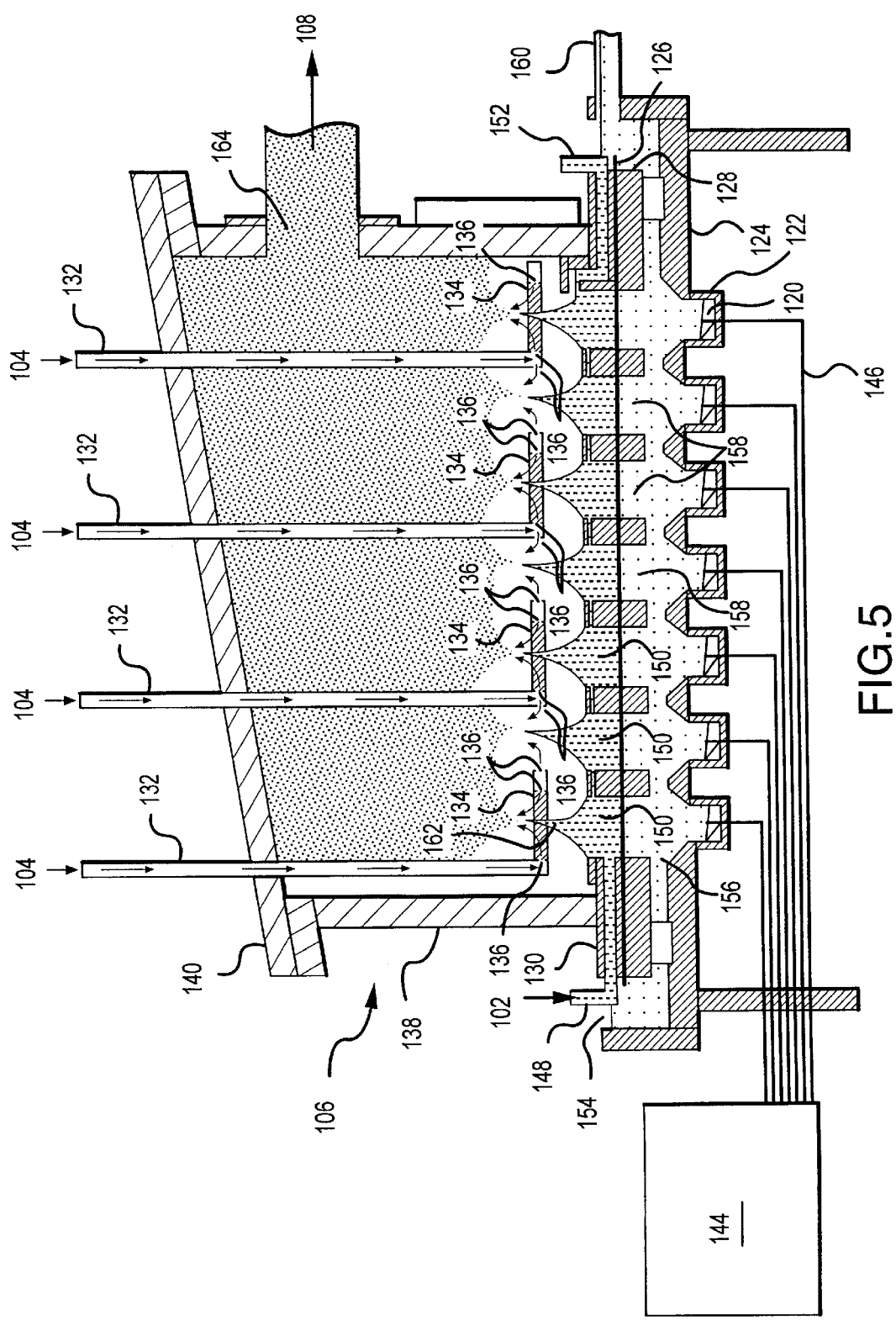
FIG. 5 is a side view in cross section of one embodiment of aerosol generator of the present invention.
Figure 6:
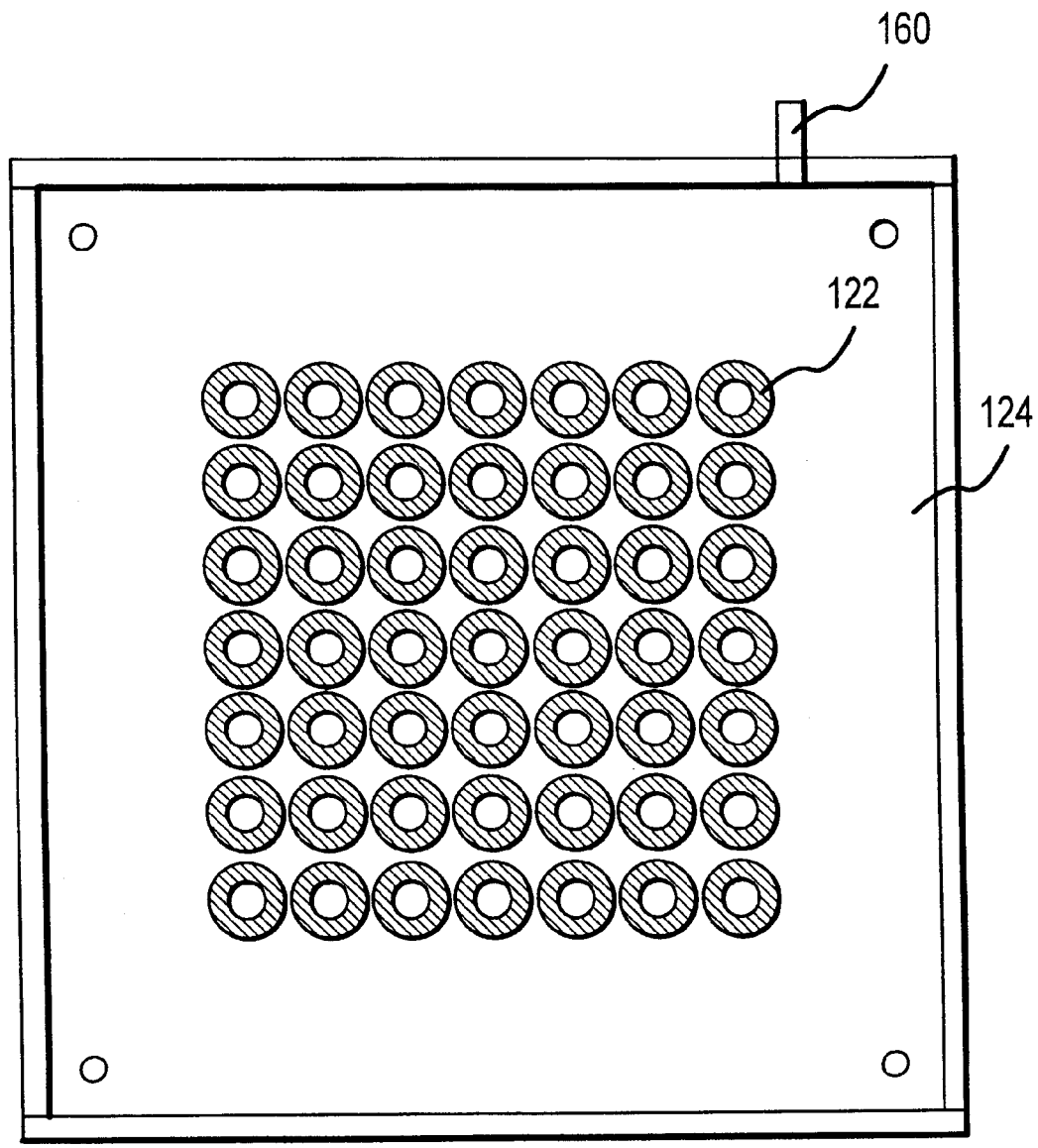
FIG. 6 is a top view of a transducer mounting plate showing a 49 transducer array for use in an aerosol generator of the present invention.

Of significant importance to the operation of the process of the present invention is the aerosol generator 106, which must be capable of producing a high quality aerosol with high droplet loading, as previously noted. With reference to FIG. 5, one embodiment of an aerosol generator 106 of the present invention is described. The aerosol generator 106 includes a plurality of ultrasonic transducer discs 120 that are each mounted in a transducer housing 122. The transducer housings 122 are mounted to a transducer mounting plate 124, creating an array of the ultrasonic transducer discs 120. Any convenient spacing may be used for the ultrasonic transducer discs 120. Center-to-center spacing of the ultrasonic transducer discs 120 of about 4 centimeters is often adequate. The aerosol generator 106, as shown in FIG. 5, includes forty-nine transducers in a 7×7 array. The array configuration is as shown in FIG. 6, which depicts the locations of the transducer housings 122 mounted to the transducer mounting plate 124.

With continued reference to FIG. 5, a separator 126, in spaced relation to the transducer discs 120, is retained between a bottom retaining plate 128 and a top retaining plate 130. Gas delivery tubes 132 are connected to gas distribution manifolds 134, which have gas delivery ports 136. The gas distribution manifolds 134 are housed within a generator body 138 that is covered by generator lid 140. A transducer driver 144, having circuitry for driving the transducer discs 120, is electronically connected with the transducer discs 120 via electrical cables 146.

During operation of the aerosol generator 106, as shown in FIG. 5, the transducer discs 120 are activated by the'transducer driver 144 via the electrical cables 146. The transducers preferably vibrate at a frequency of from about 1 MHz to about 5 MHz, more preferably from about 1.5 MHz to about 3 MHz. Frequently used frequencies are at about 1.6 MHz and about 2.4 MHz. Furthermore, all of the transducer discs 110 should be operating at substantially the same frequency when an aerosol with a narrow droplet size distribution is desired. This is important because commercially available transducers can vary significantly in thickness, sometimes by as much as 10%. It is preferred, however, that the transducer discs 120 operate at frequencies within a range of 5% above and below the median transducer frequency, more preferably within a range of 2.5%, and most preferably within a range of 1%. This can be accomplished by careful selection of the transducer discs 120 so that they all preferably have thicknesses within 5% of the median transducer thickness, more preferably within 2.5%, and most preferably within 1%.

Liquid feed 102 enters through a feed inlet 148 and flows through flow channels 150 to exit through feed outlet 152. An ultrasonically transmissive fluid, typically water, enters through a water inlet 154 to fill a water bath volume 156 and flow through flow channels 158 to exit through a water outlet 160. A proper flow rate of the ultrasonically transmissive fluid is necessary to cool the transducer discs 120 and to prevent overheating of the ultrasonically transmissive fluid. Ultrasonic signals from the transducer discs 120 are transmitted, via the ultrasonically transmissive fluid, across the water bath volume 156, and ultimately across the separator 126, to the liquid feed 102 in flow channels 150.

The ultrasonic signals from the ultrasonic transducer discs 120 cause atomization cones 162 to develop in the liquid feed 102 at locations corresponding with the transducer discs 120. Carrier gas 104 is introduced into the gas delivery tubes 132 and delivered to the vicinity of the atomization cones 162 via gas delivery ports 136. Jets of carrier gas exit the gas delivery ports 136 in a direction so as to impinge on the atomization cones 162, thereby sweeping away atomized droplets of the liquid feed 102 that are being generated from the atomization cones 162 and creating the aerosol 108, which exits the aerosol generator 106 through an aerosol exit opening 164.

Efficient use of the carrier gas 104 is an important aspect of the aerosol generator 106. The embodiment of the aerosol generator 106 shown in FIG. 5 includes two gas exit ports per atomization cone 162, with the gas ports being positioned above the liquid medium 102 over troughs that develop between the atomization cones 162, such that the exiting carrier gas 104 is horizontally directed at the surface of the atomization cones 162, thereby efficiently distributing the carrier gas 104 to critical portions of the liquid feed 102 for effective and efficient sweeping away of droplets as they form about the ultrasonically energized atomization cones 162. Furthermore, it is preferred that at least a portion of the opening of each of the gas delivery ports 136, through which the carrier gas exits the gas delivery tubes, should be located below the top of the atomization cones 162 at which the carrier gas 104 is directed. This relative placement of the gas delivery ports 136 is very important to efficient use of carrier gas 104. Orientation of the gas delivery ports 136 is also important. Preferably, the gas delivery ports 136 are positioned to horizontally direct jets of the carrier gas 104 at the atomization cones 162. The aerosol generator 106 permits generation of the aerosol 108 with heavy loading with droplets of the carrier liquid 102, unlike aerosol generator designs that do not efficiently focus gas delivery to the locations of droplet formation.

Another important feature of the aerosol generator 106, as shown in FIG. 5, is the use of the separator 126, which protects the transducer discs 120 from direct contact with the liquid feed 102, which is often highly corrosive. The height of the separator 126 above the top of the transducer discs 120 should normally be kept as small as possible, and is often in the range of from about 1 centimeter to about 2 centimeters. The top of the liquid feed 102 in the flow channels above the tops of the ultrasonic transducer discs 120 is typically in a range of from about 2 centimeters to about 5 centimeters, whether or not the aerosol generator includes the separator 126, with a distance of about 3 to 4 centimeters being preferred. Although the aerosol generator 106 could be made without the separator 126, in which case the liquid feed 102 would be in direct contact with the transducer discs 120, the highly corrosive nature of the liquid feed 102 can often cause premature failure of the transducer discs 120. The use of the separator 126, in combination with use of the ultrasonically transmissive fluid in the water bath volume 156 to provide ultrasonic coupling, significantly extending the life of the ultrasonic transducers 120. One disadvantage of using the separator 126, however, is that the rate of droplet production from the atomization cones 162 is reduced, often by a factor of two or more, relative to designs in which the liquid feed 102 is in direct contact with the ultrasonic transducer discs 102. Even with the separator 126, however, the aerosol generator 106 used with the present invention is capable of producing a high quality aerosol with heavy droplet loading, as previously discussed. Suitable materials for the separator 126 include, for example, polyamides (such as Kapton™ membranes from DuPont) and other polymer materials, glass, and plexiglass. The main requirements for the separator 126 are that it be ultrasonically transmissive, corrosion resistant and impermeable.

One alternative to using the separator 126 is to bind a corrosion-resistant protective coating onto the surface of the ultrasonic transducer discs 120, thereby preventing the liquid feed 102 from contacting the surface of the ultrasonic transducer discs 120. When the ultrasonic transducer discs 120 have a protective coating, the aerosol generator 106 will typically be constructed without the water bath volume 156 and the liquid feed 102 will flow directly over the ultrasonic transducer discs 120. Examples of such protective coating materials include platinum, gold, TEFLON™, epoxies and various plastics. Such coating typically significantly extends transducer life. Also, when operating without the separator 126, the aerosol generator 106 will typically produce the aerosol 108 with a much higher droplet loading than when the separator 126 is used.

One surprising finding with operation of the aerosol generator 106 of the present invention is that the droplet loading in the aerosol may be affected by the temperature of the liquid feed 102. It has been found that when the liquid feed 102 includes an aqueous liquid at an elevated temperature, the droplet loading increases significantly. The temperature of the liquid feed 102 is preferably higher than about 30° C., more preferably higher than about 35° C. and most preferably higher than about 40° C. If the temperature becomes too high, however, it can have a detrimental effect on droplet loading in the aerosol 108. Therefore, the temperature of the liquid feed 102 from which the aerosol 108 is made should generally be lower than about 50° C., and preferably lower than about 45° C. The liquid feed 102 may be maintained at the desired temperature in any suitable fashion. For example, the portion of the aerosol generator 106 where the liquid feed 102 is converted to the aerosol 108 could be maintained at a constant elevated temperature. Alternatively, the liquid feed 102 could be delivered to the aerosol generator 106 from a constant temperature bath maintained separate from the aerosol generator 106. When the ultrasonic generator 106 includes the separator 126, the ultrasonically transmissive fluid adjacent the ultrasonic transducer disks 120 are preferably also at an elevated temperature in the ranges just discussed for the liquid feed 102.

The design for the aerosol generator 106 based on an array of ultrasonic transducers is versatile and is easily modified to accommodate different generator sizes for different specialty applications. The aerosol generator 106 may be designed to include a plurality of ultrasonic transducers in any convenient number. Even for smaller scale production, however, the aerosol generator 106 preferably has at least nine ultrasonic transducers, more preferably at least 16 ultrasonic transducers, and even more preferably at least 25 ultrasonic transducers. For larger scale production, however, the aerosol generator 106 includes at least 40 ultrasonic transducers, more preferably at least 100 ultrasonic transducers, and even more preferably at least 400 ultrasonic transducers. In some large volume applications, the aerosol generator may have at least 1000 ultrasonic transducers.

Figure 7:
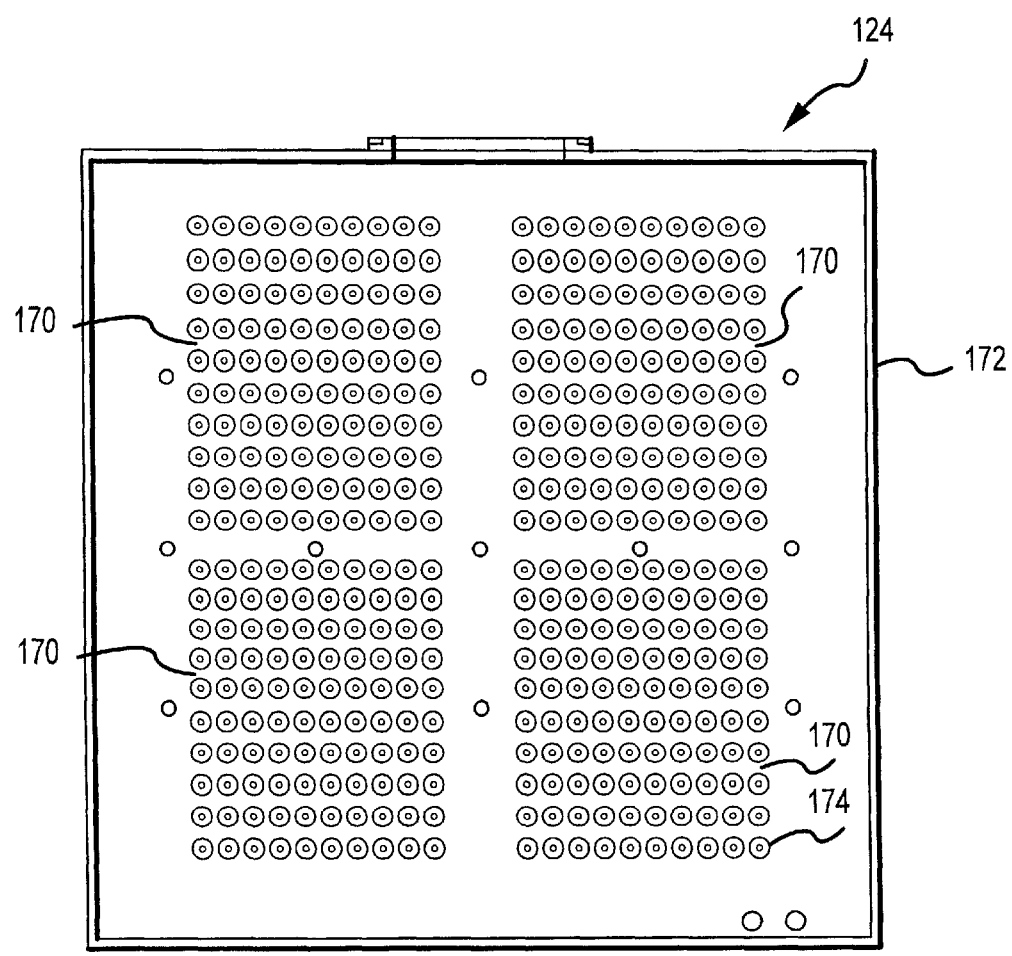
FIG. 7 is a top view of a transducer mounting plate for a 400 transducer array for use in an ultrasonic generator of the present invention.
Figure 8:
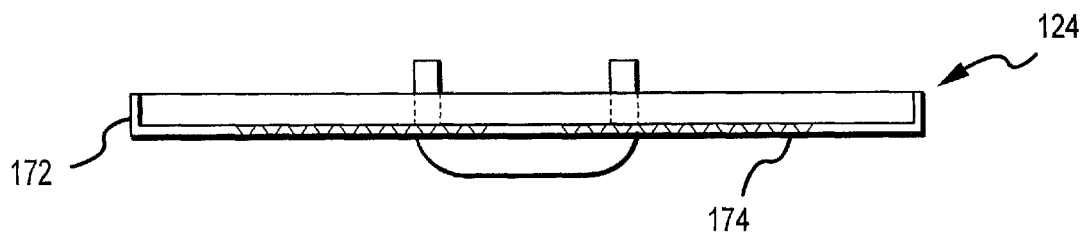
FIG. 8 is a side view of the transducer mounting plate shown in FIG. 7.

FIGS. 7–24 show component designs for an aerosol generator 106 including an array of 400 ultrasonic transducers. Referring first to FIGS. 7 and 8, the transducer mounting plate 124 is shown with a design to accommodate an array of 400 ultrasonic transducers, arranged in four subarrays of 100 ultrasonic transducers each. The transducer mounting plate 124 has integral vertical walls 172 for containing the ultrasonically transmissive fluid, typically water, in a water bath similar to the water bath volume 156 described previously with reference to FIG. 5.

Figure 9:
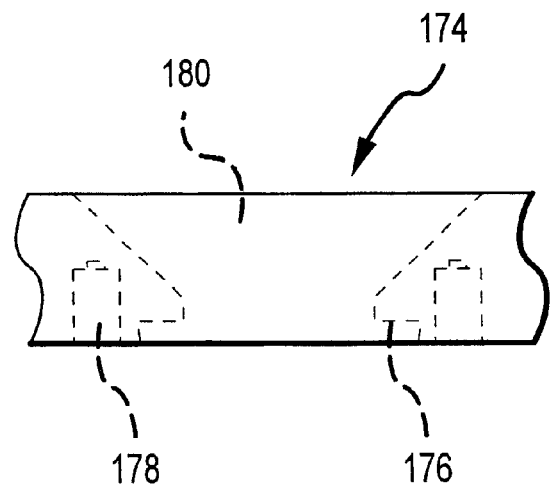
FIG. 9 is a partial side view showing the profile of a single transducer mounting receptacle of the transducer mounting plate shown in FIG. 7.

As shown in FIGS. 7 and 8, four hundred transducer mounting receptacles 174 are provided in the transducer mounting plate 124 for mounting ultrasonic transducers for the desired array. With reference to FIG. 9, the profile of an individual transducer mounting receptacle 174 is shown. A mounting seat 176 accepts an ultrasonic transducer for mounting, with a mounted ultrasonic transducer being held in place via screw holes 178. Opposite the mounting receptacle 176 is a flared opening 180 through which an ultrasonic signal may be transmitted for the purpose of generating the aerosol 108, as previously described with reference to FIG. 5.

Figure 10:
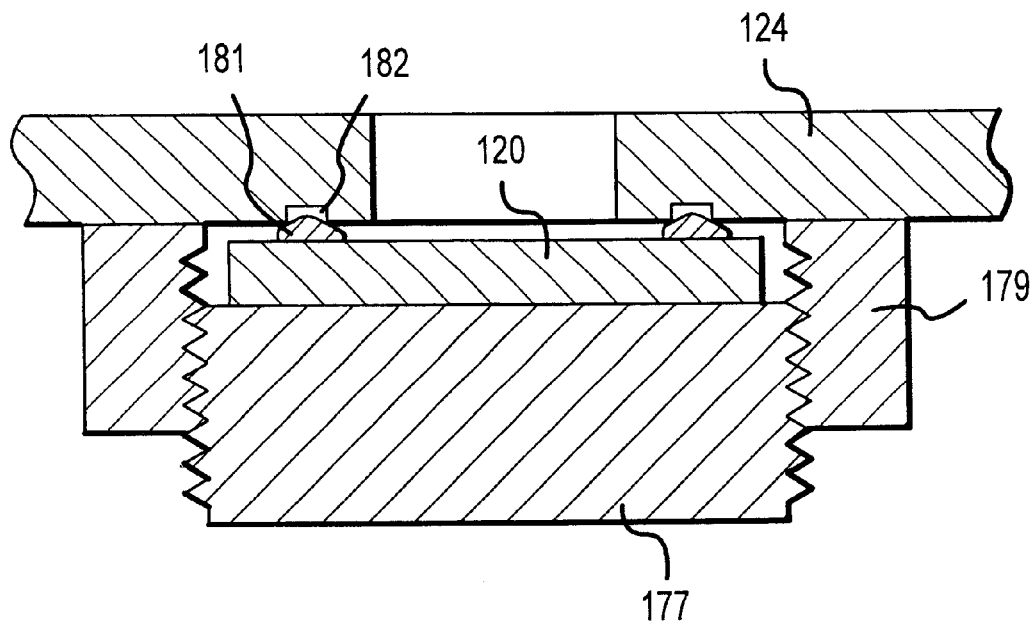
FIG. 10 is a partial side view in cross-section showing an alternative embodiment for mounting an ultrasonic transducer.

A preferred transducer mounting configuration, however, is shown in FIG. 10 for another configuration for the transducer mounting plate 124. As seen in FIG. 10, an ultrasonic transducer disc 120 is mounted to the transducer mounting plate 124 by use of a compression screw 177 threaded into a threaded receptacle 179. The compression screw 177 bears against the ultrasonic transducer disc 120, causing an o-ring 181, situated in an o-ring seat 182 on the transducer mounting plate, to be compressed to form a seal between the transducer mounting plate 124 and the ultrasonic transducer disc 120. This type of transducer mounting is particularly preferred when the ultrasonic transducer disc 120 includes a protective surface coating, as discussed previously, because the seal of the Wring to the ultrasonic transducer disc 120 will be inside of the outer edge of the protective seal, thereby preventing liquid from penetrating under the protective surface coating from the edges of the ultrasonic transducer disc 120.

Figure 11:
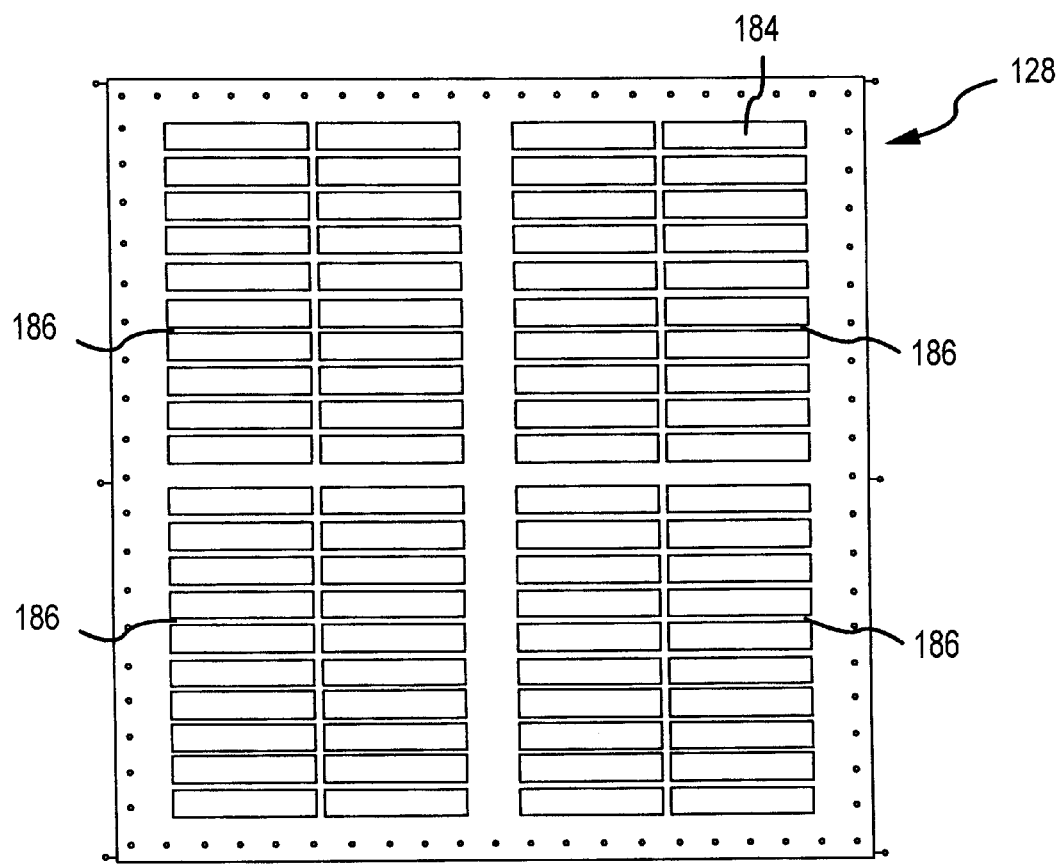
FIG. 11 is a top view of a bottom retaining plate for retaining a separator for use in an aerosol generator of the present invention.

Referring now to FIG. 11, the bottom retaining plate 128 for a 400 transducer array is shown having a design for mating with the transducer mounting plate 124 (shown in FIGS. 7–8). The bottom retaining plate 128 has eighty openings 184, arranged in four subgroups 186 of twenty openings 184 each. Each of the openings 184 corresponds with five of the transducer mounting receptacles 174 (shown in FIGS. 7 and 8) when the bottom retaining plate 128 is mated with the transducer mounting plate 124 to create a volume for a water bath between the transducer mounting plate 124 and the bottom retaining plate 128. The openings 184, therefore, provide a pathway for ultrasonic signals generated by ultrasonic transducers to be transmitted through the bottom retaining plate.

Figure 12:
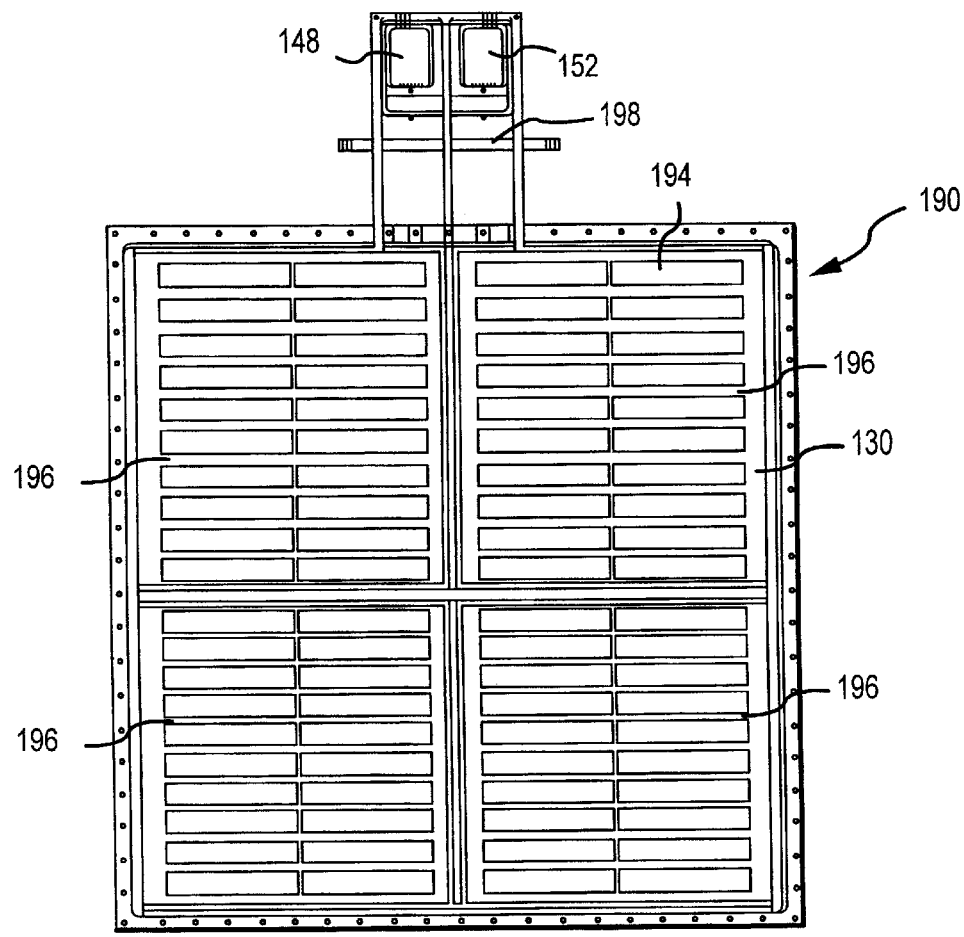
FIG. 12 is a top view of a liquid feed box having a bottom retaining plate to assist in retaining a separator for use in an aerosol generator of the present invention.
Figure 13:
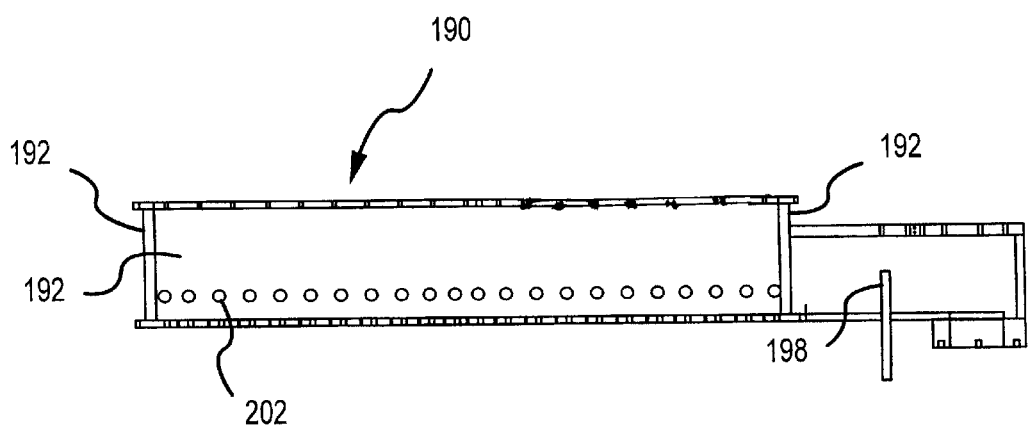
FIG. 13 is a side view of the liquid feed box shown in FIG. 8.

Referring now to FIGS. 12 and 13, a liquid feed box 190 for a 400 transducer array is shown having the top retaining plate 130 designed to fit over the bottom retaining plate 128 (shown in FIG. 11), with a separator 126 (not shown) being retained between the bottom retaining plate 128 and the top retaining plate 130 when the aerosol generator 106 is assembled. The liquid feed box 190 also includes vertically extending walls 192 for containing the liquid feed 102 when the aerosol generator is in operation. Also shown in FIGS. 12 and 13 is the feed inlet 148 and the feed outlet 152. An adjustable weir 198 determines the level of liquid feed 102 in the liquid feed box 190 during operation of the aerosol generator 106.

The top retaining plate 130 of the liquid feed box 190 has eighty openings 194 therethrough, which are arranged in four subgroups 196 of twenty openings 194 each. The openings 194 of the top retaining plate 130 correspond in size with the openings 184 of the bottom retaining plate 128 (shown in FIG. 11). When the aerosol generator 106 is assembled, the openings 194 through the top retaining plate 130 and the openings 184 through the bottom retaining plate 128 are aligned, with the separator 126 positioned therebetween, to permit transmission of ultrasonic signals when the aerosol generator 106 is in operation.

Figure 14:
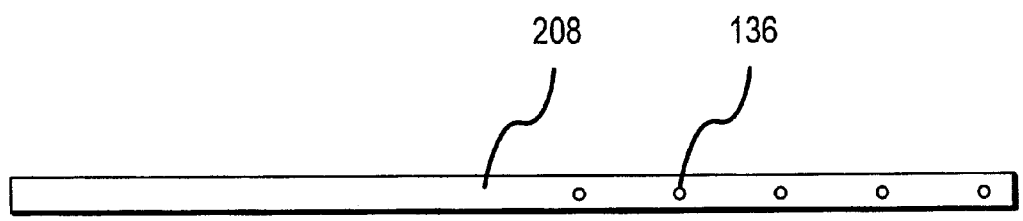
FIG. 14 is a side view of a gas tube for delivering gas within an aerosol generator of the present invention.

Referring now to FIGS. 12–14, a plurality of gas tube feed-through holes 202 extend through the vertically extending walls 192 to either side of the assembly including the feed inlet 148 and feed outlet 152 of the liquid feed box 190. The gas tube feed-through holes 202 are designed to permit insertion therethrough of gas tubes 208 of a design as shown in FIG. 14. When the aerosol generator 106 is assembled, a gas tube 208 is inserted through each of the gas tube feed-through holes 202 so that gas delivery ports 136 in the gas tube 208 will be properly positioned and aligned adjacent the openings 194 in the top retaining plate 130 for delivery of gas to atomization cones that develop in the liquid feed box 190 during operation of the aerosol generator 106. The gas delivery ports 136 are typically holes having a diameter of from about 1.5 millimeters to about 3.5 millimeters.

Figure 15:
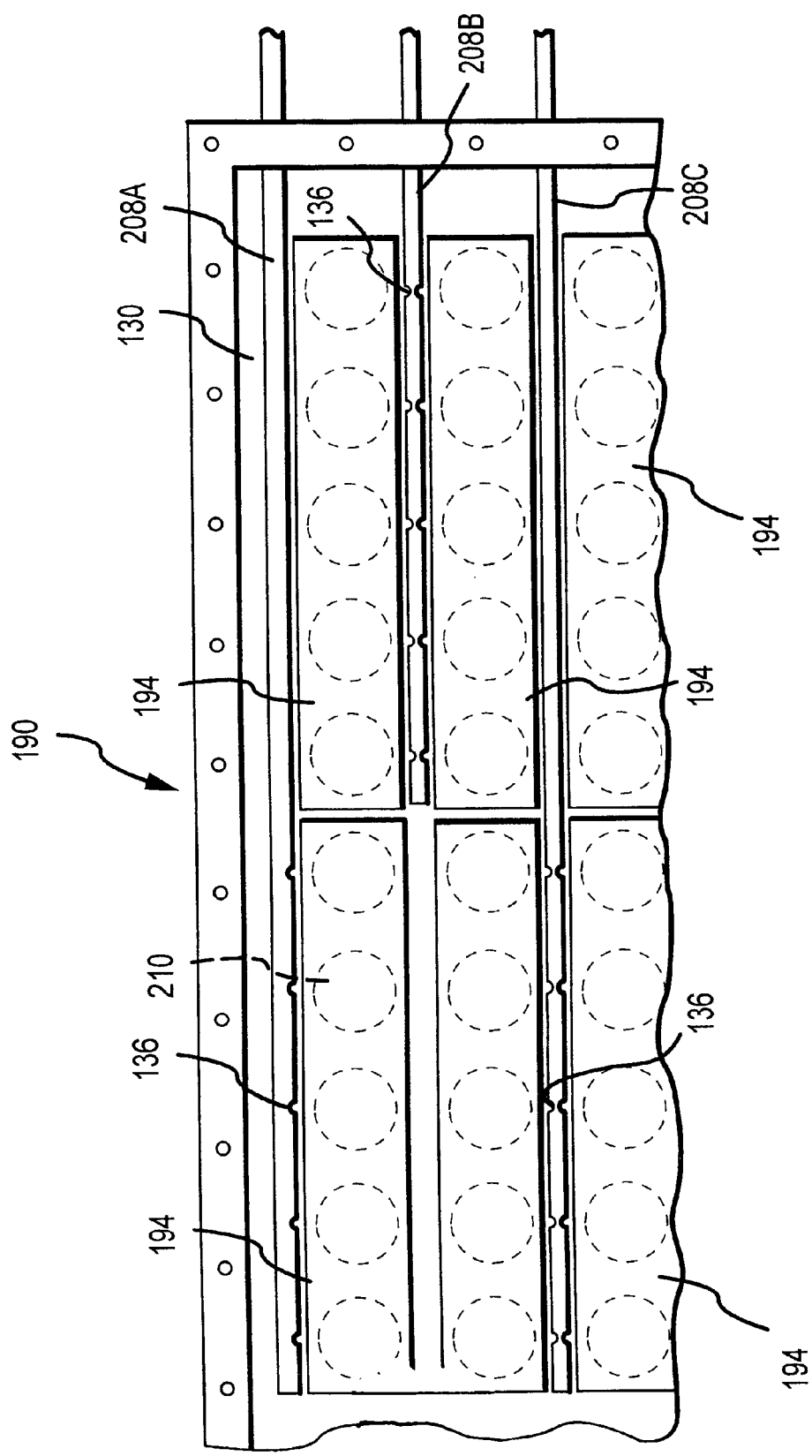
FIG. 15 shows a partial top view of gas tubes positioned in a liquid feed box for distributing gas relative to ultrasonic transducer positions for use in an aerosol generator of the present invention.

Referring now to FIG. 15, a partial view of the liquid feed box 190 is shown with gas tubes 208A, 208B and 208C positioned adjacent to the openings 194 through the top retaining plate 130. Also shown in FIG. 15 are the relative locations that ultrasonic transducer discs 120 would occupy when the aerosol generator 106 is assembled. As seen in FIG. 15, the gas tube 208A, which is at the edge of the array, has five gas delivery ports 136. Each of the gas delivery ports 136 is positioned to divert carrier gas 104 to a different one of atomization cones that develop over the array of ultrasonic transducer discs 120 when the aerosol generator 106 is operating. The gas tube 208B, which is one row in from the edge of the array, is a shorter tube that has ten gas delivery ports 136, five each on opposing sides of the gas tube 208B. The gas tube 208B, therefore, has gas delivery ports 136 for delivering gas to atomization cones corresponding with each of ten ultrasonic transducer discs 120. The lo third gas tube, 208C, is a longer tube that also has ten gas delivery ports 136 for delivering gas to atomization cones corresponding with ten ultrasonic transducer discs 120. The design shown in FIG. 15, therefore, includes one gas delivery port per ultrasonic transducer disc 1 20. Although this is a lower density of gas delivery ports 136 than for the embodiment of the aerosol generator 106 shown in FIG. 5, which includes two gas delivery ports per ultrasonic transducer disc 120, the design shown in FIG. 15 is, nevertheless, capable of producing a dense, high-quality aerosol without unnecessary waste of gas.

Figure 16:
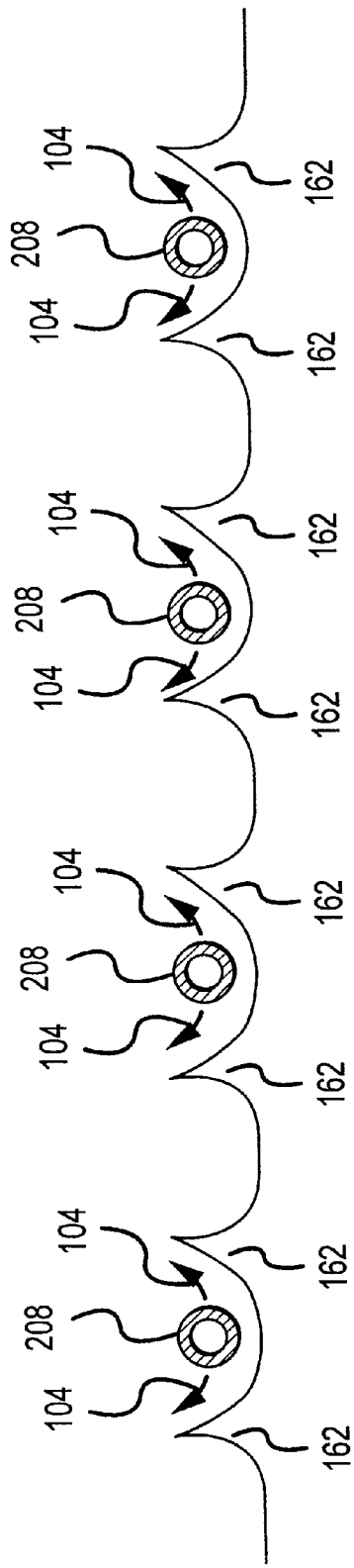
FIG. 16 shows one embodiment for a gas distribution configuration for the aerosol generator of the present invention.

Referring now to FIG. 16, the flow of carrier gas 104 relative to atomization cones 162 during operation of the aerosol generator 106 having a gas distribution configuration to deliver carrier gas 104 from gas delivery ports on both sides of the gas tubes 208, as was shown for the gas tubes 208A, 208B and 208C. in the gas distribution configuration shown in FIG. 14. The carrier gas 104 sweeps both directions from each of the gas tubes 208.

Figure 17:
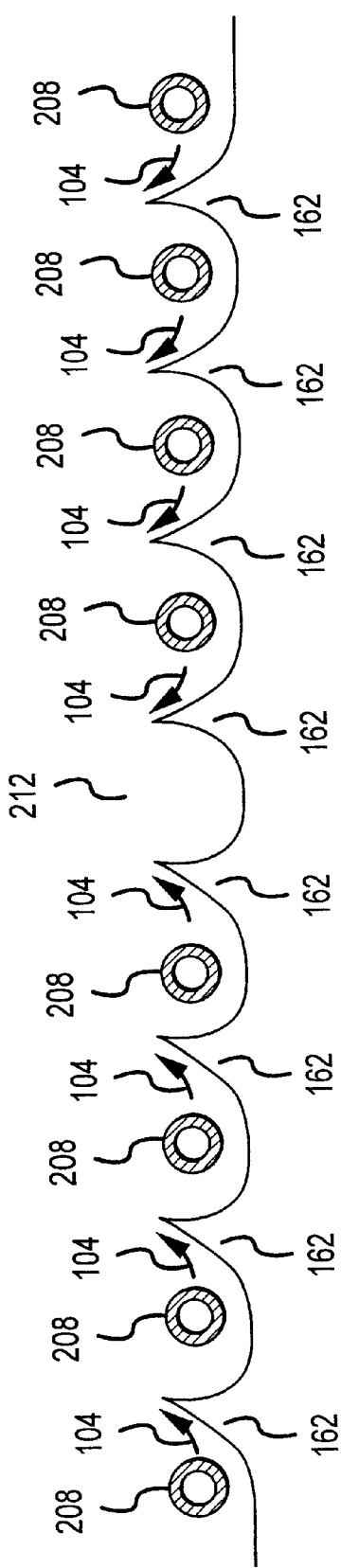
FIG. 17 shows another embodiment for a gas distribution configuration for the aerosol generator of the present invention.

An alternative, and preferred, flow for carrier gas 104 is shown in FIG. 17. As shown in FIG. 17, carrier gas 104 is delivered from only one side of each of the gas tubes 208. This results in a sweep of carrier gas from all of the gas tubes 208 toward a central area 212. This results in a more uniform flow pattern for aerosol generation that may significantly enhance the efficiency with which the carrier gas 104 is used to produce an aerosol. The aerosol that is generated, therefore, tends to be more heavily loaded with liquid droplets.

Figure 18:
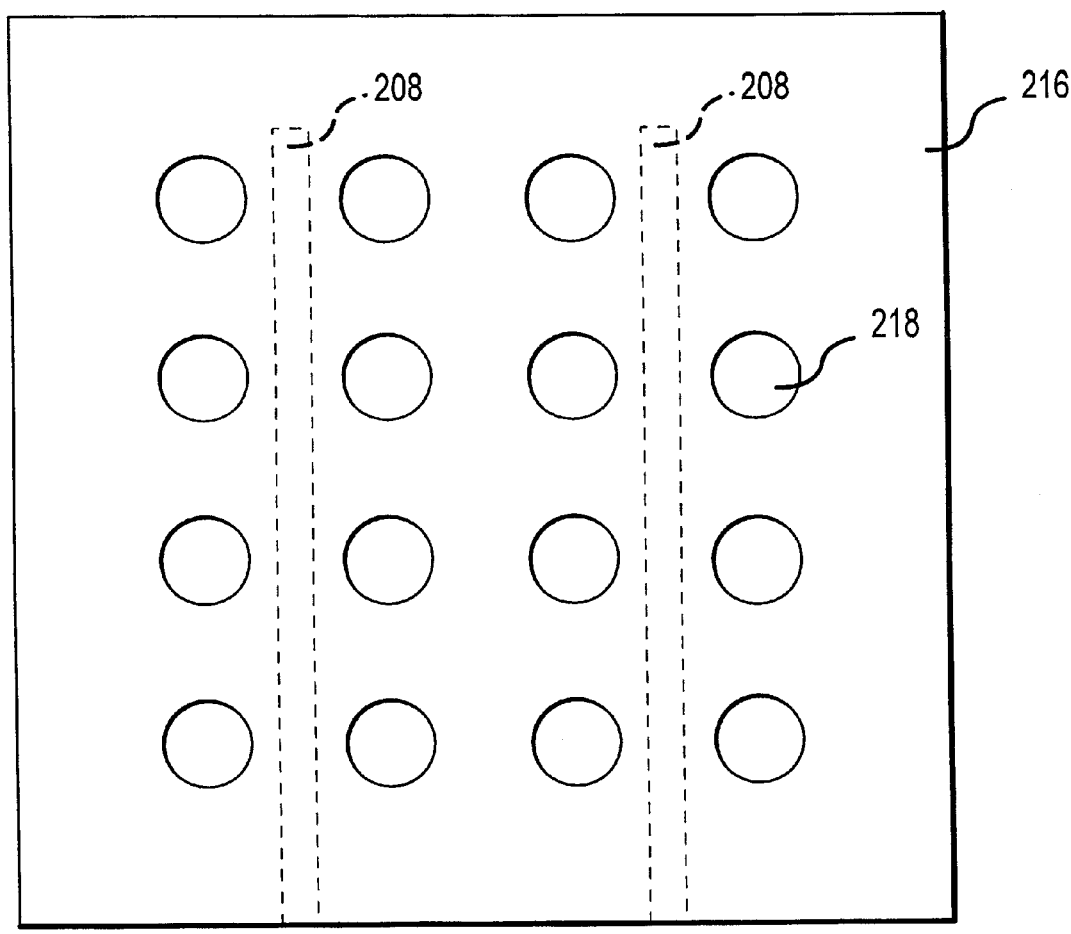
FIG. 18 is a top view of one embodiment of a gas distribution plate/gas tube assembly of the aerosol generator of the present invention.
Figure 19:
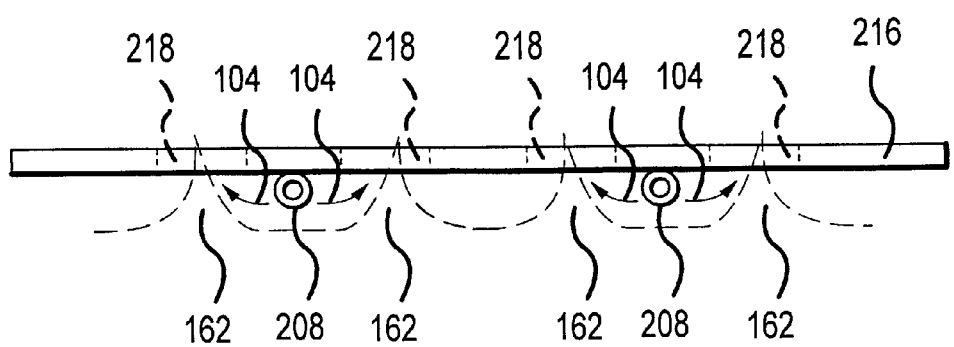
FIG. 19 is a side view of one embodiment of the gas distribution plate/gas tube assembly shown in FIG. 18.

Another configuration for distributing carrier gas in the aerosol generator 106 is shown in FIGS. 18 and 19. In this configuration, the gas tubes 208 are hung from a gas distribution plate 216 adjacent gas flow holes 218 through the gas distribution plate 216. In the aerosol generator 106, the gas distribution plate 216 would be mounted above the liquid feed, with the gas flow holes positioned to each correspond with an underlying ultrasonic transducer. Referring specifically to FIG. 19, when the ultrasonic generator 106 is in operation, atomization cones 162 develop through the gas flow holes 218, and the gas tubes 208 are located such that carrier gas 104 exiting from ports in the gas tubes 208 impinge on the atomization cones and flow upward through the gas flow holes. The gas flow holes 218, therefore, act to assist in efficiently distributing the carrier gas 104 about the atomization cones 162 for aerosol formation. It should be appreciated that the gas distribution plates 218 can be made to accommodate any number of the gas tubes 208 and gas flow holes 218. For convenience of illustration, the embodiment shown in FIGS. 18 and 19 shows a design having only two of the gas tubes 208 and only 16 of the gas flow holes 218. Also, it should be appreciated that the gas distribution plate 216 could be used alone, without the gas tubes 208. In that case, a slight positive pressure of carrier gas 104 would be maintained under the gas distribution plate 216 and the gas flow holes 218 would be sized to maintain the proper velocity of carrier gas 104 through the gas flow holes 218 for efficient aerosol generation. Because of the relative complexity of operating in that mode, however, it is not preferred.

Figure 20:
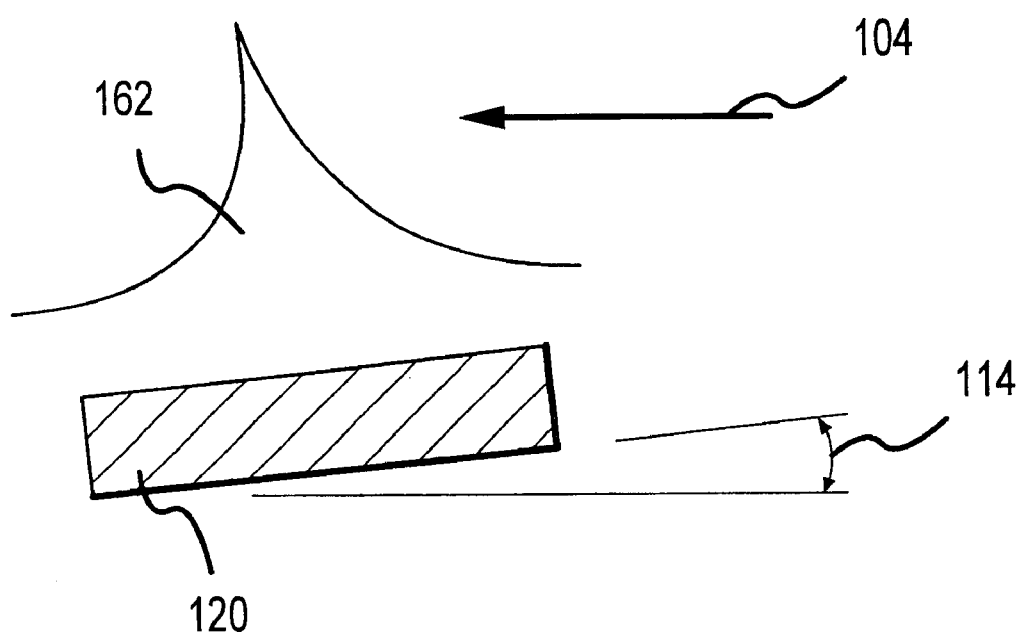
FIG. 20 shows one embodiment for orienting a transducer in the aerosol generator of the present invention.

Aerosol generation may also be enhanced through mounting of ultrasonic transducers at a slight angle and directing the carrier gas at resulting atomization cones such that the atomization cones are tilting in the same direction as the direction of flow of carrier gas. Referring to FIG. 20, an ultrasonic transducer disc 120 is shown. The ultrasonic transducer disc 120 is tilted at a tilt angle 114 (typically less than 10 degrees), so that the atomization cone 162 will also have a tilt. It is preferred that the direction of flow of the carrier gas 104 directed at the atomization cone 162 is in the same direction as the tilt of the atomization cone 162.

Figure 21:
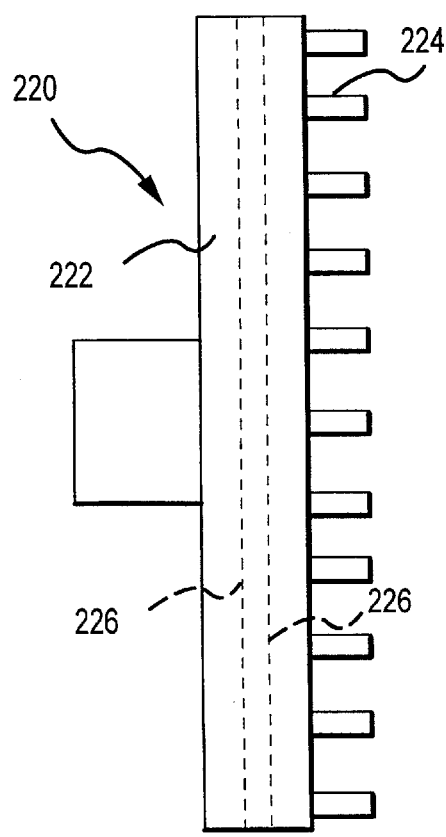
FIG. 21 is a top view of a gas manifold for distributing gas within an aerosol generator of the present invention.
Figure 22:
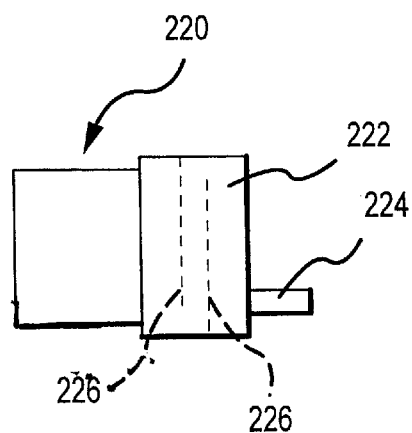
FIG. 22 is a side view of the gas manifold shown in FIG. 21.

Referring now to FIGS. 21 and 22, a gas manifold 220 is shown for distributing gas to the gas tubes 208 in a 400 transducer array design. The gas manifold 220 includes a gas distribution box 222 and piping stubs 224 for connection with gas tubes 208 (shown in FIG. 14). Inside the gas distribution box 222 are two gas distribution plates 226 that form a flow path to assist in distributing the gas equally throughout the gas distribution box 222, to promote substantially equal delivery of gas through the piping stubs 224. The gas manifold 220, as shown in FIGS. 21 and 22, is designed to feed eleven gas tubes 208. For the 400 transducer design, a total of four gas manifolds 220 are required.

Figure 23:
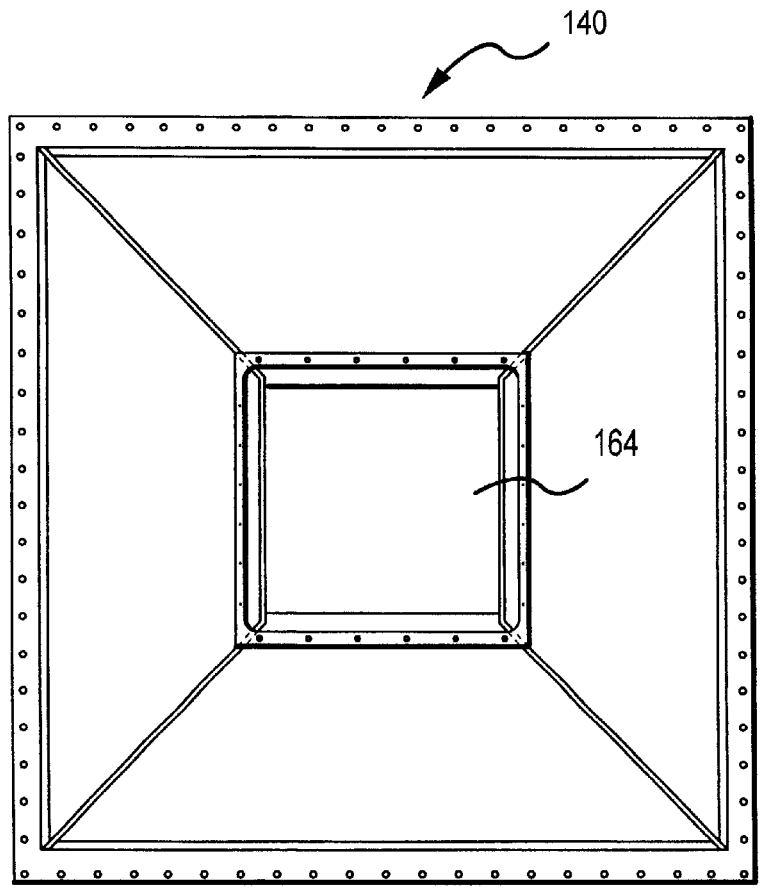
FIG. 23 is a top view of a generator lid of a hood design for use in an aerosol generator of the present invention.
Figure 24:
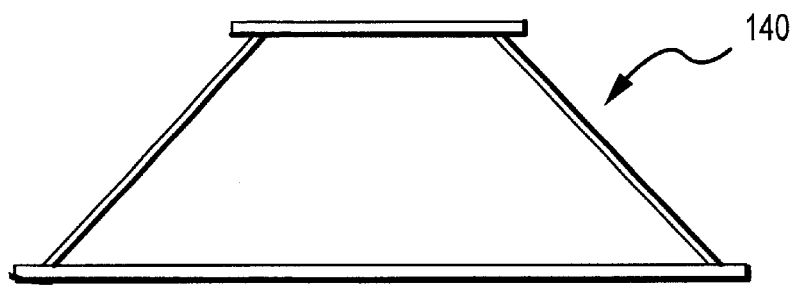
FIG. 24 is a side view of the generator lid shown in FIG. 23.

Referring now to FIGS. 23 and 24, the generator lid 140 is shown for a 400 transducer array design. The generator lid 140 mates with and covers the liquid feed box 190 (shown in FIGS. 12 and 13). The generator lid 140, as shown in FIGS. 23 and 24, has a hood design to permit easy collection of the aerosol 108 without subjecting droplets in the aerosol 108 to sharp edges on which droplets may coalesce and be lost, and possibly interfere with the proper operation of the aerosol generator 106. When the aerosol generator. 106 is in operation, the aerosol 108 would be withdrawn via the aerosol exit opening 164 through the generator cover 140.

Figure 25:
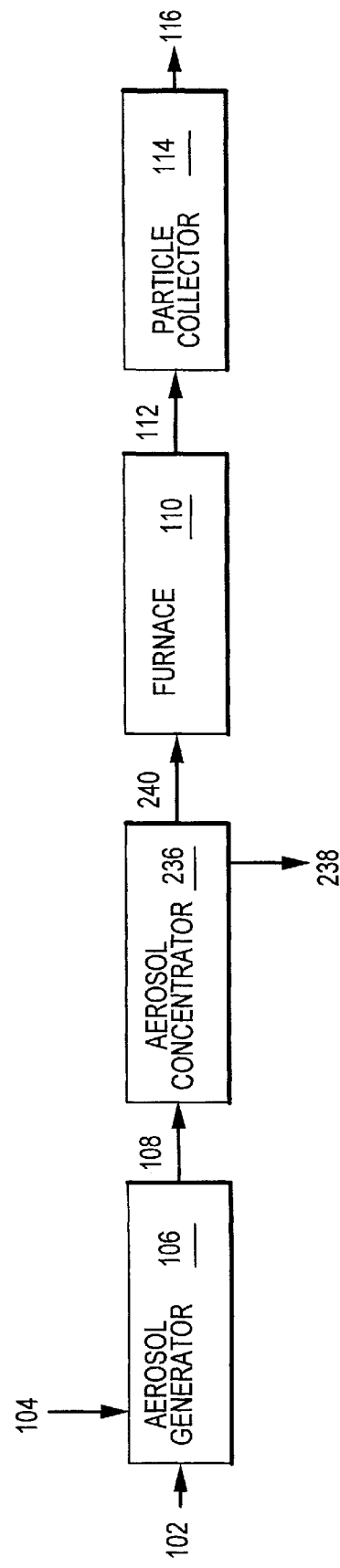
FIG. 25 is a process block diagram of one embodiment in the present invention including an aerosol concentrator.
Figure 26:
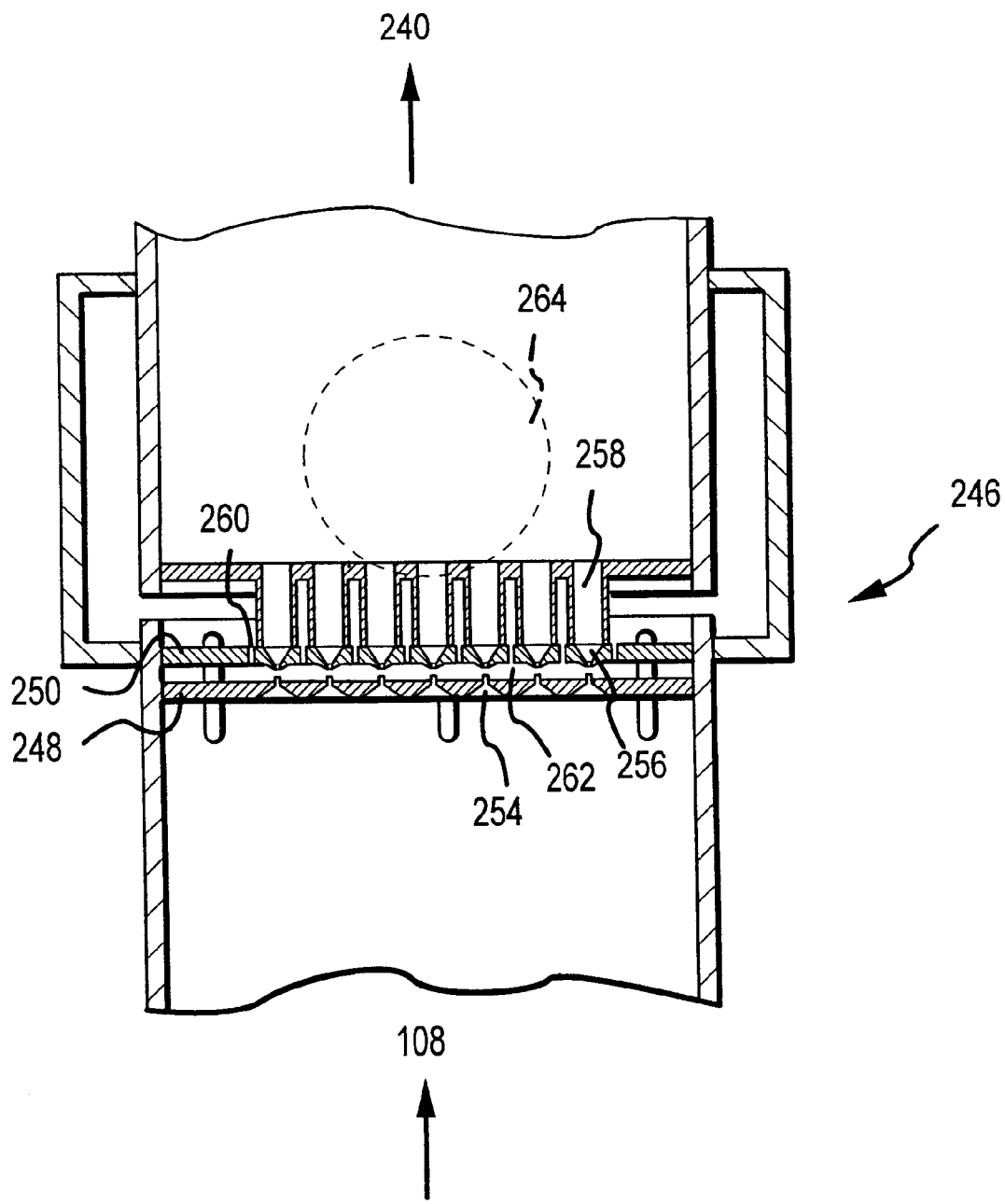
FIG. 26 is a top view in cross section of a virtual impactor that may be used for concentrating an aerosol according to the present invention.

Although the aerosol generator 106 produces a high quality aerosol 108 having a high droplet loading, it is often desirable to further concentrate the aerosol 108 prior to introduction into the furnace 110. Referring now to FIG. 25, a process flow diagram is shown for one embodiment of the present invention involving such concentration of the aerosol 108. As shown in FIG. 25, the aerosol 108 from the aerosol generator 106 is sent to an aerosol concentrator 236 where excess carrier gas 238 is withdrawn from the aerosol 108 to produce a concentrated aerosol 240, which is then fed to the furnace 110.

The aerosol concentrator 236 typically includes one or more virtual impactors capable of concentrating droplets in the aerosol 108 by a factor of greater than about 2, preferably by a factor of greater than about 5, and more preferably by a factor of greater than about 10, to produce the concentrated aerosol 240. According to the present invention, the concentrated aerosol 240 should typically contain greater than about $1 \times 10^7$ droplets per cubic centimeter, and more preferably from about $5 \times 10^7$ to about $5 \times 10^8$ droplets per cubic centimeter. A concentration of about $1 \times 10^8$ droplets per cubic centimeter of the concentrated aerosol is particularly preferred, because when the concentrated aerosol 240 is loaded more heavily than that, then the frequency of collisions between droplets becomes large enough to impair the properties of the concentrated aerosol 240, resulting in potential contamination of the particulate product 116 with an undesirably large quantity of over-sized particles. For example, if the aerosol 108 has a concentration of about $1\times10^7$ droplets per cubic centimeter, and the aerosol concentrator 236 concentrates droplets by a factor of 10, then the concentrated aerosol 240 will have a concentration of about $1\times10^8$ droplets per cubic centimeter. Stated another way, for example, when the aerosol generator generates the aerosol 108 with a droplet loading of about 0.167 milliliters liquid feed 102 per liter of carrier gas 104, the concentrated aerosol 240 would be loaded with about 1.67 milliliters of liquid feed 102 per liter of carrier gas 104, assuming the aerosol 108 is concentrated by a factor of 10.

Having a high droplet loading in aerosol feed to the furnace provides the important advantage of reducing the heating demand on the furnace 110 and the size of flow conduits required through the furnace. Also, other advantages of having a dense aerosol include a reduction in the demands on cooling and particle collection components, permitting significant equipment and operational savings. Furthermore, as system components are reduced in size, powder holdup within the system is reduced, which is also desirable. Concentration of the aerosol stream prior to entry into the furnace 110, therefore, provides a substantial advantage relative to processes that utilize less concentrated aerosol streams.

The excess carrier gas 238 that is removed in the aerosol concentrator 236 typically includes extremely small droplets that are also removed from the aerosol 108. Thus, droplets can be removed that have an aerodynamic diameter less than a preselected minimum diameter. Preferably, the droplets removed with the excess carrier gas 238 have a weight average size of smaller than about 1.5 $\mu$m, and more preferably smaller than about 1 $\mu$m and the droplets retained in the concentrated aerosol 240 have an average droplet size of larger than about 2 $\mu$m. For example, a virtual impactor sized to treat an aerosol stream having a weight average droplet size of about three $\mu$m might be designed to remove with the excess carrier gas 238 most droplets smaller than about 1.5 $\mu$m in size. Other designs are also possible. When using the aerosol generator 106 with the present invention, however, the loss of these very small droplets in the aerosol concentrator 236 will typically constitute no more than about 10 percent by weight, and more preferably no more than about 5 percent by weight, of the droplets originally in the aerosol stream that is fed to the concentrator 236. Although the aerosol concentrator 236 is useful in some situations, it is normally not required with the process of the present invention, because the aerosol generator 106 is capable. In most circumstances, of generating an aerosol stream that is sufficiently dense. So long as the aerosol stream coming out of the aerosol generator 102 is sufficiently dense, it Is preferred that the aerosol concentrator not be used. It is a significant advantage of the present invention that the aerosol generator 106 normally generates such a dense aerosol stream that the aerosol concentrator 236 is not needed. Therefore, the complexity of operation of the aerosol concentrator 236 and accompanying liquid losses may typically be avoided.

It is important that the aerosol stream (whether it has been concentrated or not) that is fed to the furnace 110 have a high droplet flow rate and high droplet loading as would be required for most industrial applications. With the present invention, the aerosol stream fed to the furnace preferably includes a droplet flow of greater than about 0.5 liters per hour, more preferably greater than about 2 liters per hour, still more preferably greater than about 5 liters per hour, even more preferably greater than about 10 liters per hour, particularly greater than about 50 liters per hour and most preferably greater than about 100 liters per hour; and with the droplet loading being typically greater than about 0.04 milliliters of droplets per liter of carrier gas, preferably greater than about 0.083 milliliters of droplets per liter of carrier gas 104, more preferably greater than about 0.167 milliliters of droplets per liter of carrier gas 104, still more preferably greater than about 0.25 milliliters of droplets per liter of carrier gas 104, particularly greater than about 0.33 milliliters of droplets per liter of carrier gas 104 and most preferably greater than about 0.83 milliliters of droplets per liter of carrier gas 104.

One embodiment of a virtual impactor that could be used as the aerosol concentrator 236 will now be described with reference to FIGS. 26–32. A virtual impactor 246 includes an upstream plate assembly 248 (details shown in FIGS. 27–29) and a downstream plate assembly 250 (details shown in FIGS. 25–32), with a concentrating chamber 262 located between the upstream plate assembly 248 and the downstream plate assembly 250.

Through the upstream plate assembly 248 are a plurality of vertically extending inlet slits 254. The downstream plate assembly 250 includes a plurality of vertically extending exit slits 256 that are in alignment with the inlet slits 254. The exit slits 256, are, however, slightly wider than the inlet slits 254. The downstream plate assembly 250 also includes flow channels 258 that extend substantially across the width of the entire downstream plate assembly 250, with each flow channel 258 being adjacent to an excess gas withdrawal port 260.

During operation, the aerosol 108 passes through the inlet slits 254 and into the concentrating chamber 262. Excess carrier gas 238 is withdrawn from the concentrating chamber 262 via the excess gas withdrawal ports 260. The withdrawn excess carrier gas 238 then exits via a gas duct port 264. That portion of the aerosol 108 that is not withdrawn through the excess gas withdrawal ports 260 passes through the exit slits 256 and the flow channels 258 to form the concentrated aerosol 240. Those droplets passing across the concentrating chamber 262 and through the exit slits 256 are those droplets of a large enough size to have sufficient momentum to resist being withdrawn with the excess carrier gas 238.

As seen best in FIGS. 27–32, the inlet slits 254 of the upstream plate assembly 248 include inlet nozzle extension portions 266 that extend outward from the plate surface 268 of the upstream plate assembly 248. The exit slits 256 of the downstream plate assembly 250 include exit nozzle extension portions 270 extending outward from a plate surface 272 of the downstream plate assembly 250. These nozzle extension portions 266 and 270 are important for operation of the virtual impactor 246, because having these nozzle extension portions 266 and 270 permits a very close spacing to be attained between the inlet slits 254 and the exit slits 256 across the concentrating chamber 262, while also providing a relatively large space in the concentrating chamber 262 to facilitate efficient removal of the excess carrier gas 238.

Also as best seen in FIGS. 27–32, the inlet slits 254 have widths that flare outward toward the side of the upstream plate assembly 248 that is first encountered by the aerosol 108 during operation. This flared configuration reduces the sharpness of surfaces encountered by the aerosol 108, reducing the loss of aerosol droplets and potential interference from liquid buildup that could occur if sharp surfaces were present. Likewise, the exit slits 256 have a width that flares outward towards the flow channels 258, thereby allowing the concentrated aerosol 240 to expand into the flow channels 258 without encountering sharp edges that could cause problems.

As noted previously, both the inlet slits 254 of the upstream plate assembly 248 and the exit slits 256 of the downstream plate assembly 250 are vertically extending. This configuration is advantageous for permitting liquid that may collect around the inlet slits 254 and the exit slits 256 to drain away. The inlet slits 254 and the exit slits 256 need not, however, have a perfectly vertical orientation. Rather, it is often desirable to slant the slits backward (sloping upward and away in the direction of flow) by about five to ten degrees relative to vertical, to enhance draining of liquid off of the upstream plate assembly 248 and the downstream plate assembly 250. This drainage function of the vertically extending configuration of the inlet slits 254 and the outlet slits 256 also inhibits liquid build-up in the vicinity of the inlet slits 248 and the exit slits 250, which liquid build-up could result in the release of undesirably large droplets into the concentrated aerosol 240.

As discussed previously, the aerosol generator 106 of the present invention produces a concentrated, high quality aerosol of micro-sized droplets having a relatively narrow size distribution. It has been found, however, that for many applications the process of the present invention is significantly enhanced by further classifying by size the droplets in the aerosol 108 prior to introduction of the droplets into the furnace 110. In this manner, the size and size distribution of particles in the particulate product 116 are further controlled.

Figure 33:
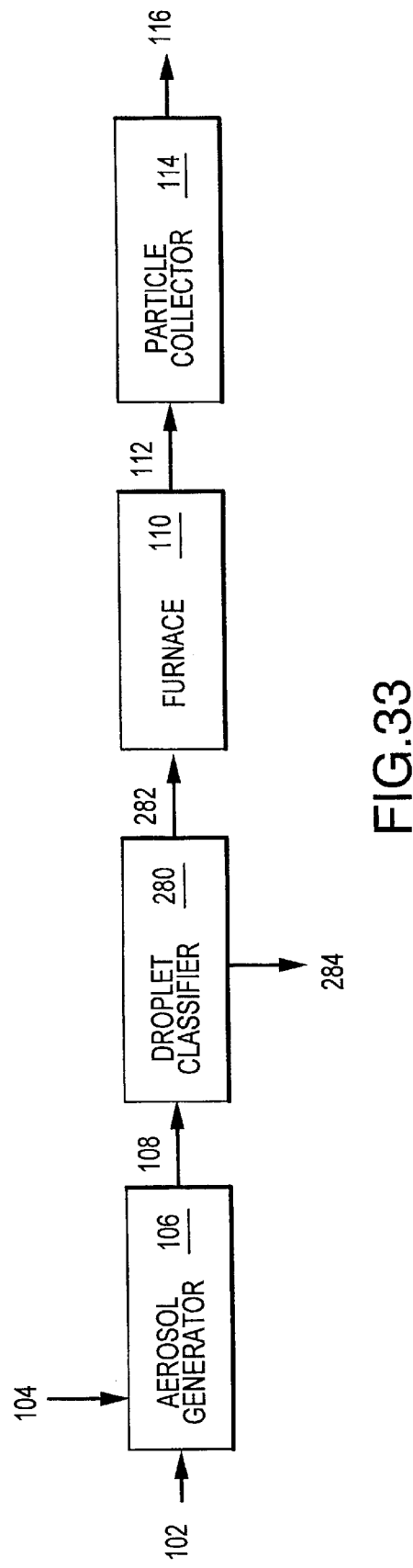
FIG. 33 is a process block diagram of one embodiment of the process of the present invention including a droplet classifier.

Referring now to FIG. 33, a process flow diagram is shown for one embodiment of the process of the present invention including such droplet classification. As shown in FIG. 33, the aerosol 108 from the aerosol generator 106 goes to a droplet classifier 280 where oversized droplets are removed from the aerosol 108 to prepare a classified aerosol 282. Liquid 284 from the oversized droplets that are being removed is drained from the droplet classifier 280. This drained liquid 284 may advantageously be recycled for use in preparing additional liquid feed 102.

Any suitable droplet classifier may be used for removing droplets above a predetermined size. For example, a cyclone could be used to remove over-size droplets. A preferred droplet classifier for many applications, however, is an impactor. One embodiment of an impactor for use with the present invention will now be described with reference to FIGS. 34–38.

Figure 34:
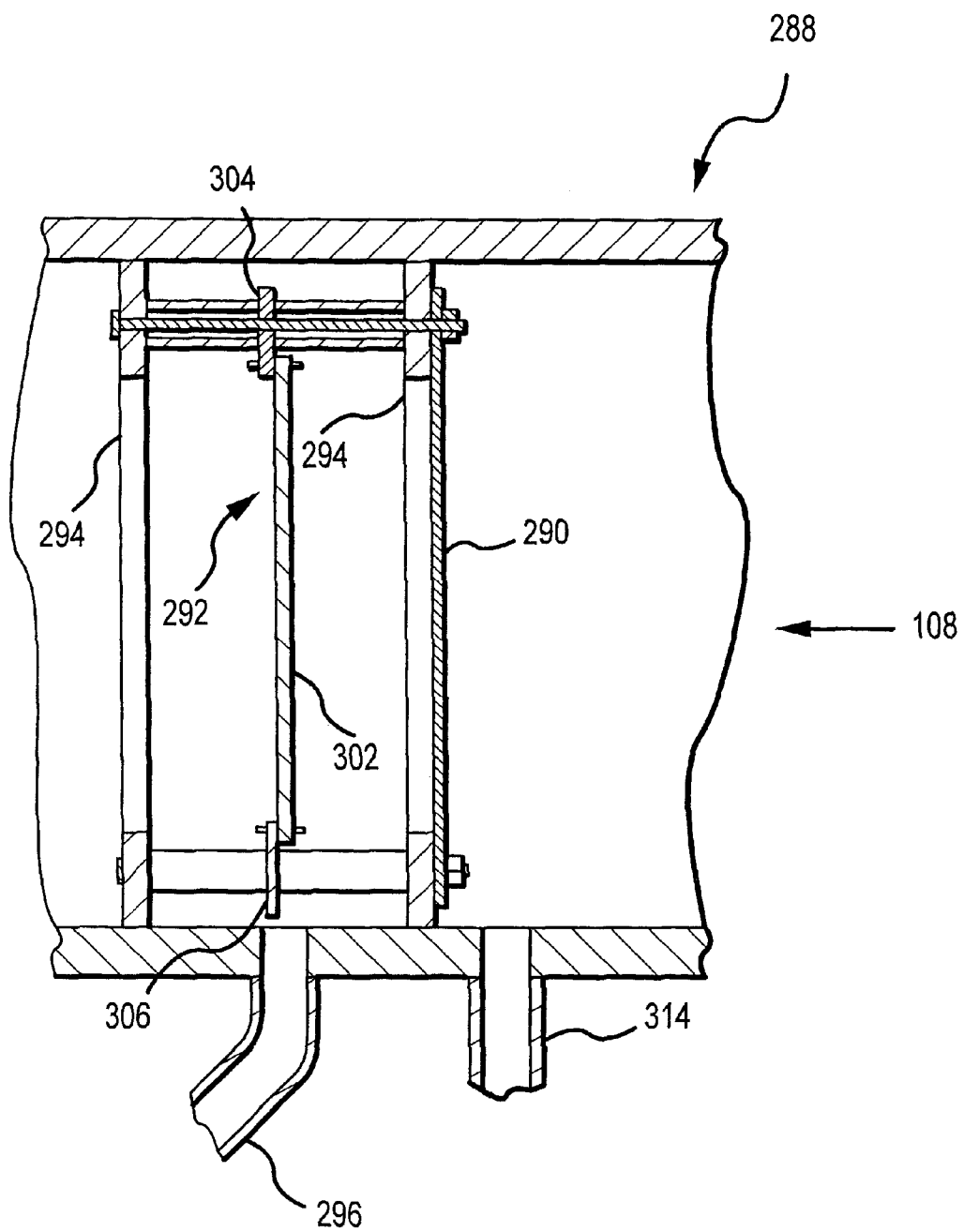
FIG. 34 is a top view in cross section of an impactor of the present invention for use in classifying an aerosol.

As seen in FIG. 34, an impactor 288 has disposed in a flow conduit 286 a flow control plate 290 and an impactor plate assembly 292. The flow control plate 290 is conveniently mounted on a mounting plate 294.

Figure 35:
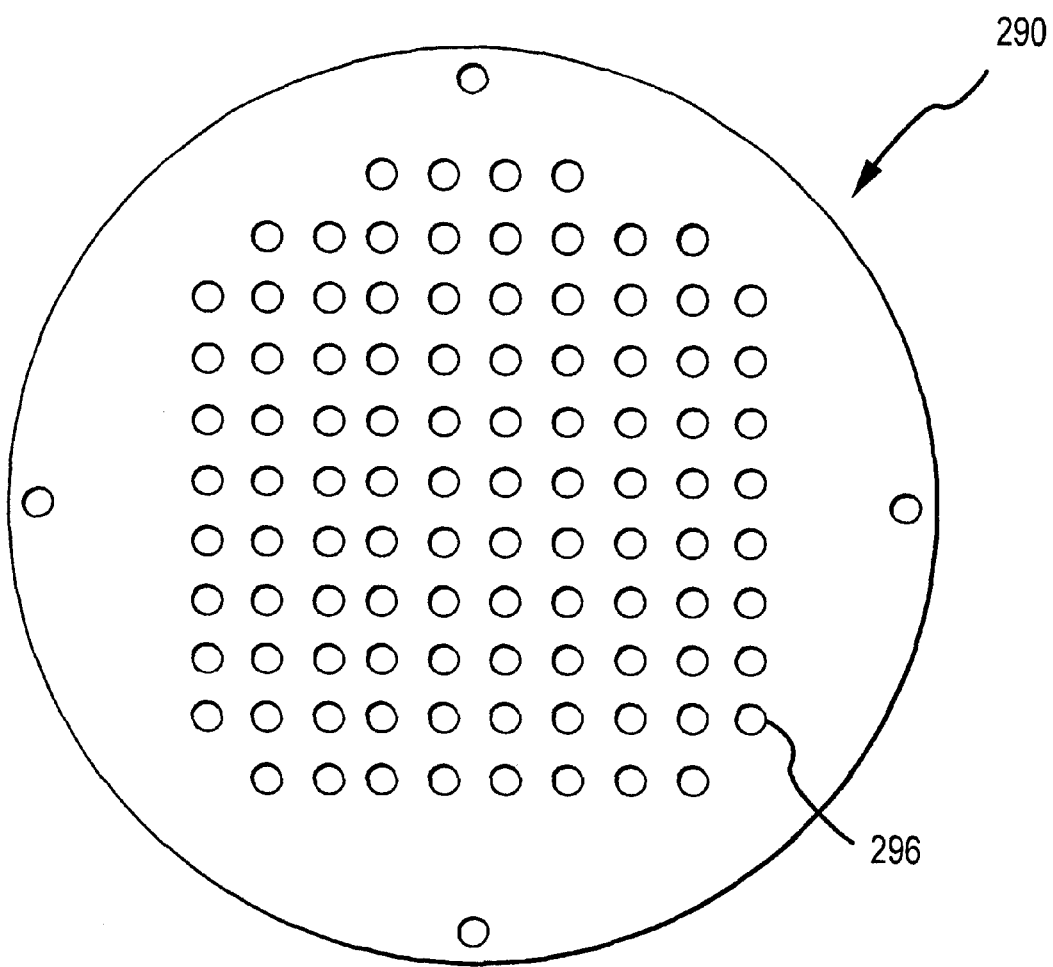
FIG. 35 is a front view of a flow control plate of the impactor shown in FIG. 34.

The flow control plate 290 is used to channel the flow of the aerosol stream toward the impactor plate assembly 292 in a manner with controlled flow characteristics that are desirable for proper impaction of oversize droplets on the impactor plate assembly 292 for removal through the drains 296 and 314. One embodiment of the flow control plate 290 is shown in FIG. 35. The flow control plate 290 has an array of circular flow ports 296 for channeling flow of the aerosol 108 towards the impactor plate assembly 292 with the desired flow characteristics.

Figure 36:
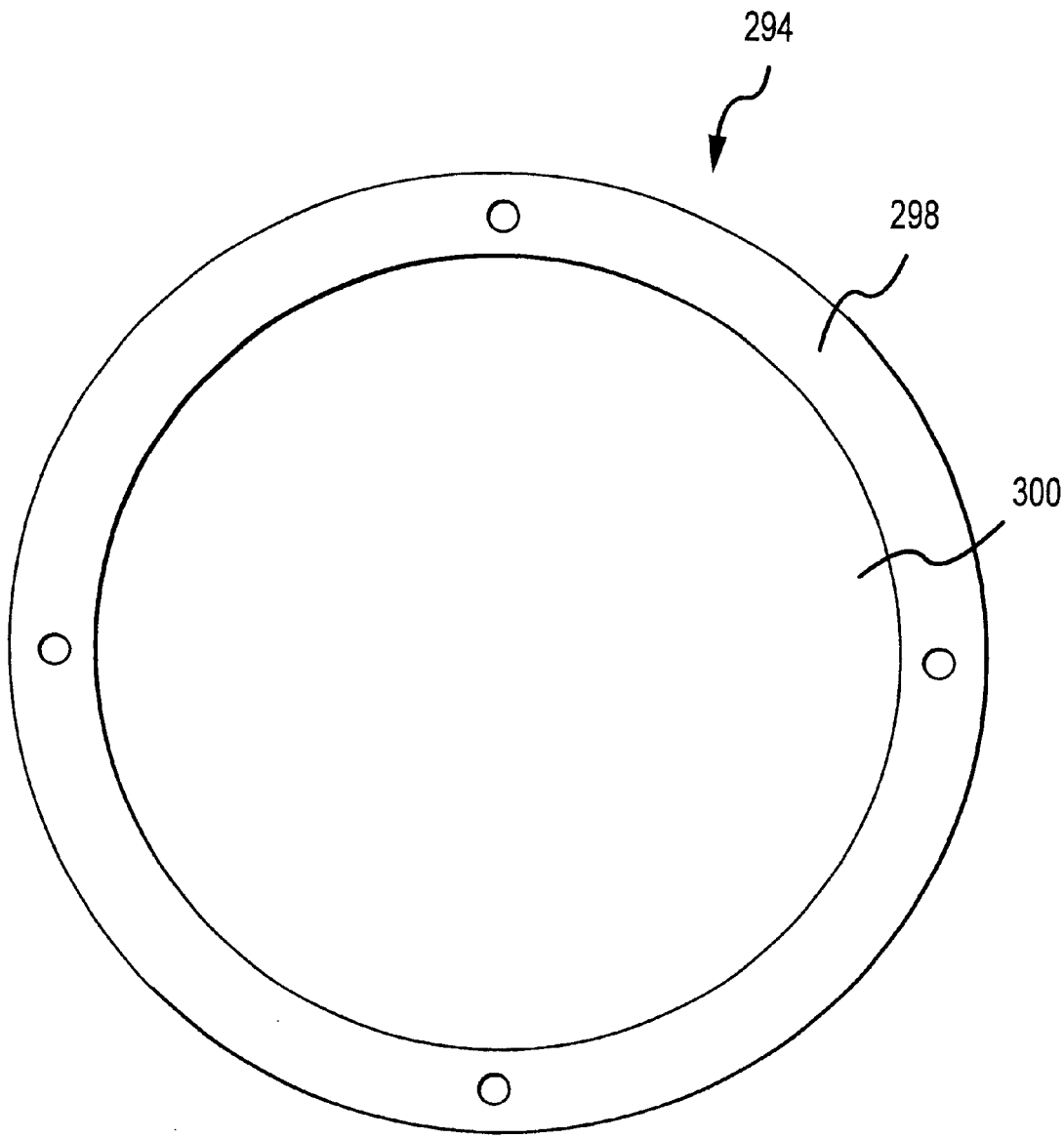
FIG. 36 is a front view of a mounting plate of the impactor shown in FIG. 34.

Details of the mounting plate 294 are shown in FIG. 36. The mounting plate 294 has a mounting flange 298 with a large diameter flow opening 300 passing therethrough to permit access of the aerosol 108 to the flow ports 296 of the flow control plate 290 (shown in FIG. 35).

Figure 37:
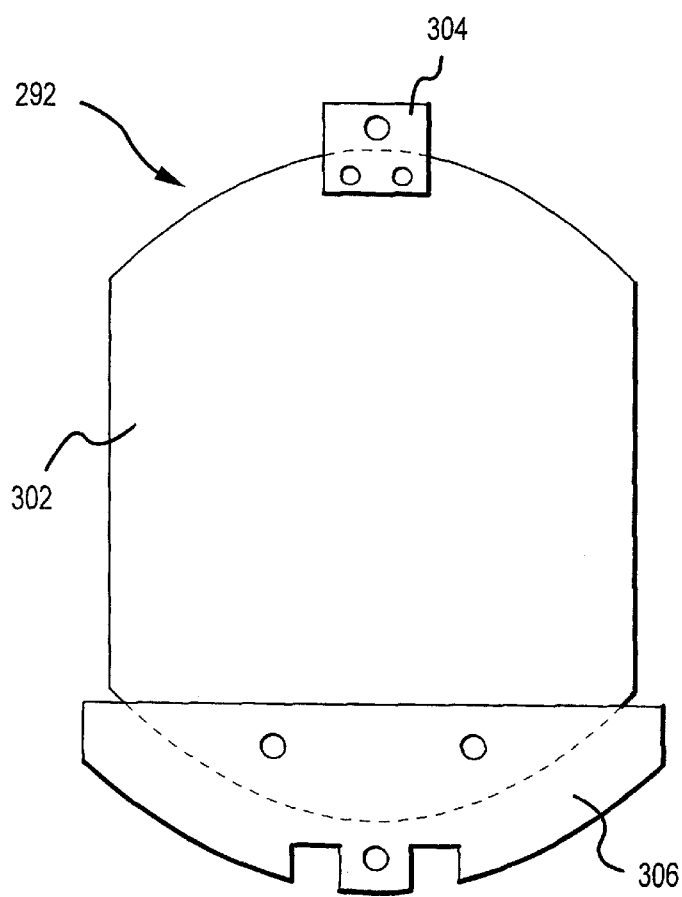
FIG. 37 is a front view of an impactor plate assembly of the impactor shown in FIG. 34.
Figure 38:
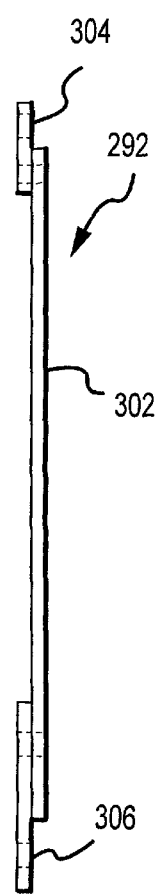
FIG. 38 is a side view of the impactor plate assembly shown in FIG. 37.

Referring now to FIGS. 37 and 38, one embodiment of an impactor plate assembly 292 is shown. The impactor plate assembly 292 includes an impactor plate 302 and mounting brackets 304 and 306 used to mount the impactor plate 302 inside of the flow conduit 286. The impactor plate 302 and the flow channel plate 290 are designed so that droplets larger than a predetermined size will have momentum that is too large for those particles to change flow direction to navigate around the impactor plate 302.

During operation of the impactor 288, the aerosol 108 from the aerosol generator 106 passes through the upstream flow control plate 290. Most of the droplets in the aerosol navigate around the impactor plate 302 and exit the impactor 288 through the downstream flow control plate 290 in the classified aerosol 282. Droplets in the aerosol 108 that are too large to navigate around the impactor plate 302 will impact on the impactor plate 302 and drain through the drain 296 to be collected with the drained liquid 284 (as shown in FIG. 34).

The configuration of the impactor plate 302 shown in FIG. 33 represents only one of many possible configurations for the impactor plate 302. For example, the impactor 288 could include an upstream flow control plate 290 having vertically extending flow slits therethrough that are offset from vertically extending flow slits through the impactor plate 302, such that droplets too large to navigate the change in flow due to the offset of the flow slits between the flow control plate 290 and the impactor plate 302 would impact on the impactor plate 302 to be drained away. Other designs are also possible.

Thus, droplets can be removed that have an aerodynamic greater than a preselected maximum diameter. In a preferred embodiment of the present invention, the droplet classifier 280 is typically designed to remove droplets from the aerosol 108 that are larger than about 15 $\mu$m in size, more preferably to remove droplets larger than about 10 $\mu$m in size, even more preferably to remove droplets of a size larger than about 8 $\mu$m in size and most preferably to remove droplets larger than about 6 $\mu$m in size. The droplet classification size in the droplet classifier is preferably smaller than about 15 $\mu$m, more preferably smaller than about 10 $\mu$m, even more preferably smaller than about 8 $\square$m and most preferably smaller than about 5 $\mu$m, The classification size, also called the classification cut point, is that size at which half of the droplets of that size are removed and half of the droplets of that size are retained. Depending upon the specific application, however, the droplet classification size may be varied, such as by changing the spacing between the impactor plate 302 and the flow control plate 290 or increasing or decreasing aerosol velocity through the jets in the flow control plate 290. Because the aerosol generator 106 of the present invention initially produces a high quality aerosol 108, having a relatively narrow size distribution of droplets, typically less than about 30 weight percent of liquid feed 102 in the aerosol 108 is removed as the drain liquid 284 in the droplet classifier 288, with preferably less than about 25 weight percent being removed, even more preferably less than about 20 weight percent being removed and most preferably less than about 15 weight percent being removed. Minimizing the removal of liquid feed 102 from the aerosol 108 is particularly important for commercial applications to increase the yield of high quality particulate product 116. It should be noted, however, that because of the superior performance of the aerosol generator 106, it is frequently not required to use an impactor or other droplet classifier to obtain a desired absence of oversize droplets to the furnace. This is a major advantage, because the added complexity and liquid losses accompanying use of an impactor may often be avoided with the process of the present invention.

Figure 39:
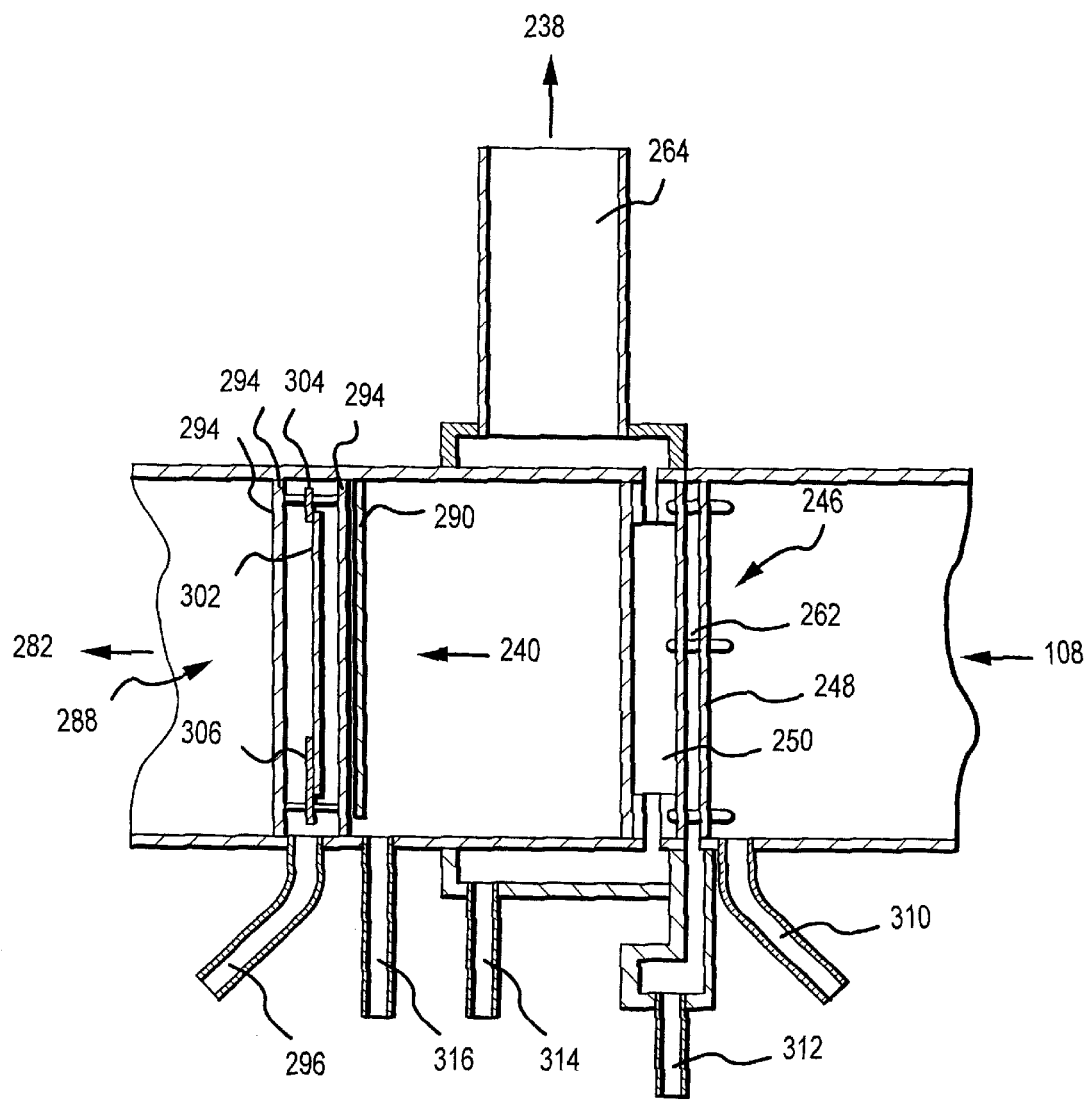
FIG. 39 shows a side view in cross section of a virtual impactor in combination with an impactor of the present invention for concentrating and-classifying droplets in an aerosol.

Sometimes it is desirable to use both the aerosol concentrator 236 and the droplet classifier 280 to produce an extremely high quality aerosol stream for introduction into the furnace for the production of particles of highly controlled size and size distribution. Referring now to FIG. 39, one embodiment of the present invention is shown incorporating both the virtual impactor 246 and the impactor 288. Basic components of the virtual impactor 246 and the impactor 288, as shown in FIG. 39, are substantially as previously described with reference to FIGS. 26–38. As seen in FIG. 39, the aerosol 108 from the aerosol generator 106 is fed to the virtual impactor 246 where the aerosol stream is concentrated to produce the concentrated aerosol 240. The concentrated aerosol 240 is then fed to the impactor 288 to remove large droplets therefrom and produce the classified aerosol 282, which may then be fed to the furnace 110. Also, it should be noted that by using both a virtual impactor and an impactor, both undesirably large and undesirably small droplets are removed, thereby producing a classified aerosol with a very narrow droplet size distribution. Also, the order of the aerosol concentrator and the aerosol classifier could be reversed, so that the aerosol concentrator 236 follows the aerosol classifier 280.

One important feature of the design shown in FIG. 39 is the incorporation of drains 310, 312, 314, 316 and 296 at strategic locations. These drains are extremely important for industrial-scale particle production because buildup of liquid in the process equipment can significantly impair the quality of the particulate product 116 that is produced. In that regard, drain 310 drains liquid away from the inlet side of the first plate assembly 248 of the virtual impactor 246. Drain 312 drains liquid away from the inside of the concentrating chamber 262 in the virtual impactor 246 and drain 314 removes liquid that deposits out of the excess carrier gas 238. Drain 316 removes liquid from the vicinity of the inlet side of the flow control plate 290 of the impactor, while the drain 296 removes liquid from the vicinity of the impactor plate 302. Without these drains 310, 312, 314, 316 and 296, the performance of the apparatus shown in FIG. 39 would be significantly impaired. All liquids drained in the drains 310, 312, 314, 316 and 296 may advantageously be recycled for use to prepare the liquid feed 102.

Figure 40:
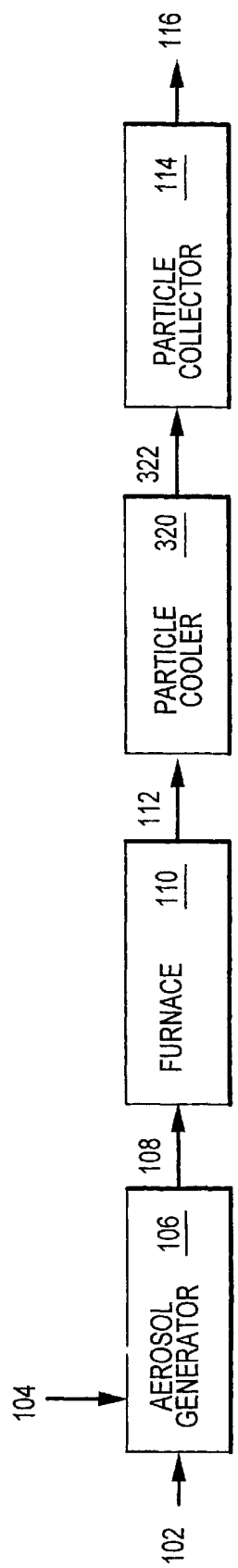
FIG. 40 is a process block diagram of one embodiment of the present invention including a particle cooler.

With some applications of the process of the present invention, it may be possible to collect the particles 112 directly from the output of the furnace 110. More often, however, it will be desirable to cool the particles 112 exiting the furnace 110 prior to collection of the particles 112 in the particle collector 114. Referring now to FIG. 40, one embodiment of the process of the present invention is shown in which the particles 112 exiting the furnace 110 are sent to a particle cooler 320 to produce a cooled particle stream 322, which is then feed to the particle collector 114. Although the particle cooler 320 may be any cooling apparatus capable of cooling the particles 112 to the desired temperature for introduction into the particle collector 114, traditional heat exchanger designs are not preferred. This is because a traditional heat exchanger design ordinarily directly subjects the aerosol stream, in which the hot particles 112 are suspended, to cool surfaces. In that situation, significant losses of the particles 112 occur due to thermophoretic deposition of the hot particles 112 on the cool surfaces of the heat exchanger. According to the present invention, a gas quench apparatus is provided for use as the particle cooler 320 that significantly reduces thermophoretic losses compared to a traditional heat exchanger.

Figure 41:
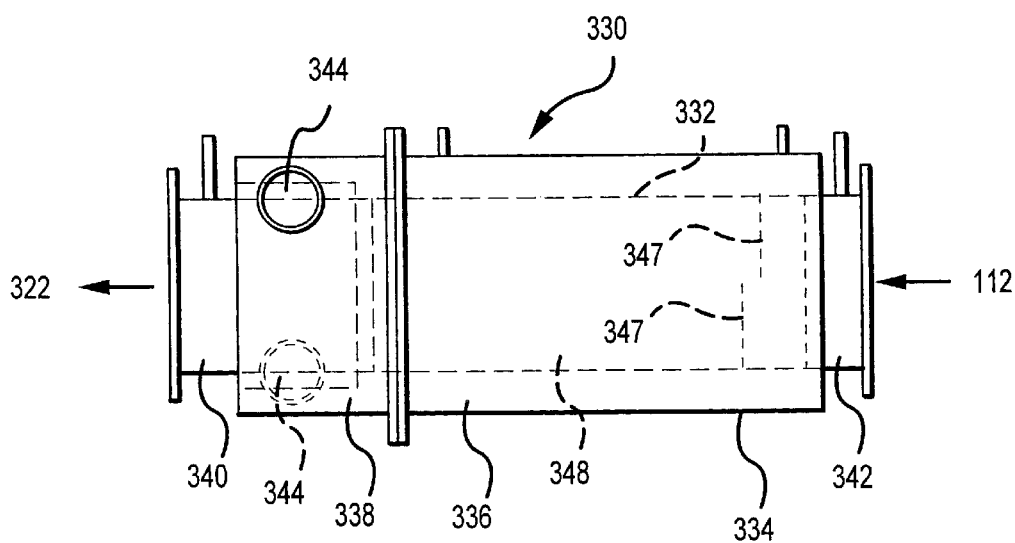
FIG. 41 is a top view of a gas quench cooler of the present invention.
Figures 42, 43:
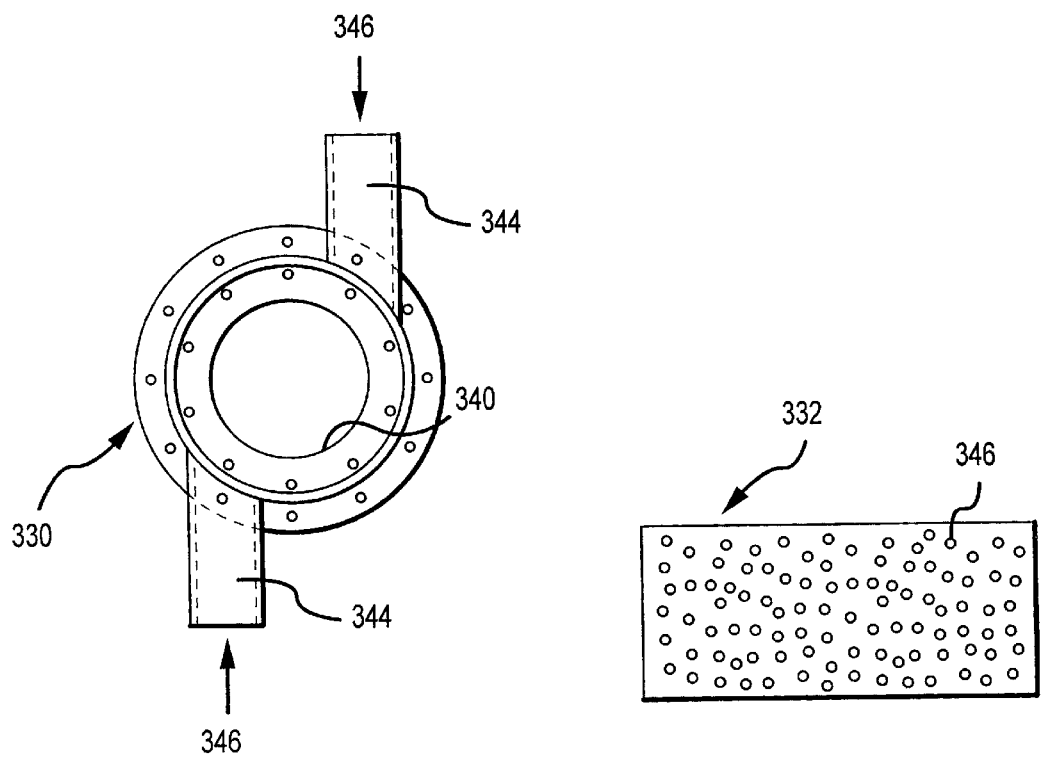
FIG. 42 is an end view of the gas quench cooler shown in FIG. 41.
FIG. 43 is a side view of a perforated conduit of the quench cooler shown in FIG. 41.

Referring now to FIGS. 41–43, one embodiment of a gas quench cooler 330 is shown. The gas quench cooler includes a perforated conduit 332 housed inside of a cooler housing 334 with an annular space 336 located between the cooler housing 334 and the perforated conduit 332. In fluid communication with the annular space 336 is a quench gas inlet box 338, inside of which is disposed a portion of an aerosol outlet conduit 340. The perforated conduit 332 extends between the aerosol outlet conduit 340 and an aerosol inlet conduit 342. Attached to an opening into the quench gas inlet box 338 are two quench gas feed tubes 344. Referring specifically to FIG. 43, the perforated tube 332 is shown. The perforated tube 332 has a plurality of openings 345. The openings 345, when the perforated conduit 332 is assembled into the gas quench cooler 330, permit the flow of quench gas 346 from the annular space 336 into the interior space 348 of the perforated conduit 332. Although the openings 345 are shown as being round holes, any shape of opening could be used, such as slits. Also, the perforated conduit 332 could be a porous screen. Two heat radiation shields 347 prevent downstream radiant heating from the furnace. In most instances, however, it will not be necessary to include the heat radiation shields 347, because downstream radiant heating from the furnace is normally not a significant problem. Use of the heat radiation shields 347 is not preferred due to particulate losses that accompany their use.

With continued reference to FIGS. 41–43, operation of the gas quench cooler 330 will now be described. During operation, the particles 112, carried by and dispersed in a gas stream, enter the gas quench cooler 330 through the aerosol inlet conduit 342 and flow into the interior space 348 of perforated conduit 332. Quench gas 346 is introduced through the quench gas feed tubes 344 into the quench gas inlet box 338. Quench gas 346 entering the quench gas inlet box 338 encounters the outer surface of the aerosol outlet conduit 340, forcing the quench gas 346 to flow, in a spiraling, swirling manner, into the annular space 336, where the quench gas 346 flows through the openings 345 through the walls of the perforated conduit 332. Preferably, the gas 346 retains some swirling motion even after passing into the interior space 348. In this way, the particles 112 are quickly cooled with low losses of particles to the walls of the gas quench cooler 330. In this manner, the quench gas 346 enters in a radial direction into the interior space 348 of the perforated conduit 332 around the entire periphery, or circumference, of the perforated conduit 332 and over the entire length of the perforated conduit 332. The cool quench gas 346 mixes with and cools the hot particles 112, which then exit through the aerosol outlet conduit 340 as the cooled particle stream 322. The cooled particle stream 322 can then be sent to the particle collector 114 for particle collection. The temperature of the cooled particle stream 322 is controlled by introducing more or less quench gas. Also, as shown in FIG. 41, the quench gas 346 is fed into the quench cooler 330 in counter flow to flow of the particles. Alternatively, the quench cooler could be designed so that the quench gas 346 is fed into the quench cooler in concurrent flow with the flow of the particles 112. The amount of quench gas 346 fed to the gas quench cooler 330 will depend upon the specific material being made and the specific operating conditions. The quantity of quench gas 346 used, however, must be sufficient to reduce the temperature of the aerosol steam including the particles 112 to the desired temperature. Typically, the particles 112 are cooled to a temperature at least below about 200° C., and often lower. The only limitation on how much the particles 112 are cooled is that the cooled particle stream 322 must be at a temperature that is above the condensation temperature for water as another condensible vapor in the stream. The temperature of the cooled particle stream 322 is often at a temperature of from about 50° C. to about 120° C.

Because of the entry of quench gas 346 into the interior space 348 of the perforated conduit 322 in a radial direction about the entire circumference and length of the perforated conduit 322, a buffer of the cool quench gas 346 is formed about the inner wall of the perforated conduit 332, thereby significantly inhibiting-the loss of hot particles 112 due to thermophoretic deposition on the cool wall of the perforated conduit 332. In operation, the quench gas 346 exiting the openings 345 and entering into the interior space 348 should have a radial velocity (velocity inward toward the center of the circular cross-section of the perforated conduit 332) of larger than the thermophoretic velocity of the particles 112 inside the perforated conduit 332 in a direction radially outward toward the perforated wall of the perforated conduit 332.

As seen in FIGS. 41–43, the gas quench cooler 330 includes a flow path for the particles 112 through the gas quench cooler of a substantially constant cross-sectional shape and area. Preferably, the flow path through the gas quench cooler 330 will have the same cross-sectional shape and area as the flow path through the furnace 110 and through the conduit delivering the aerosol 108 from the aerosol generator 106 to the furnace 110. In one embodiment, however, it may be necessary to reduce the cross-sectional area available for flow prior to the particle collector 114. This is the case, for example, when the particle collector includes a cyclone for separating particles in the cooled particle stream 322 from gas in the cooled particle stream 322. This is because of the high inlet velocity requirements into cyclone separators.

Figure 44:
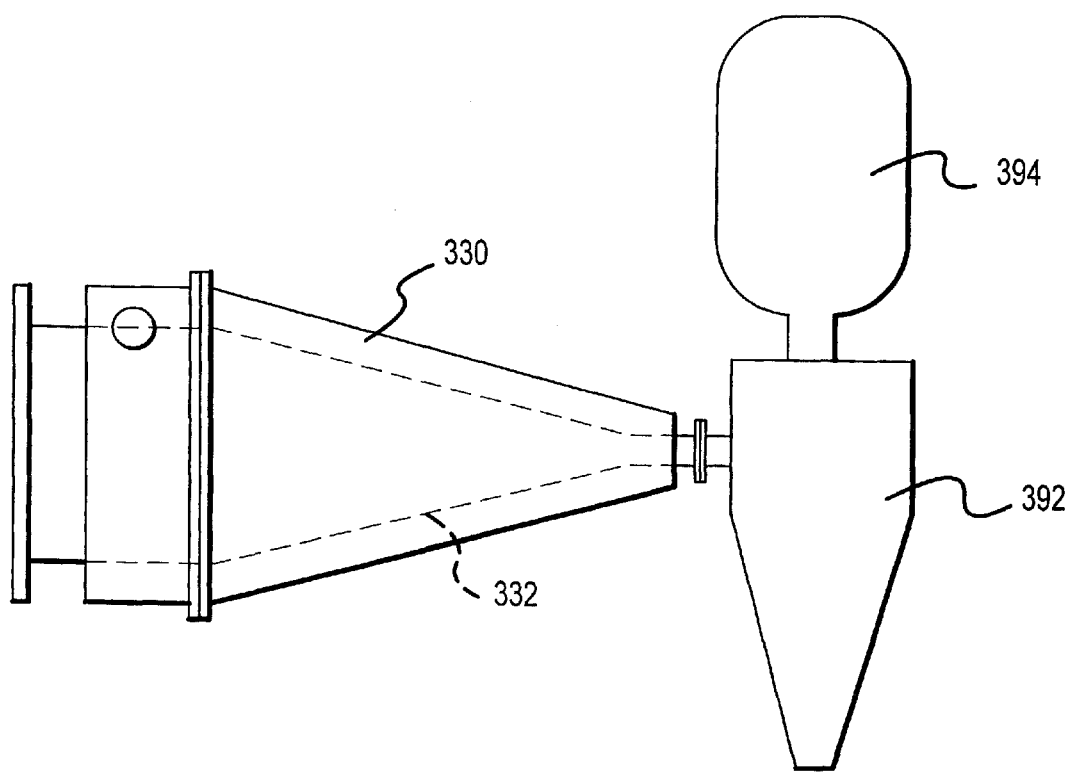
FIG. 44 is a side view showing one embodiment of a gas quench cooler of the present invention connected with a cyclone.

Referring now to FIG. 44, one embodiment of the gas quench cooler 330 is shown in combination with a cyclone separator 392. The perforated conduit 332 has a continuously decreasing cross-sectional area for flow to increase the velocity of flow to the proper value for the feed to cyclone separator 392. Attached to the cyclone separator 392 is a bag filter 394 for final clean-up-of overflow from the cyclone separator 392. Separated particles exit with underflow from the cyclone separator 392 and may be collected in any convenient container. The use of cyclone separation is particularly preferred for powder having a weight average size of larger than about 1 μm, although a series of cyclones may sometimes be needed to get the desired degree of separation. Cyclone separation is particularly preferred for powders having a weight average size of larger than about 1.5 μm. Also, cyclone separation is best suited for high density materials. Preferably, when particles are separated using a cyclone, the particles are of a composition with specific gravity of greater than about 5.

Figure 45:
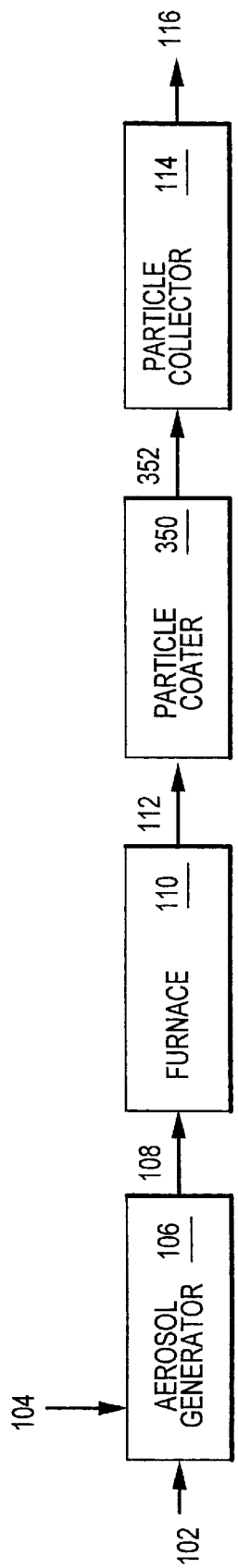
FIG. 45 is a process block diagram of one embodiment of the present invention including a particle coater.

In an additional embodiment, the process of the present invention can also incorporate compositional modification of the particles 112 exiting the furnace. Most commonly, the compositional modification will involve forming on the particles 112 a material phase that is different than that of the particles 112, such as by coating the particles 112 with a coating material. One embodiment of the process of the present invention incorporating particle coating is shown in FIG. 45. As shown in FIG. 45, the particles 112 exiting from the furnace 110 go to a particle coater 350 where a coating is placed over the outer surface of the particles 112 to form coated particles 352, which are then sent to the particle collector 114 for preparation of the particulate product 116. Coating methodologies employed in the particle coater 350 are discussed in more detail below.

With continued reference primarily to FIG. 45, in a preferred embodiment, when the particles 112 are coated according to the process of the present invention, the particles 112 are also manufactured via the aerosol process of the present invention, as previously described. The process of the present invention can, however, be used to coat particles that have been premanufactured by a different process, such as by a liquid precipitation route. When coating particles that have been premanufactured by a different route, such as by liquid precipitation, it is preferred that the particles remain in a dispersed state from the time of manufacture to the time that the particles are introduced in slurry form into the aerosol generator 106 for preparation of the aerosol 108 to form the dry particles 112 in the furnace 110, which particles 112 can then be coated in the particle coater 350. Maintaining particles in a dispersed state from manufacture through coating avoids problems associated with agglomeration and redispersion of particles if particles must be redispersed in the liquid feed 102 for feed to the aerosol generator 106. For example, for particles originally precipitated from a liquid medium, the liquid medium containing the suspended precipitated particles could be used to form the liquid feed 102 to the aerosol generator 106. It should be noted that the particle coater. 350 could be an integral extension of the furnace. 110 or could be a separate piece of equipment.

Figure 46:
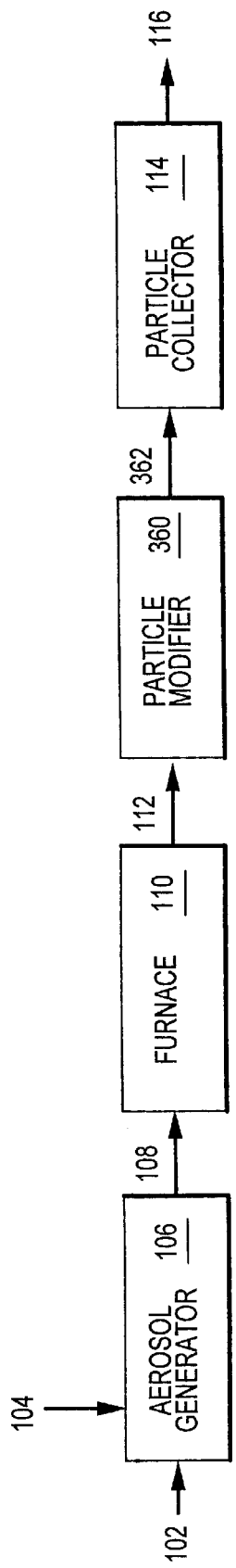
FIG. 46 is a block diagram of one embodiment of the present invention including a particle modifier.
Figure 47A:
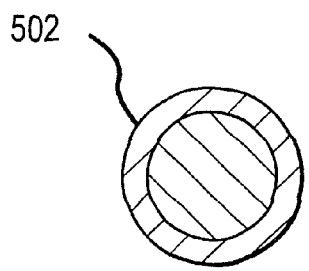
FIG. 47 shows cross sections of various particle morphologies of some composite particles manufacturable according to the present invention.
Figure 47B:
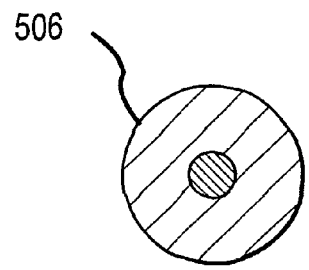
Figure 47C:
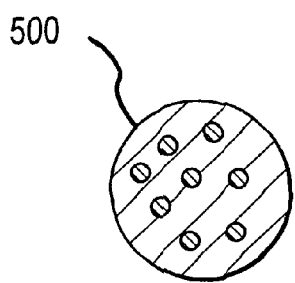
Figure 47D:
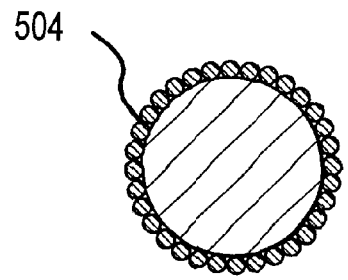
Figure 47E:
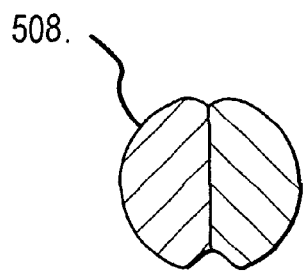
Figure 47F:
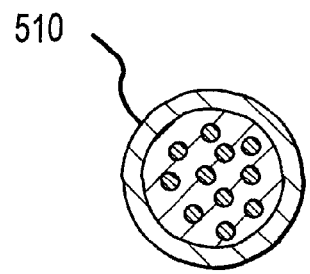

In a further embodiment of the present invention, following preparation of the particles 112 in the furnace 110, the particles 112 may then be structurally modified to impart desired physical properties prior to particle collection. Referring now to FIG. 46, one embodiment of the process of the present invention is shown including such structural particle modification. The particles 112 exiting the furnace 110 go to a particle modifier 360 where the particles are structurally modified to form modified particles 362, which are then sent to the particle collector 114 for preparation of the particulate product 116. The particle modifier 360 is typically a furnace, such as an annealing furnace, which may be integral with the furnace 110 or may be a separate heating device. Regardless, it is important that the particle modifier 360 have temperature control that is independent of the furnace 110, so that the proper conditions for particle modification may be provided separate from conditions required of the furnace 110 to prepare the particles 112. The particle modifier 360, therefore, typically provides a temperature controlled environment and necessary residence time to effect the desired structural modification of the particles 112.

The structural modification that occurs in the particle modifier 360 may be any modification to the crystalline structure or morphology of the particles 112. For example, the particles 112 may be annealed in the particle modifier 360 to densify the particles 112 or to recrystallize the particles 112 into a polycrystalline or single crystalline form. Also, especially in the case of composite particles 112, the particles may be annealed for a sufficient time to permit redistribution within the particles 112 of different material phases. Particularly preferred parameters for such processes are discussed in more detail below.

The initial morphology of composite particles made in the furnace 110, according to the present invention, could take a variety of forms, depending upon the specified materials involved and the specific processing conditions. Examples of some possible composite particle morphologies, manufacturable according to the present invention are shown in FIG. 47. These morphologies could be of the particles as initially produced in the furnace 110 or that result from structural modification in the particle modifier 360. Furthermore, the composite particles could include a mixture of the morphological attributes shown in FIG. 47.

Figure 48:
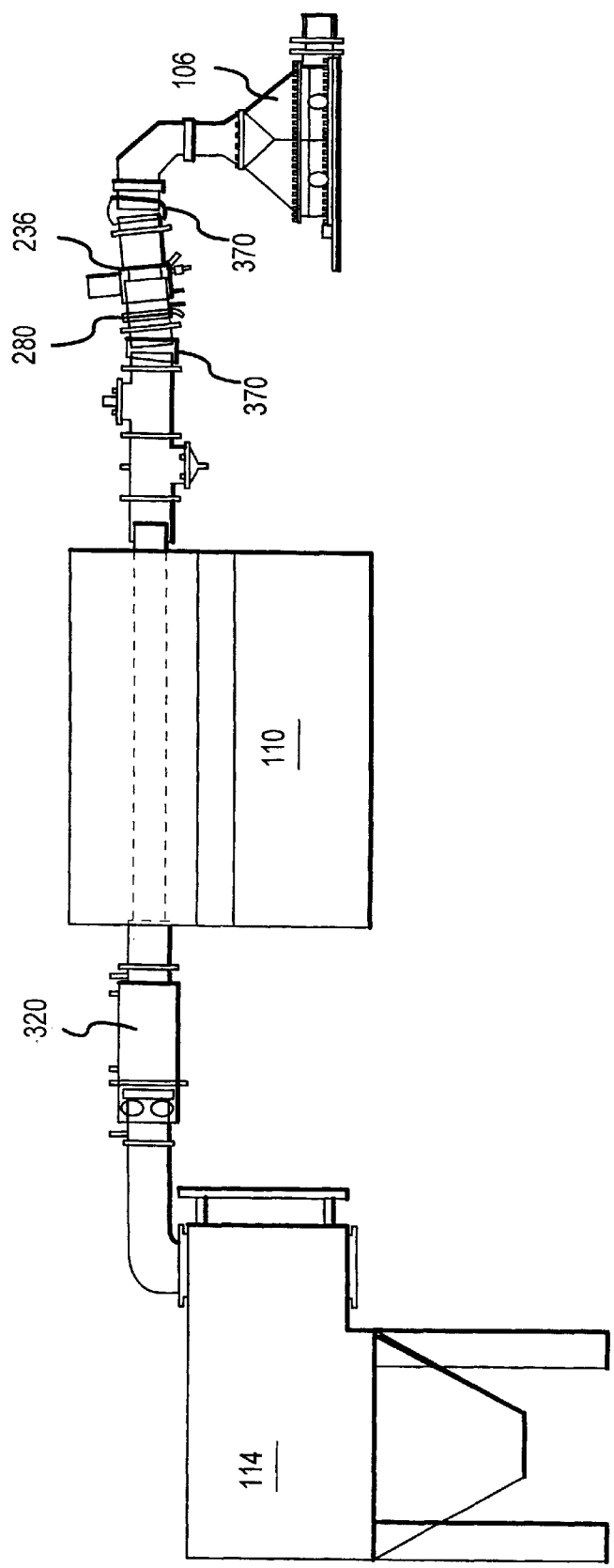
FIG. 48 shows a side view of one embodiment of apparatus of the present invention including an aerosol generator, an aerosol concentrator, a droplet classifier, a furnace, a particle cooler, and a particle collector.

Referring now to FIG. 48, an embodiment of the apparatus of the present invention is shown that includes the aerosol generator 106 (in the form of the 400 transducer array design), the aerosol concentrator 236 (in the form of a virtual impactor), the droplet classifier 280 (in the form of an impactor), the furnace 110, the particle cooler 320 (in the form of a gas quench cooler) and the particle collector 114 (in the form of a bag filter). All process equipment components are connected via appropriate flow conduits that are substantially free of sharp edges that could detrimentally cause liquid accumulations in the apparatus. Also, it should be noted that flex connectors 370 are used upstream and downstream of the aerosol concentrator 236 and the droplet classifier 280. By using the flex connectors 370, it is possible to vary the angle of slant of vertically extending slits in the aerosol concentrator 236 and/or the droplet classifier 280. In this way, a desired slant for the vertically extending slits may be set to optimize the draining characteristics off the vertically extending slits.

Aerosol generation with the process of the present invention has thus far been described with respect to the ultrasonic aerosol generator. Use of the ultrasonic generator is preferred for the process of the present invention because of the extremely high quality and dense aerosol generated. In some instances, however, the aerosol generation for the process of the present invention may have a different design depending upon the specific application. For example, when larger particles are desired, such as those having a weight average size of larger than about 3 $\mu$m, a spray nozzle atomizer may be preferred. For smaller-particle applications, however, and particularly for those applications to produce particles smaller than about 3 $\mu$m, and preferably smaller than about 2 $\mu$m in size, as is generally desired with the particles of the present invention, the ultrasonic generator, as described herein, is particularly preferred. In that regard, the ultrasonic generator of the present invention is particularly preferred for when making particles with a weight average size of from about 0.2 $\mu$m to about 3 $\mu$m.

Although ultrasonic aerosol generators have been used for medical applications and home humidifiers, use of ultrasonic generators for spray pyrolysis particle manufacture has largely been confined to small-scale, experimental situations. The ultrasonic aerosol generator of the present invention described with reference to FIGS. 5–24, however, is well suited for commercial production of high quality powders with a small average size and a narrow size distribution. In that regard, the aerosol generator produces a high quality aerosol, with heavy droplet loading and at a high rate of production. Such a combination of small droplet size, narrow size distribution, heavy droplet loading, and high production rate provide significant advantages over existing aerosol generators that usually suffer from at least one of inadequately narrow size distribution, undesirably low droplet loading, or unacceptably low production rate.

Through the careful and controlled design of the ultrasonic generator of the present invention, an aerosol may be produced typically having greater than about 70 weight percent (and preferably greater than about 80 weight percent) of droplets in the size range of from about 1 $\mu$m to about 10 $\mu$m, preferably in a size range of from about 1 $\mu$m to about 5 $\mu$m and more preferably from about 2 $\mu$m to about 4 $\mu$m. Also, the ultrasonic generator of the present invention is capable of delivering high output rates of liquid feed in the aerosol. The rate of liquid feed, at the high liquid loadings previously described, is preferably greater than about 25 milliliters per hour per transducer, more preferably greater than about 37.5 milliliters per hour per transducer, even more preferably greater than about 50 milliliters per hour per transducer and most preferably greater than about 100 milliliters per hour per transducer. This high level of performance is desirable for commercial operations and is accomplished with the present invention with a relatively simple design including a single precursor bath over an array of ultrasonic transducers. The ultrasonic generator is made for high aerosol production rates at a high droplet loading, and with a narrow size distribution of droplets. The generator preferably produces an aerosol at a rate of greater than about 0.5 liter per hour of droplets, more preferably greater than about 2 liters per hour of droplets, still more preferably greater than about 5 liters per hour of droplets, even more preferably greater than about 10 liters per hour of droplets and most preferably greater than about 40 liters per hour of droplets. For example, when the aerosol generator has a 400 transducer design, as described with reference to FIGS. 7–24, the aerosol generator is capable of producing a high quality aerosol having high droplet loading as previously described, at a total production rate of preferably greater than about 10 liters per hour of liquid feed, more preferably greater than about 15 liters per hour of liquid feed, even more preferably greater than about 20 liters per hour of liquid feed and most preferably greater than about 40 liters per hour of liquid feed.

Under most operating conditions, when using such an aerosol generator, total particulate product produced is preferably greater than about 0.5 gram per hour per transducer, more preferably greater than about 0.75 gram per hour per transducer, even more preferably greater than about 1.0 gram per hour per transducer and most preferably greater than about 2.0 grams per hour per transducer.

One significant aspect of the process of the present invention for manufacturing particulate materials is the unique flow characteristics encountered in the furnace relative to laboratory scale systems. The maximum Reynolds number attained for flow in the furnace 110 with the present invention is very high, typically in excess of 500, preferably in excess of 1,000 and more preferably in excess of 2,000. In most instances, however, the maximum Reynolds number for flow in the furnace will not exceed 10,000, and preferably will not exceed 5,000. This is significantly different from lab-scale systems where the Reynolds number for flow in a reactor is typically lower than 50 and rarely exceeds 100.

The Reynolds number is a dimensionless quantity characterizing flow of a fluid which, for flow through a circular cross sectional conduit is defined as:

$$Re = \frac{\rho v d}{\mu}$$

where: $\rho$=fluid density;
v=fluid mean velocity;
d=conduit inside diameter; and
$\mu$=fluid viscosity.

It should be noted that the values for density, velocity and viscosity will vary along the length of the furnace 110. The maximum Reynolds number in the furnace 110 is typically attained when the average stream temperature is at a maximum, because the gas velocity is at a very high value due to gas expansion when heated.

One problem with operating under flow conditions at a high Reynolds number is that undesirable volatilization of components is much more likely to occur than in systems having flow characteristics as found in laboratory-scale systems. The volatilization problem occurs with the present invention, because the furnace is typically operated over a substantial section of the heating zone in a constant wall heat flux mode, due to limitations in heat transfer capability. This is significantly different than operation of a furnace at a laboratory scale, which typically involves operation of most of the heating zone of the furnace in a uniform wall temperature mode, because the heating load is sufficiently small that the system is not heat transfer limited.

With the present invention, it is typically preferred to heat the aerosol stream in the heating zone of the furnace as quickly as possible to the desired temperature range for particle manufacture. Because of flow characteristics in the furnace and heat transfer limitations, during rapid heating of the aerosol the wall temperature of the furnace can significantly exceed the maximum average target temperature for the stream. This is a problem because, even though the average stream temperature may be within the range desired, the wall temperature may become so hot that components in the vicinity of the wall are subjected to temperatures high enough to undesirably volatilize the components. This volatilization near the wall of the furnace can cause formation of significant quantities of ultrafine particles that are outside of the size range desired.

Therefore, with the present invention, it is preferred that when the flow characteristics in the furnace are such that the Reynolds number through any part of the furnace exceeds 500, more preferably exceeds 1,000, and most preferably exceeds 2,000, the maximum wall temperature in the furnace should be kept at a temperature that is below the temperature at which a desired component of the final particles would exert a vapor pressure not exceeding about 200 millitorr, more preferably not exceeding about 100 millitorr, and most preferably not exceeding about 5.0 millitorr. Furthermore, the maximum wall temperature in the furnace should also be kept below a temperature at which an intermediate component, from which a final component is to be at least partially derived, should also have a vapor pressure not exceeding the magnitudes noted for components of the final product.

In addition to maintaining the furnace wall temperature below a level that could create volatilization problems, it is also important that this not be accomplished at the expense of the desired average stream temperature. The maximum average stream temperature must be maintained at a high enough level so that the particles will have a desired high density. The maximum average stream temperature should, however, generally be a temperature at which a component in the final particles, or an intermediate component from which a component in the final particles is at least partially derived, would exert a vapor pressure not exceeding about 100 millitorr, preferably not exceeding about 50 millitorr, and most preferably not exceeding about 25 millitorr.

So long as the maximum wall temperature and the average stream temperature are kept below the point at which detrimental volatilization occurs, it is generally desirable to heat the stream as fast as possible and to remove resulting particles from the furnace immediately after the maximum stream temperature is reached in the furnace. With the present invention, the average residence time in the heating zone of the furnace may typically be maintained at shorter than about 4 seconds, preferably shorter than about 2 seconds, more preferably shorter than about 1 second, still more preferably shorter than about 0.5 second, and most preferably shorter than about 0.2 second.

Another significant issue with respect to operating the process of the present invention, which includes high aerosol flow rates, is loss within the system of materials intended for incorporation into the final particulate product. Material losses in the system can be quite high if the system is not properly operated. If system losses are too high, the process would not be practical for use in the manufacture of particulate products of many materials. This has typically not been a major consideration with laboratory-scale systems.

One significant potential for loss with the process of the present invention is thermophoretic losses that occur when a hot aerosol stream is in the presence of a cooler surface. In that regard, the use of the quench cooler, as previously described, with the process of the present invention provides an efficient way to cool the particles without unreasonably high thermophoretic losses. There is also, however, significant potential for losses occurring near the end of the furnace and between the furnace and the cooling unit.

It has been found that thermophoretic losses in the back end of the furnace can be significantly controlled if the heating zone of the furnace is operated such that the maximum stream temperature is not attained until near the end of the heating zone in the furnace, and at least not until the last third of the heating zone. When the heating zone includes a plurality of heating sections, the maximum average stream temperature should ordinarily not occur until at least the last heating section. Furthermore, the heating zone should typically extend to as close to the exit of the furnace as possible. This is counter to conventional thought which is to typically maintain the exit portion of the furnace at a low temperature to avoid having to seal the furnace outlet at a high temperature. Such cooling of the exit portion of the furnace, however, significantly promotes thermophoretic losses. Furthermore, the potential for operating problems that could result in thermophoretic losses at the back end of the furnace are reduced with the very short residence times in the furnace for the present invention, as discussed previously.

Typically, it would be desirable to instantaneously cool the aerosol upon exiting the furnace. This is not possible. It is possible, however, to make the residence time between the furnace outlet and the cooling unit as short as possible. Furthermore, it is desirable to insulate the aerosol conduit occurring between the furnace exit and the cooling unit entrance. Even more preferred is to insulate that conduit and, even more preferably, to also heat that conduit so that the wall temperature of that conduit is at least as high as the average stream temperature of the aerosol stream. Furthermore, it is desirable that the cooling unit operate in a manner such that the aerosol is quickly cooled in a manner to prevent thermophoretic losses during cooling. The quench cooler, described previously, is very effective for cooling with low losses. Furthermore, to keep the potential for thermophoretic losses very low, it is preferred that the residence time of the aerosol stream between attaining the maximum stream temperature in the furnace and a point at which the aerosol has been cooled to an average stream temperature below about 200° C. is shorter than about 2 seconds, more preferably shorter than about 1 second, and even more preferably shorter than about 0.5 second and most preferably shorter than about 0.1 second. In most instances, the maximum average stream temperature attained in the furnace will be greater than about 800° C. Furthermore, the total residence time from the beginning of the heating zone in the furnace to a point at which the average stream temperature is at a temperature below about 200° C. should typically be shorter than about 5 seconds, preferably shorter than about 3 seconds, more preferably shorter than about 2 seconds, and most preferably shorter than about 1 second, Another part of the process with significant potential for thermophoretic losses is after particle cooling until the particles are finally collected. Proper particle collection is very important to reducing losses within the system. The potential for thermophoretic losses is significant following particle cooling because the aerosol stream is still at an elevated temperature to prevent detrimental condensation of water in the aerosol stream. Therefore, cooler surfaces of particle collection equipment can result in significant thermophoretic losses.

To reduce the potential for thermophoretic losses before the particles are finally collected, it is important that the transition between the cooling unit and particle collection be as short as possible. Preferably, the output from the quench cooler is immediately sent to a particle separator, such as a filter unit or a cyclone. In that regard, the total residence time of the aerosol between attaining the maximum average stream temperature in the furnace and the final collection of the particles is preferably shorter than about 2 seconds, more preferably shorter than about 1 second, still more preferably shorter than about 0.5 second and most preferably shorter than about 0.1 second. Furthermore, the residence time between the beginning of the heating zone in the furnace and final collection of the particles is preferably shorter than about 6 seconds, more preferably shorter than about 3 seconds, even more preferably shorter than about 2 seconds, and most preferably shorter than about 1 second. Furthermore, the potential for thermophoretic losses may further be reduced by insulating the conduit section between the cooling unit and the particle collector and, even more preferably, by also insulating around the filter, when a filter is used for particle collection. The potential for losses may be reduced even further by heating of the conduit section Us between the cooling unit and the particle collection equipment, so that the internal equipment surfaces are at least slightly warmer than the aerosol stream average stream temperature. Furthermore, when a filter is used for particle collection, the filter could be heated. For example, insulation could be wrapped around a filter unit, with electric heating inside of the insulating layer to maintain the walls of the filter unit at a desired elevated temperature higher than the temperature of filter elements in the filter unit, thereby reducing thermophoretic particle losses to walls of the filter unit.

Even with careful operation to reduce thermophoretic losses, some losses will still occur. For example, some particles will inevitably be lost to walls of particle collection equipment, such as the walls of a cyclone or filter housing. One way to reduce these losses, and correspondingly increase product yield, is to periodically wash the interior of the particle collection equipment to remove particles adhering to the sides. In most cases, the wash fluid will be water, unless water would have a detrimental effect on one of the components of the particles. For example, the particle collection equipment could include parallel collection paths. One path could be used for active particle collection while the other is being washed. The wash could include an automatic or manual flush without disconnecting the equipment. Alternatively, the equipment to be washed could be disconnected to permit access to the interior of the equipment for a thorough wash. As an alternative to having parallel collection paths, the process could simply be shut down occasionally to permit disconnection of the equipment for washing. The removed equipment could be replaced with a clean piece of equipment and the process could then be resumed while the disconnected equipment is being washed.

For example, a cyclone or filter unit could periodically be disconnected and particles adhering to interior walls could be removed by a water wash. The particles could then be dried in a low temperature dryer, typically at a temperature of lower than about 50° C.

In one embodiment, wash fluid used to wash particles from the interior walls of particle collection equipment includes a surfactant. Some of the surfactant will adhere to the surface of the particles. This could be advantageous to reduce agglomeration tendency of the particles and to enhance dispersibility of the particles in a thick film past formulation. The surfactant could be selected for compatibility with the specific paste formulation anticipated.

Another area for potential losses in the system, and for the occurrence of potential operating problems, is between the outlet of the aerosol generator and the inlet of the furnace. Losses here are not due to thermophoresis, but rather to liquid coming out of the aerosol and impinging and collecting on conduit and equipment surfaces. Although this loss is undesirable from a material yield standpoint, the loss may be even more detrimental to other aspects of the process. For example, water collecting on surfaces may release large droplets that can lead to large particles that detrimentally contaminate the particulate product. Furthermore, if accumulated liquid reaches the furnace, the liquid can cause excessive temperature gradients within the furnace tube, which can cause furnace tube failure, especially for ceramic tubes. One way to reduce the potential for undesirable liquid buildup in the system is to provide adequate drains, as previously described. In that regard, it is preferred that a drain be placed as close as possible to the furnace inlet to prevent liquid accumulations from reaching the furnace. The drain should be placed, however, far enough in advance of the furnace inlet such that the stream temperature is lower than about 80° C. at the drain location.

Another way to reduce the potential for undesirable liquid buildup is for the conduit between the aerosol generator outlet and the furnace inlet be of a substantially constant cross sectional area and configuration. Preferably, the conduit beginning with the aerosol generator outlet, passing through the furnace and continuing to at least the cooling unit inlet is of a substantially constant cross sectional area and geometry.

Another way to reduce the potential for undesirable buildup is to heat at least a portion, and preferably the entire length, of the conduit between the aerosol generator and the inlet to the furnace. For example, the conduit could be wrapped with a heating tape to maintain the inside walls of the conduit at a temperature higher than the temperature of the aerosol. The aerosol would then tend to concentrate toward the center of the conduit due to thermophoresis. Fewer aerosol droplets would, therefore, be likely to impinge on conduit walls or other surfaces making the transition to the furnace.

Figure 49:
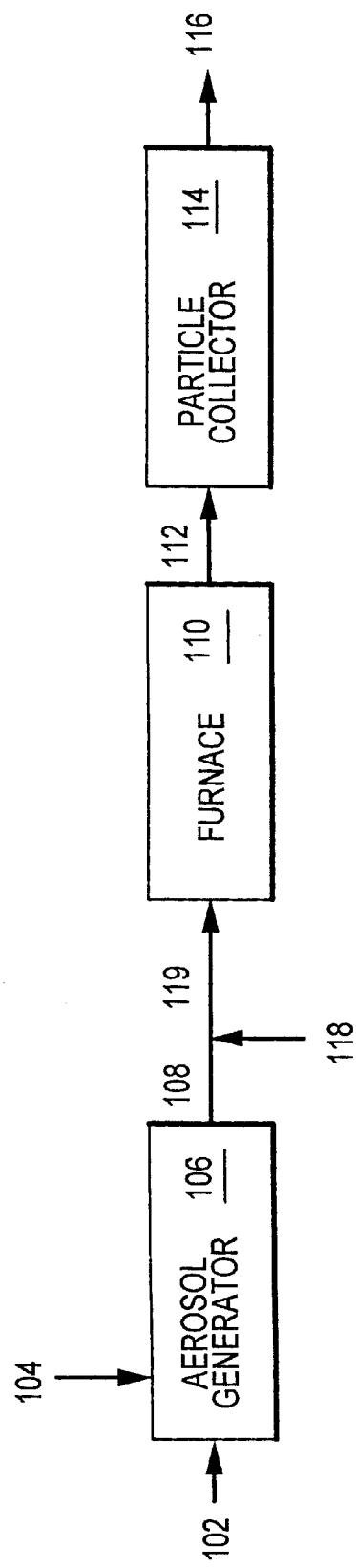
FIG. 49 is a block diagram of one embodiment of the process of the present invention including the addition of a dry gas between the aerosol generator and the furnace.

Another way to reduce the potential for undesirable liquid buildup is to introduce a dry gas into the aerosol between the aerosol generator and the furnace. Referring now to FIG. 49, one embodiment of the process is shown for adding a dry gas 118 to the aerosol 108 before the furnace 110. Addition of the dry gas 118 causes vaporization of at least a part of the moisture in the aerosol 108, and preferably substantially all of the moisture in the aerosol 108, to form a dried aerosol 119, which is then introduced into the furnace 110.

The dry gas 118 will most often be dry air, although in some instances it may be desirable to use dry nitrogen gas or some other dry gas. If sufficient a sufficient quantity of the dry gas 118 is used, the droplets of the aerosol 108 are substantially completely dried to beneficially form dried precursor particles in aerosol form for introduction into the furnace 110, where the precursor particles are then pyrolyzed to make a desired particulate product. Also, the use of the dry gas 118 typically will reduce the potential for contact between droplets of the aerosol and the conduit wall, especially in the critical area in the vicinity of the inlet to the furnace 110. In that regard, a preferred method for introducing the dry gas 118 into the aerosol 108 is from a radial direction into the aerosol 108. For example, equipment of substantially the same design as the quench cooler, described previously with reference to FIGS. 41–43, could be used, with the aerosol 108 flowing through the interior flow path of the apparatus and the dry gas 118 being introduced through perforated wall of the perforated conduit. An alternative to using the dry gas 118 to dry the aerosol 108 would be to use a low temperature thermal preheater/dryer prior to the furnace 110 to dry the aerosol 108 prior to introduction into the furnace 11G. This alternative is not, however, preferred.

Still another way to reduce the potential for losses due to liquid accumulation is to operate the process with equipment configurations such that the aerosol stream flows in a vertical direction from the aerosol generator to and through the furnace. For smaller-size particles, those smaller than about 1.5 $\mu$m, this vertical flow should, preferably, be vertically upward. For larger-size particles, such as those larger than about 1.5 $\mu$m, the vertical flow is preferably vertically downward.

Furthermore, with the process of the present invention, the potential for system losses is significantly reduced because the total system retention time from the outlet of the generator until collection of the particles is typically shorter than about 10 seconds, preferably shorter than about 7 seconds, more preferably shorter than about 5 seconds and most preferably shorter than about 3 seconds.

In accordance with the foregoing methodology for the production of sulfur-containing phosphors, the liquid feed includes the chemical components that will form the sulfur-containing phosphor particles, including the activator ions. The sulfur-containing phosphor precursor may be a substance in either a liquid or solid phase of the liquid feed. Typically, the sulfur-containing phosphor precursor will be a metal salt dissolved in a sulfur-containing acid. The sulfur-containing phosphor precursor may undergo one or more chemical reactions in the furnace to assist in production of the particles. Alternatively, the sulfur-containing phosphor precursor may contribute to the formation of the particles without undergoing chemical reaction. This could be the case, for example, when the liquid feed includes suspended particles as a precursor material. According to one embodiment of the present invention, the precursor undergoes conversion to an intermediate product, which is then treated to convert it into the sulfur-containing phosphor.

Metal sulfide phosphors (MS:M') can be prepared from an aqueous solution by the reaction of a metal compound such as a carbonate, oxide, hydroxide, sulfate or nitrate with a sulfur-containing acid such as thioacatic acid, thiocarboxylic acid (HS(O)CR) or dithiocarboxylic acid, to form a water soluble complex, such as $M(S(Os)CR)_2.xH_2O$ (where R is an alkyl group). The complex can also be formed from a soluble metal salt and sulfur-containing ligand such as thiourea. Similar precursors can be used for the activator ion. Preferably, at least about 2 equivalents of acid are added to ensure complete reaction with the metal compound. The solution, when pyrolyzed under $N_2$, leads to the metal sulfide.

$$MCO_3+2HS(O)CR-H_2O \rightarrow M(S(O)CR)_2.\ xH_2O+CO_2+H_2O$$

$$M(S(O)CR)_2.xH_2O+heat/N_2 \rightarrow MS+\text{volatile by-products}$$

$$MSO_4 \rightarrow MS+\text{volatile by-products}$$

$$M(NO_3)_2+SC(NR_2)_2 \rightarrow MS+\text{volatile by-products}$$

$$M(SCNR_2)_2 \rightarrow MS+\text{volatile by-products}$$

The solution preferably has a phosphor precursor concentration that is unsaturated to void the formation of precipitates and preferably includes sufficient precursor to yield from bout 1 to about 50 weight percent, such as from about 1 to 15 weight percent, of the phosphor compound, based on the total amount of metal(s) in solution. Preferably the solvent is aqueous-based for ease of operation, although other solvents, such as toluene, may be desirable for specific materials. The use of organic solvents can, however, lead to undesirable carbon contamination in the phosphor particles. The pH of the aqueous-based solutions can be adjusted to alter the solubility characteristics of the precursor in the solution.

In addition to the host material, the liquid feed preferably includes the precursor to the activator ion. For example, for the production of ZnS:Mn phosphor particles, the precursor solution preferably includes a zinc precursor such as zinc nitrate as well as manganese carbonate. The relative concentrations of the precursors can be easily adjusted to vary the concentration of the activator ion in the host material.

In addition to the foregoing, the liquid feed can also include other additives that contribute to the formation of the particles. For example, a fluxing agent can be added to the solution to increase the crystallinity and/or density of the particles. For example, the addition of urea to metal salt solutions, such as a metal nitrate, can increase the density of particles produced from the solution. In one embodiment, up to about 1 mole equivalent urea is added to the precursor solution, as measured against the moles of phosphor compound in the metal salt solution. Further, if the particles are to be coated phosphor particles, as is discussed in more detail below, a soluble precursor to both the sulfur-containing phosphor compound and the coating can be used in the precursor solution wherein the coating precursor is an involatile or volatile species.

For the production of sulfur-containing phosphor particles, the carrier gas may comprise any gaseous medium in which droplets produced from the liquid feed may be dispersed in aerosol form. Also, the carrier gas may be inert, in that the carrier gas does not participate in formation of the phosphor particles. Alternatively, the carrier gas may have one or more active component(s) that contribute to formation of the phosphor particles. In that regard, the carrier gas may include one or more reactive components that react in the furnace to contribute to formation of the phosphor particles. In many applications, air will be a satisfactory carrier gas. In other instances, a relatively inert gas such as nitrogen may be required. An inert gas would sometimes be useful, for example, when preparing particles comprising sulfide materials or other materials that are free of oxygen.

When the particles are modified by coating the particles, as is discussed above, the precursors to metal oxide coatings can be selected from volatile metal acetates, chlorides, alkoxides or halides. Such precursors are known to react at high temperatures to form the corresponding metal oxides and eliminate supporting ligands or ions. For example, $SiCl_4$ can be used as a precursor to SiO2 coatings when water vapor is present:

$$SiCl_{4(g)} + 2H_2O_{(g)} \rightarrow SiO_{2(s)} + 4HCl_{(g)}$$

$SiCl_4$ also is highly volatile and is a liquid at room temperature, which makes transport into the reactor more controllable. Aluminum trichiloride can be used as a volatile coating precursor in a similar manner.

Metal alkoxides can be used to produce metal oxide films by hydrolysis. The water molecules react with the alkoxide M—O bond resulting in clean elimination of the corresponding alcohol with the formation of M—O—M bonds:

$$Si(OEt)_4 + 2H_2O \rightarrow SiO_2 + 4EtOH$$

Most metal alkoxides have a reasonably high vapor pressure and are therefore well suited as coating precursors.

Metal acetates are also useful as coating precursors since they readily decompose upon thermal activation by acetic anhydride elimination:

$$Mg(O_2CCH_3)_2 \rightarrow MgO + CH_3C(O)OC(O)CH_3$$

Metal acetates are advantageous as coating precursors since they are water stable and are reasonably inexpensive.

Coatings can be generated on the particle surface by a number of different mechanisms. One or more precursors can vaporize and fuse to the hot phosphor particle surface and thermally react resulting in the formation of a thin-film coating by chemical vapor deposition (CVD). Preferred coatings deposited by CVD include metal oxides and elemental metals. Further, the coating can be formed by physical vapor deposition (PVD) wherein a coating material physically deposits an the surface of the particles. Preferred coatings deposited by PVD include organic materials and elemental metal. Alternatively, the gaseous precursor can react in the gas phase forming small particles, for example less than about 5 nanometers in size, which then diffuse to the larger particle surface and sinter onto the surface, thus forming a coating. This method is referred to as gas-to-particle conversion (GPC). Whether such coating reactions occur by CVD, PVD or GPC is dependent on the reactor conditions such as precursor partial pressure, water partial pressure and the concentration of particles in the gas stream. Another possible surface coating method is surface conversion of the surface of the particle by reaction with a vapor phase reactant to convert the surface of the particles to a different material than that originally contained in the particles.

In addition, a volatile coating material such as PbO, $MoO_3$ or $V_2O_5$ can be introduced into the reactor such that the coating deposits on the particle by condensation. Highly volatile metals, such as silver, can also be deposited by condensation. Further, the phosphor powders can be coated using other techniques. For example, a soluble precursor to both the phosphor powder and the coating can be used in the precursor solution wherein the coating precursor is involatile (e.g. $Al(NO_3)_3$) or volatile (e.g. $Sn(OAc)_4$ where Ac is acetate). In another method, a colloidal precursor and a soluble phosphor precursor can be used to form a particulate colloidal coating on the phosphor.

The structural modification that occurs in the particle modifier may be any modification to the crystalline structure or morphology of the particles. For example, the particles can be annealed in the particle modifier to densify the particles or to recrystallize the particles into a polycrystalline or single crystalline form. Also, especially in the case of composite particles, the particles may be annealed for a sufficient time to permit redistribution within the particles of different material phases or permit redistribution of the activator ion(s).

More specifically, while the sulfur-containing phosphor powders produced by the foregoing method have good crystallinity, it may be desirable to increase the crystallinity (average crystallite size) after production. Thus, the powders can be annealed (heated) for an amount of time and in a preselected environments to increase the crystallinity of the phosphor particles. Increased crystallinity can advantageously yield an increased brightness and efficiency of the phosphor particles. If such annealing steps are performed, the annealing temperature and time should be selected to minimize the amount of interparticle sintering that is often associated with annealing. According to one embodiment of the present invention, the sulfur-containing phosphor powder is preferably annealed at a temperature of from about 700° C. to about 1100° C., more preferably from about 800° C. to about 1000° C. The annealing time is preferably not more than about 2 hours and can be as low as about 1 minute. The sulfur-containing powders are typically annealed in an inert gas, such as argon.

Further, the crystallinity of the phosphors can be increased by using a fluxing agent, either in the precursor solution or in a post-formation annealing step. A fluxing agent is a reagent which improves the crystallinity of the material when the reagent and the material are heated together, as compared to heating the material to the same temperature and for the same amount of time in the absence of the fluxing agent. The fluxing agents typically cause a eutectic to form which leads to a liquid phase at the grain boundaries, increasing the diffusion coefficient. The fluxing agent, for example alkali metal halides such as NaCl or KCl or an organic compound such as urea ($CO(NH_2)_2$), can be added to the precursor solution where it improves the crystallinity of the particles during their subsequent formation. Alternatively, the fluxing agent can be contacted with the phosphor powder batches after they have been collected. Upon annealing, the fluxing agent improves the crystallinity and/or density of the phosphor powder, and therefore improves other properties such as the brightness of the phosphor powder. Also, in the case of composite particles 112, the particles may be annealed for a sufficient time to permit redistribution within the particles 112 of different material phases.

Thus, the present invention is particularly applicable to sulfur-containing phosphor compounds. Phosphors are materials which are capable of emitting radiation in the visible or ultraviolet spectral range upon excitation, such as excitation by an external electric field or other external energy source. Sulfur-containing phosphors are a particular class of phosphor compounds that have a host material that includes sulfur. More particularly, such sulfur-containing phosphors according to the present invention include metal sulfides, oxysulfides and thiogallates. The sulfur-containing phosphor particles of the present invention can be chemically tailored to emit specific wavelengths of visible light, such as red, blue or green light and by dispersing different phosphor powders in a predetermined arrangement and controllably exciting the powders, a full-color visual display can be produced.

Sulfur-containing phosphors include a matrix compound, referred to as a host material, and the phosphor further includes one or more dopants, referred to as activator ions, to emit a specific color or to enhance the luminescence characteristics. Some phosphors, such as up-convertor phosphors, incorporate more than one activator ion.

Phosphors can be classified by their phosphorescent properties and the present invention is applicable to all types of these phosphors. For example, electroluminescent phosphors are phosphors that emit light upon stimulation by an electric field. These phosphors are used for thin-film and thick-film electroluminescent displays, back lighting for LCD's and electroluminescent lamps used in wrist watches and the like. Cathodoluminescent phosphors emit light upon stimulation by electron bombardment. These phosphors are utilized in CRT's (e.g. common televisions) and FED's.

Photoluminescent phosphors emit light upon stimulation by other light. The stimulating light usually has higher energy than the emitted light. For example, a photoluminescent phosphor can emit visible light when stimulated by ultraviolet light. These phosphors are utilized in plasma display panels and common fluorescent lamps.

Up-converter phosphors also emit light upon stimulation by other light, but usually light of a lower energy than the emitted light. For example, infrared light can be used to stimulate an up-converter phosphor which then emits visible or ultraviolet light. Up-convertor phosphors typically include at least 2 activator ions which convert the lower energy infrared light. These phosphor materials are useful in immunoassay and security applications. Similarly, x-ray phosphors are utilized to convert x-rays to visible light and are useful in medical diagnostics.

The sulfur-containing host material can be doped with an activator ion in an amount which is sufficient for a particular application. Preferably, the activator ion is incorporated in an amount of from about 0.02 to about 15 atomic percent, more preferably from about 0.02 to about 10 atomic percent and even more preferably from about 0.02 to about 5 atomic percent. It will be appreciated, as is discussed in more detail below, that the preferred A concentration of the activator ion(s) in the host material can vary for different applications.

One advantage of the present invention is that the activator ion is homogeneously distributed throughout the host material. Phosphor powders prepared by solid-state methods do not give uniform concentration of the activator ion in small particles and solution routes also do not give homogenous distribution of the activator ion due to different rates of precipitation.

Particular sulfur-containing phosphor compounds may be most useful for certain applications and no single compound is necessarily preferred for all possible applications. However, preferred sulfur-containing phosphor host materials for some display applications include the metal sulfides, particularly the Group 2 metal sulfides (e.g. CaS, SrS, BaS and MgS) and the Group 12 metal sulfides (e.g. ZnS and CdS). For such metal sulfides, preferred activator ions can be selected from the rare-earth elements (e.g. La, Ce, Pm, Eu, Gd, Tb, and Yb), preferably Eu or Tb, particularly for Group 2 metal sulfides. The acivator ion can also be selected from Cu, Mn, Ag, Al, Au, Ga and Cl. Mixtures of these activator ions can advantageously be used, particularly for up-convertor phosphors.

ZnS is particularly preferred for many cathodoluminescent display applications, particularly those utilizing high voltages (i.e. greater than about 2000 volts), due primarily to the high brightness of ZnS. ZnS is typically doped with Cu, Ag, Al, Au, Cl or mixtures thereof. For example, ZnS:Ag is a common cathodoluminescent phosphor used to produce blue light in a CRT device.

Many of the foregoing metal sulfide phosphors cannot easily be produced using conventional techniques. Examples include CaS:Eu (red), SrS:Eu (orange), BaS:Ce (yellow), BaS:Tb (yellow), BaS:Mn (yellow-green), CaS:Tb (green-yellow), CaS:Ce (green) and SrS:Ce (blue-green). The methodology of the present invention advantageously permits such phosphor compounds to be produced with sufficient luminescent properties to be utilized in commercial devices.

In addition, the present invention provides the unique ability to produce mixed-metal sulfides of the general form $(M^1,M^2)S$, wherein $M^1$ and $M^2$ are Group 2 metals (e.g. (Mg,Sr)S or (Ca,Sr)S) or wherein $M^1$ and $M^2$ are Group 12 metals (e.g. (Zn,Cd)S). Complex mixed metal sulfides, for example (Ba,Sr,Ca)S can also be produced. This unique feature of the present invention enables the formation of phosphors having luminescence characteristics that are selectively controllable. For example, any color from orange to red can be selected by varying the ratio of Ca to Sr in the mixed metal sulfide (Ca,Sr)S:Eu. Likewise, any color from green to yellow can be selected by varying the ratio of Ca to Ba in the mixed metal sulfide (Ca,Ba)S,Ce and any color from blue-green to green can be selected by varying the ratio of Ca to Sr In the mixed metal sulfide (Ca,Sr)S:Ce.

Other sulfur-containing phosphor compounds that can be produced according to the present invention include thiogallates of the form $M^3Ga_2S_4$ wherein $M^3$ can be Ca, Sr, Ba, Mg or mixtures thereof. Such compounds are typically doped with Cu,Ga a rare-earth as an activator ion. Preferred examples include $SrGa_2S_4$:Eu (green), $SrGa_2S_4$:Ce (blue), $CaGa_2S_4$:Eu and $CaGa_2S_4$:Ce (blue-green). As with the mixed-metal sulfides, mixed metal thiogallates can be produced, such as $(Ca,Sr)Ga_2S_4$. Further, thiogallates include compounds wherein aluminum or indium substitute for gallium in the structure, such as $Ca(Al,Ga)_2S_4$. $Ca(In,Ga)_2S_4$, $Sr(A),Ga)_2S_4$ or $Sr(InGa)_2S_4$. The substitution of various amounts of aluminum or indium for gallium can advantageously adjust the chromaticity (color) of the phosphor compound.

In addition, oxysulfides, particularly $Y_2O_2S$:Eu and rare-earth oxysulfides such as $Gd_2O_2S$:Tb and $La_2O_2S$:Tb can also be produced In accordance with the present invention. Such oxysulfides can be doped with from about 0.02 to about 15 atomic percent of an activator ion selected from the group consisting of rare-earth elements, Cu, Mn, Ag, Al, Au, Cl, Ga and mixtures thereof. Some preferred sulfur-containing phosphor host materials and activator ions are listed In Table I.

TABLE I

Examples of Sulfur-Containing Phosphors

| Host Material | Activator Ion | Color |
| --- | --- | --- |
| BaS | Ce | Yellow |
| CaS | Ce | Green |
| CaS | Mn | Yellow |
| SrS | Ce | Blue-Green |
| (Mg,Sr)S | Ce | Blue-Green |
| ZnS | Cu | Blue-Green |
| $Y_2O_2S$ | Eu | Red |
| $SrGa_2S_4$ | Eu | Green |
| $SrGa_2S_4$ | Ce | Blue |

The thiogallate phosphor compounds according to the present invention include, but are not limited to, thiogallates such as $CaGa_2S_4$:Eu or Ce and $SrGa_2S_4$:Eu or Ce. Such thiogallate phosphors are useful in many applications, but are not believed to be widely available with sufficient luminescent properties for commercial applications due to the difficulty producing such compounds. The reaction of strontium nitrate and gallium nitrate, when carried out in the solid state, does not result in the formation of single phase $SrGa_2S_4$ because strontium nitrate melts and segregates from the gallium nitrate. Thiogallates are difficult to produce even using a standard spray pyrolysis technique since organic solvents are required, which can lead to powders having increased carbon contamination.

The thiogallate phosphor compounds according to the present invention are preferably produced using a process referred to herein as spray-conversion. Spray-conversion is a process wherein a spray pyrolysis technique, as is described in detail previously, is used to produce an intermediate product, such as an oxide, that is capable of being subsequently converted to the thiogallate. The intermediate product advantageously has many of the desirable morphological and chemical properties discussed hereinbelow, such as a small particle size and high purity.

For the production of thiogallates, water-soluble precursor materials, such as nitrate salts, are placed into solution and are converted at a low temperature, such as from about 700° C. to 800° C., to a crystalline phase, such as the oxide phase $MGa_2O_4$ (where M can be, for example, Sr or Ca). The oxide phase is in the form of small particles having a narrow size distribution, as is described in more detail below. The intermediate product is then converted by heating in the presence of sulfur or a sulfur-containing compound, liquid or gas. For example, the powder can be admixed with sulfur or contacted with $CS_2$ liquid. In a preferred embodiment, $H_2S$ gas at an elevated temperature is contacted with the intermediate product powder to form a substantially phase pure thiogallate having high crystallinity. The resulting powder can be gently milled to remove any soft agglomerates that result from the heating process. The powder can also be annealed under an inert gas to increase the crystallinity of the powders, possibly in the presence of a fluxing agent.

The resulting end product is a thiogallate powder having the desirable morphological and luminescent properties. The average particle size and morphological characteristics are primarily determined by the characteristics of the intermediate product.

Although discussed herein with reference to thiogallates, it will be appreciated that other sulfur-containing phosphors, including ZnS, CdS, SrS or CaS, could be produced using a similar spray-conversion process. Thus, the precursors, such as nitrate salts, can be spray-converted at a temperature of, for example, 700° C. to 800° C. to form oxides or sulfides having low crystallinity. The intermediate product can then be roasted under $H_2S$ gas at a temperature of for example, 800° C. to 1100° C., to form the metal sulfide phosphor compounds or thiogallate compounds. The phosphor particles can be further annealed to increase crystallinity of the particles and can be lightly milled to remove agglomerates.

The powder characteristics that are preferred will depend upon the application of the sulfur-containing phosphor powders. Nonetheless, it can be generally stated that the powders typically should have a small average particle size, narrow size distribution, spherical morphology, high density and low porosity, high crystallinity and a homogenous distribution of activator ion throughout the host material. The efficiency of the phosphor, defined as the overall conversion of excitation energy to visible photons, should be high.

According to the present invention, the sulfur-containing phosphor powder consists of particles having a small average particle size. Although the preferred average size of the phosphor particles will vary according to the application of the phosphor powder, the average particle size of the phosphor particles is preferably not greater than about 10 μm. For most applications, the average particle size is more preferably not greater than about 5 μm, such as from about 0.1 μm to about 5 μm and more preferably is not greater than about 3 μm, such as from about 0.3 μm to about 3 μm. As used herein, the average particle size is the weight average particle size.

According to the present invention, the powder batch of phosphor particles also has a narrow particle size distribution, such that the majority of particles are substantially the same size. Preferably, at least about 90 weight percent of the particles and more preferably at least about 95 weight percent of the particles are not larger than twice the average particle size. Thus, when the average particle size is about 2 μm, it is preferred that at least about 90 weight percent of the particles are not larger than 4 μm and it is more preferred that at least about 95 weight percent of the particles are not larger than 4 μm. Further, it is preferred that at least about 90 weight percent of the particles, and more preferably at least about 95 weight percent of the particles, are not larger than about 1.5 times the average particle size. Thus, when the average particle size is about 2 μm, it is preferred that at least about 90 weight percent of the particles are not larger than about 3 μm and it is more preferred that at least about 95 weight percent of the particles are not larger than about 3 μm.

The phosphor particles of the present invention can be substantially single crystal particles or may be comprised of a number of crystallites. According to the present invention, the phosphor particles are highly crystalline and it is preferred that the average crystallite size approaches the average particle size such that the particles are mostly single crystals or are composed of only a few large crystals. The average crystallite size of the particles is preferably at least about 25 nanometers, more preferably is at least about 40 nanometers, even more preferably is at least about 60 nanometers and most preferably is at least about 80 nanometers. In one embodiment, the average crystallite size is at least about 100 nanometers. As it relates to particle size, the average crystallite size is preferably at least about 20 percent, more preferably at least about 30 percent and most preferably is at least about 40 percent of the average particle size. Such highly crystalline phosphors are believed to have increased luminescent efficiency and brightness as compared to phosphors having smaller crystallites.

The sulfur-containing phosphor particles of the present invention advantageously have a high degree of purity, that is, a low level of impurities. Impurities are materials that are not intended in the final product. Thus, an activator ion is not considered to be an impurity. The level of impurities in the phosphor powders of the present invention is preferably not greater than about 1 atomic percent and is more preferably not greater than about 0.1 atomic percent and even more preferably is not greater than about 0.01 atomic percent.

The sulfur-containing phosphor particles of the present invention are preferably very dense (not porous), as measured by helium pychnometry. Preferably, the particles have a particle density of at least about 80 percent of the theoretical density for the host material, is more preferably at least about 90 percent of the theoretical density for the host material and even more preferably at least about 95 percent of the theoretical density for the host material.

The sulfur-containing phosphor particles of the present invention are also substantially spherical in shape. That is, the particles are not jagged or irregular in shape. Spherical particles are particularly advantageous because they are able to disperse and coat a device, such as a display panel, more uniformly with a reduced average thickness. Although the particles are substantially spherical, the particles may become faceted as the crystallite size increases and approaches the average particle size.

In addition, the sulfur-containing phosphor particles according to the present invention advantageously have a low surface area. The particles are substantially spherical, which reduces the total surface area for a given mass of powder. Further, the elimination of larger particles from the powder batches eliminates the porosity that is associated with open pores on the surface of such larger particles. Due to the elimination of the large particles, the powder advantageously has a lower surface area. Surface area is typically measured using a BET nitrogen adsorption method which is indicative of the surface area of the powder, including the surface area of accessible surface pores on the surface of the powder. For a given particle size distribution, a lower value of a surface area per unit mass of powder indicates solid or non-porous particles. Decreased surface area reduces the susceptibility of the phosphor powders to adverse surface reactions, such as degradation from moisture. This characteristic can advantageously extend the useful life of the phosphor powders.

The surfaces of the sulfur-containing phosphor particles according to the present invention are typically smooth and clean with a minimal deposition of contaminants on the particle surface. For example, the outer surfaces are not contaminated with surfactants, as is often the case with particles produced by liquid precipitation routes.

In addition, the powder batches of sulfur-containing phosphor particles according to the present invention are substantially unagglomerated, that is, they include substantially no hard agglomerates or particles. Hard agglomerates are physically coalesced lumps of two or more particles that behave as one large particle. Agglomerates are disadvantageous in most applications of phosphor powders. It is preferred that no more than about 1 weight percent of the phosphor particles in the powder batch of the present invention are in the form of hard agglomerates. More preferably, no more than about 0.5 weight percent of the particles are in the form of hard agglomerates and even more preferably no more than about 0.1 weight percent of the particles are in the form of hard agglomerates.

According to one embodiment of the present invention, the sulfur-containing phosphor particles are composite phosphor particles, wherein the individual particles include at least one phosphor phase and at least a second phase associated with the phosphor phase. The second phase can be a different phosphor compound or can be a non-phosphor compound, such as a metal oxide. Such composites can advantageously permit the use of phosphor compounds in devices that would otherwise be unusable. Further, combinations of different phosphor compounds within one particle can produce emission of a selected color. For example, one composite phosphor particle of the present invention includes a host matrix of ZnS:Mn with regions of SrS:Ce dispersed throughout the host matrix. The emission of the two phosphor compounds would combine to approximate white light. Further, in cathodoluminescent applications, the matrix material can accelerate the impingent electrons to enhance the luminescence.

According to another embodiment of the present invention, the sulfur-containing phosphor particles are surface modified or coated phosphor particles that include a particulate coating (FIG. 47d) for non-particulate (film) coating (FIG. 47a) that substantially encapsulates an outer surface of the particles. The coating can be a metal, a non-metallic compound or an organic compound.

Coatings are often desirable to reduce degradation of the sulfur-containing phosphor compound due to moisture or high density electron bombardment in cathodoluminescent devices. For example, metal sulfides such as ZnS are particularly susceptible to degradation due to moisture and should be completely encapsulated to reduce or eliminate the degradation reaction. Other phosphors are known to degrade in an electron beam operating at a high current density, such as in FED's. The thin, uniform coatings according to the present invention will advantageously permit use of the phosphor powders under low voltage, high current conditions. Coatings also create a diffusion barrier such that activator ions (e.g. Cu and Mn) cannot transfer from one particle to another, thereby altering the luminescence characteristics. Coatings can also control the surface energy levels of the particles.

The coating can be a metal, metal oxide or other inorganic compound such as a metal sulfide or oxysulfide, or can be an organic compound, For example, a metal oxide coating can advantageously be used, such as a metal oxide selected from the group consisting of $SiO_2$, $MgO$, $Al_2O_3$, $ZnO$, $SnO_2$, $SnO$, $ZrO_2$, $B_2O_3$, $Bi_2O_3$, $TiO_2$, $CuO$, $CU_2O$ $In_2O_3$ or $(In,Sn)O_2$. Particularly preferred are $SiO_2$ and $Al_2O_3$ coatings. Semiconductive oxide coatings such as $SnO_2$ or $In_2O_3$ can be advantageous In some applications due to the ability of the coating to absorb secondary electrons that are emitted by the phosphor. Metal coatings, such as copper, can be useful for phosphor particles used in direct current electroluminescent applications, discussed hereinbelow. In addition, phosphate coatings, such as zirconium phosphate or aluminum phosphate, can also be advantageous for use in some applications.

The coatings should be relatively thin and uniform. The coating should encapsulate the entire particle, but be sufficiently thin such that the coating doesn't interfere with light transmission. Preferably, the coating has an average thickness of not greater than about 200 nanometers, more preferably not greater than about 100 nanometers, and even more preferably not greater than about 50 nanometers. The coating preferably completely encapsulates the phosphor particle and therefore should have an average thickness of at least about 2 nanometers, more preferably at least about 5 nanometers. In one embodiment, the coating has a thickness of from about 2 to 50 nanometers, such as from about 2 to 10 nanometers. Further, the particles can include more than one coating substantially encapsulating the particles to achieve the desired properties.

The coating, either particulate or non-particulate, can also include a pigment or other material that alters the light characteristics of the phosphor. Red pigments can include compounds such as the iron oxides ($Fe_2O_3$), cadmium sulfide compounds (CdS) or mercury sulfide compounds (HgS). Green or blue pigments include cobalt oxide (CoO), cobalt aluminate ($CoAl_2O_4$) or zinc oxide (ZnO). Pigment coatings are capable of absorbing selected wavelengths of light leaving the phosphor, thereby acting as a filter to improve the color contrast and purity, particularly in CRT devices.

In addition, the phosphor particles can be coated with an organic compound such as PMMA (polymethylmethacrylate), polystyrene or similar organic compounds, including surfactants that aid in the dispersion and/or suspension of the particles in a flowable medium. The organic coating is preferably not greater than about 100 nanometers thick and is substantially dense and continuous about particle. The organic coatings can advantageously prevent corrosion of the phosphor particles, especially in electroluminescent lamps, and also can improve the dispersion characteristics of the particles in a paste or other flowable medium.

The coating can also be comprised of one or more monolayer coatings, such as from about 1 to 3 monolayer coatings. A monolayer coating is formed by the reaction of an organic or an inorganic molecule with the surface of the phosphor particles to form a coating layer that is essentially one molecular layer thick. In particular, the formation of a monolayer coating by reaction of the surface of the phosphor powder with a functionalized organo silane such as halo- or amino-silanes, for example hexamethyldisilazane or trimethylsilylchloride, can be used to modify and control the hydrophilicity -and hydrophilicity of the phosphor powders. Such coatings allow for greater control over the dispersion characteristics of the phosphor powder in a wide variety of paste compositions and other flowable mediums.

The monolayer coatings may also be applied to phosphor powders that have already been coated with an organic or inorganic coating, thus providing better control over the corrosion characteristics (through the thicker coating) as well as dispersibility (through the monolayer coating) of the phosphor powder.

As a direct result of the foregoing powder characteristics, the sulfur-containing phosphor powders of the present invention have many unique and advantageous properties that are not found in phosphor powders known heretofore.

The sulfur-containing phosphor, powders of the present invention have a high efficiency, sometimes referred to as quantum efficiency. Efficiency is the overall conversion rate of excitation energy (electrons or photons) to visible photons emitted. According to one embodiment of the present invention, the efficiency of the phosphor powder is at least about 90%. The near perfect efficiency of the phosphor powders according to the present invention is believed to be due to the high crystallinity and homogenous distribution of activator ion in the host material.

The phosphor powders also have well-controlled color characteristics, sometimes referred to as emission spectrum characteristics or chromaticity. This important property is due to the ability to precisely control the composition of the host material, the homogeneous distribution of the activator ion and the high purity of the powders. For example, the ability to form mixed metal sulfides of varying compositions enables the characteristic wavelength of emission to be controllably shifted to obtain different colors.

The phosphor powders also have improved decay time, also referred to as persistence. Persistence is referred to as the amount of time for the light emission to decay to 10% of its brightness. Phosphors with long decay times can result in blurred images when the image moves across the display. The improved decay time of the phosphor powders of the present invention is believed to be due to the homogenous distribution of activator ion in the host material.

The phosphor powders also have an improved brightness over prior art phosphor powders. That is, under a given application of energy, the phosphor powders of the present invention produce more light.

Thus, the sulfur-containing phosphor powders of the present invention have a unique combination of unique properties that are not found in conventional phosphor powders . The powders can advantageously be used to form a number of intermediate products, for example pastes or slurries, and can be incorporated into a number of devices, wherein the devices will have significantly improved performance resulting directly from the characteristics of the phosphor powders of the present invention. The devices can include light-emitting lamps and display devices for visually conveying information and graphics. Such display devices include traditional CRT-based display devices, such as televisions, and also include flat panel displays. Flat panel displays are relatively thin devices that present graphics and images without the use of a traditional picture tube and operate with modest power requirements. Generally, flat panel displays include a phosphor powder selectively dispersed on a viewing panel, wherein the excitation source lies behind and in close proximity to the panel. Flat panel displays include liquid crystal displays (LCD), plasma display panels (PDP's) electroluminescent (EL) displays, and field emission displays (FED'S).

CRT devices, utilizing a cathode ray tube, include traditional display devices such as televisions and computer monitors. CRT's operate by selectively firing electrons from one or more cathode ray tubes at cathodoluminescent phosphor particles which are located in predetermined regions (pixels) of a display screen. The cathode ray tube is located at a distance from the display screen which increases as screen size increases. By selectively directing the electron beam at certain pixels, a full color display with high resolution can be achieved.

Figure 51:
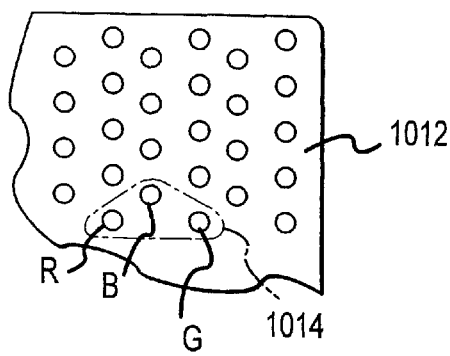
FIG. 51 illustrates a schematic representation of pixels on a viewing screen of a CRT device according to an embodiment of the present invention.
Figure 50:
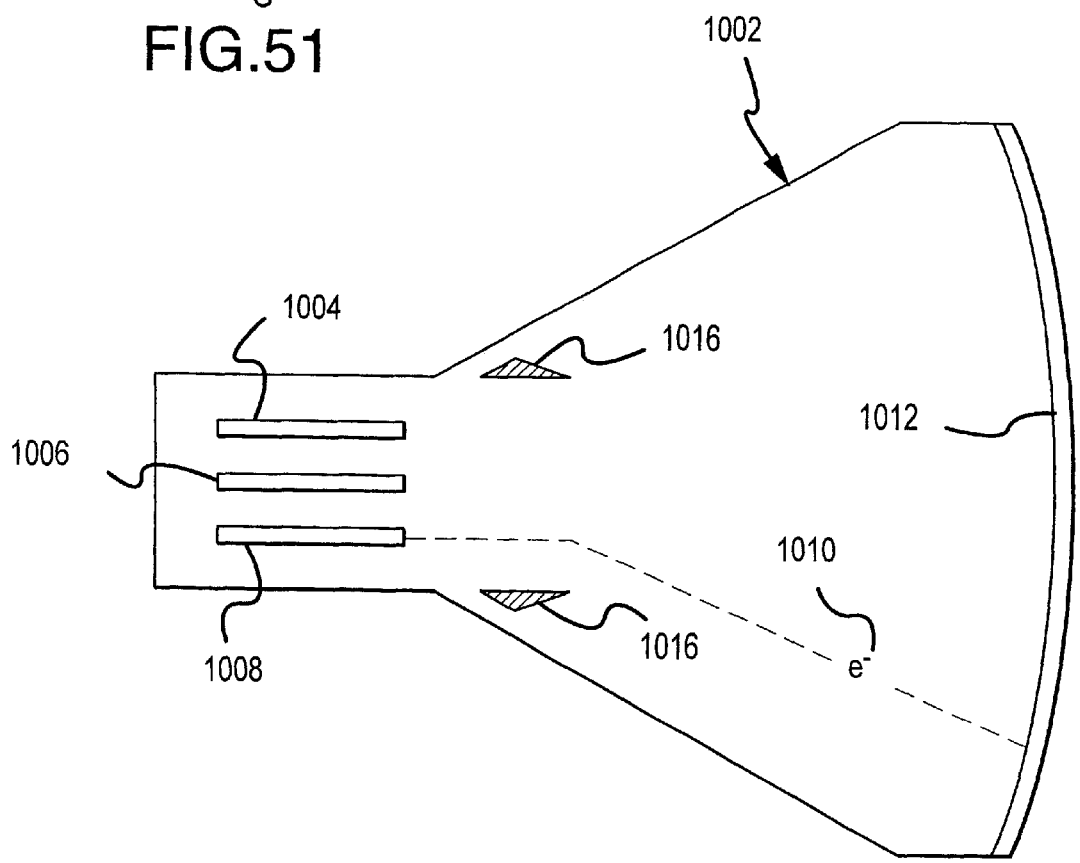
FIG. 50 illustrates a schematic view of a CRT device according to an embodiment of the present invention.

A CRT display device is illustrated schematically in FIG. 50. The device 1002 includes 3 cathode ray tubes 1004, 1006 and 1008 located in the rear portion of the device. The cathode ray tubes generate electrons, such as electron 1010. An applied voltage of 20 to 30 kV accelerates the electrons toward the display screen 1012. In a color CRT, the display screen is patterned with red (R), green (G) and blue (B) phosphors, as is illustrated in FIG. 51. Three colored phosphor pixels are grouped in close proximity, such as group 1014, to produce multicolor images. Graphic output is created be selectively directing the electrons at the pixels on the display screen 1012 using, for example, electromagnets 1016. The electron beams are rastered in a left to right, top to bottom fashion to create a moving image. The electrons can also be filtered through an apertured metal mask to block electrons that are directed at the wrong phosphor.

The phosphor powder is typically applied to the CRT display screen using a slurry. The slurry is formed by suspending the phosphor particles in an aqueous solution which can also include additives such as PVA (polyvinyl alcohol) and other organic compounds to aid in the dispersion of the particles in the solution as well as other compounds such as metal chromates. The display screen is placed in a coating machine, such as a spin coater, and the slurry is deposited onto the inner surface of the display screen and spread over the entire surface. The display screen is spun to thoroughly coat the surface and spin away any excess slurry. The slurry on the screen is then dried and exposed through a shadow mask having a predetermined dot-like or stripe-like pattern. The exposed film is developed and excess phosphor particles are washed away to form a phosphor screen having a predetermined pixel pattern. The process can be performed in sequence for different color phosphors to enable a full color display to be produced.

It is generally desired that the pixels are formed with a highly uniform phosphor powder layer thickness. The phosphors should not peel from the display screen and no cross contamination of the colored phosphors should occur. These characteristics are significantly influenced by the morphology, size and surface condition of the phosphor particles.

CRT devices typically employ phosphor particles rather than thin-film phosphors due to the high luminescence requirements. The resolution of images on powdered phosphor screens can be improved if the screen is made with particles having a small size and uniform size distribution, such as the phosphor particles according to the present invention. Image quality on the CRT device is also influenced by the packing voids of the particles and the number of layers of phosphor particles which are not involved in the generation of cathodoluminescence. That is, particles which are not excited by the electron beam will only inhibit the transmission of luminescence through the device. Large particles and aggregated particles both form voids and further contribute to loss of light transmission. Significant amounts of light can be scattered by reflection in voids. Further, for a high quality image, the phosphor layer should have a thin and highly uniform thickness. Ideally, the average thickness of the phosphor layer should be about 1.5 times the average particle size of the phosphor particles.

CRT's typically operate at high voltages such as from about 20 kV to 30 kV. Phosphors used for CRT's should have high brightness and good chromaticity. Sulfur-containing phosphors which are particularly useful in CRT devices include ZnS:Cu or Al for green, ZnS:Ag, Au or Cl for blue and $Y_2O_2S$:Eu for red. Other sulfur-containing phosphors, such as CdS:Ag, Au or Cl, can be used in CRT devices as well. Mixed metal sulfides such as $Zn_xCd_{1-x}S$:Ag or Cu can also be advantageous. The phosphor particles can advantageously be coated in accordance with the present invention to prevent degradation of the host material or diffusion of activator ions. Silica or silicate coatings can also improve the rheological properties of the phosphor slurry. The particles can also include a pigment coating, such as particulate $Fe_2O_3$, to modify and enhance the properties of the emitted light.

The introduction of high-definition televisions (HDTV) has increased the interest in projection television (PmV). In this concept, the light produced by three independent cathode ray tubes is projected onto a faceplate on the tube that includes particulate phosphors, to form 3 colored projection images. The three images are projected onto a display screen by reflection to produce a full color image. Because of the large magnification used in imaging, the phosphors on the faceplate of the cathode ray tube must be excited with an intense and small electron spot. Maximum excitation density may be two orders of magnitude larger than with conventional cathode ray tubes. Typically, the efficiency of the phosphor decreases with increasing excitation density. For the foregoing reasons, the powders of the present invention would be particularly useful in HDTV applications.

One of the problems with CRT-based devices is that they are large and bulky and have significant depth as compared to the screen size. Therefore, there is significant interest in developing flat panel displays to replace CRT-based devices in many applications.

Flat panel displays (FPD's) offer many advantages over CRT's including lighter weight, portability and decreased power requirements. Flat panel displays can be either monochrome or color displays. It is believed that flat panel displays will eventually replace the bulky CRT devices, such as televisions, with a thin product that can be hung on a wall, like a picture. Currently, flat panel displays can be made thinner, lighter and with lower power consumption than CRT devices, but not with the visual quality and cost performance of a CRT device.

The high electron voltages and small currents traditionally required to activate phosphors efficiently in a CRT device have hindered the development of flat panel displays. Phosphors for flat panel displays such as field emission displays must typically operate at a lower voltage, higher current density and higher efficiency than phosphors used in existing CRT devices. The low voltages used in such displays result in an electron penetration depth in the range of several micrometers down to tens of nanometers, depending on the applied voltage. Thus, the control of the size and crystallinity of the phosphor particles is critical to device performance. If large or agglomerated powders are used, only a small fraction of the electrons will interact with the phosphor. Use of phosphor powders having a wide size distribution can also lead to non-uniform pixels and sub-pixels, which will produce a blurred image.

One type of FPD is a plasma display panel (PDP). Plasma displays have image quality that is comparable to current CRT devices and can be easily scaled to large sizes such as 20 to 60 diagonal inches. The displays are bright and lightweight and have a thickness of from about 1.5 to 3 inches. A plasma display functions in a similar manner as fluorescent lighting. In a plasma display, a plasma source, typically a gas mixture, is placed between an opposed array of addressable electrodes and a high energy electric field is generated between the electrodes. Upon reaching a critical voltage, a plasma is formed from the gas and UV photons are emitted by the plasma. Color plasma displays contain three-color photoluminescent phosphor particles deposited on the inside of the glass faceplate. The phosphors selectively emit light when illuminated by the photons. Plasma displays operate at relatively low currents and can be driven either by an AC or DC signal. AC plasma systems use a dielectric layer over the electrode, which forms a capacitor. This impedance limits current and provides a necessary charge in the gas mixture.

Figure 52:
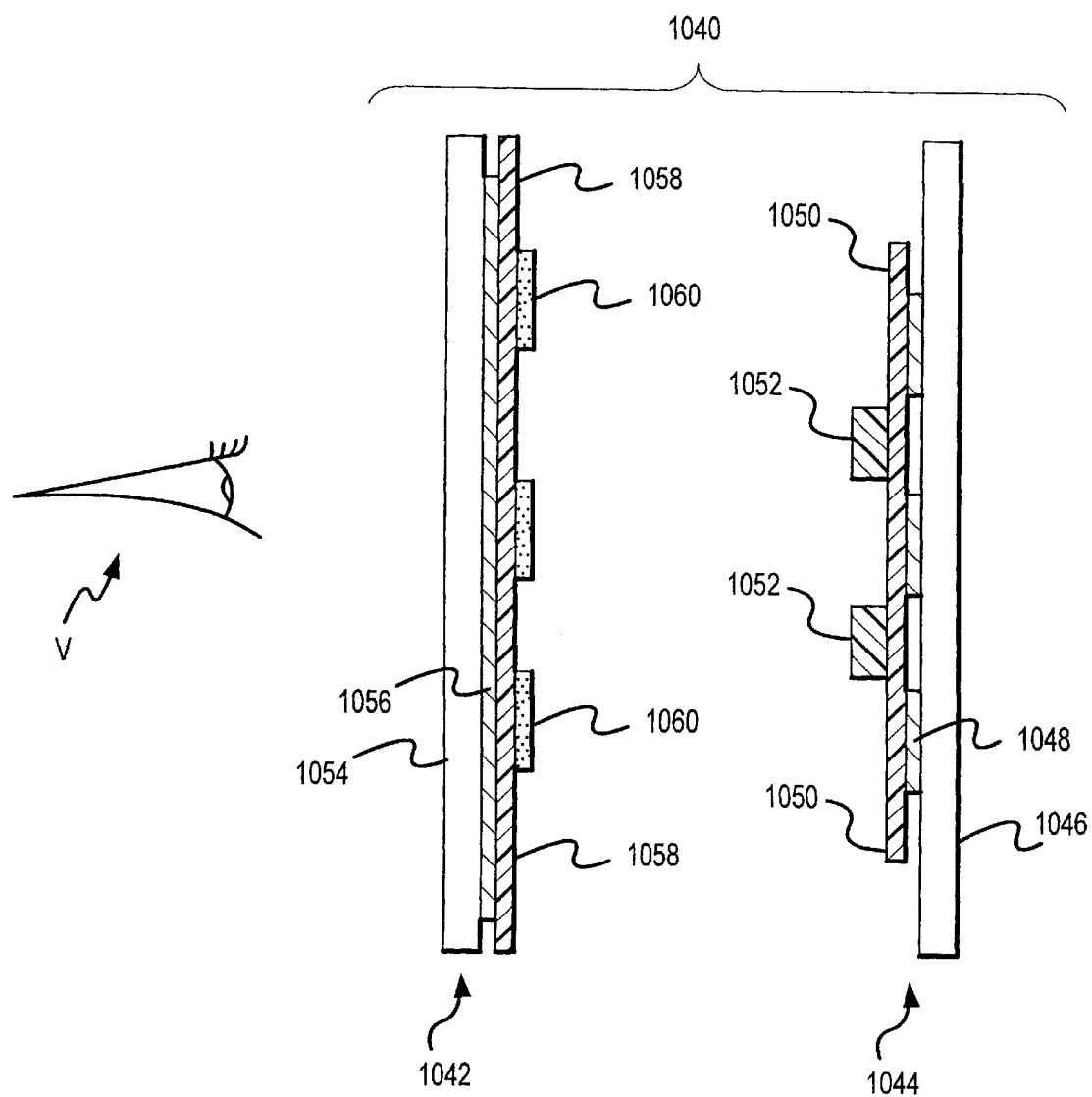
FIG. 52 schematically illustrates a plasma display panel according to an embodiment of the present invention.

A cross-section of a plasma display device is illustrated in FIG. 52. The plasma display 1040 comprises two opposed panels 1042 and 1044 in parallel opposed relation. A working gas is disposed and sealed between the two opposing panels 1042 and 1044. The rear panel 1044 includes a backing plate 1046 on which are printed a plurality of electrodes 1048 (cathodes) which are in parallel spaced relation. An insulator 1050 covers the electrodes and spacers 1052 are utilized to separate the rear panel 1044 from the front panel 1042.

The front panel 1042 includes a glass face plate 1054 which is transparent when observed by the viewer (V). Printed onto the rear surface of the glass face plate 1054 are a plurality of electrodes 1056 (anodes) in parallel spaced relation. An insulator 1058 separates the electrode from the pixels of phosphor powder 1060. The phosphor powder 1060 is typically applied using a thick film paste. When the display 1040 is assembled, the electrodes 1048 and 1056 are perpendicular to each other, forming an XY grid. Thus, each pixel of phosphor powder can be activated by the addressing an XY coordinate defined by the intersecting electrodes 1048 and 1056.

One of the problems currently encountered in plasma display devices is the long decay time of the phosphor particles, which creates a "tail" on a moving image. Through control of the phosphor chemistry, such decay-related problems can be reduced. Further, the spherical, non-agglomerated nature of the phosphor particles improves the resolution of the plasma display panel.

One sulfur-containing phosphor that is particularly useful in plasma displays is $Gd_2O_2S$:Tb for green. Preferably, such a phosphor is coated with a uniform coating having a thickness of from about 2 to 10 nanometers.

Another type of flat panel display is a field emission display (FED). These devices advantageously eliminate the size, weight and power consumption problems of CRT's while maintaining comparable image quality, and therefore are particularly useful for portable electronics, such as for laptop computers. FED's generate electrons from millions of cold microtip emitters with low power emission that are arranged in a matrix addressed array with several thousand tip emitters allocated to each pixel in the display. The microtip emitters are typically located approximately 0.2 millimeter from a cathodoluminescent phosphor screen, which generates the display image. This allows for a thin, light-weight display.

Figure 53:
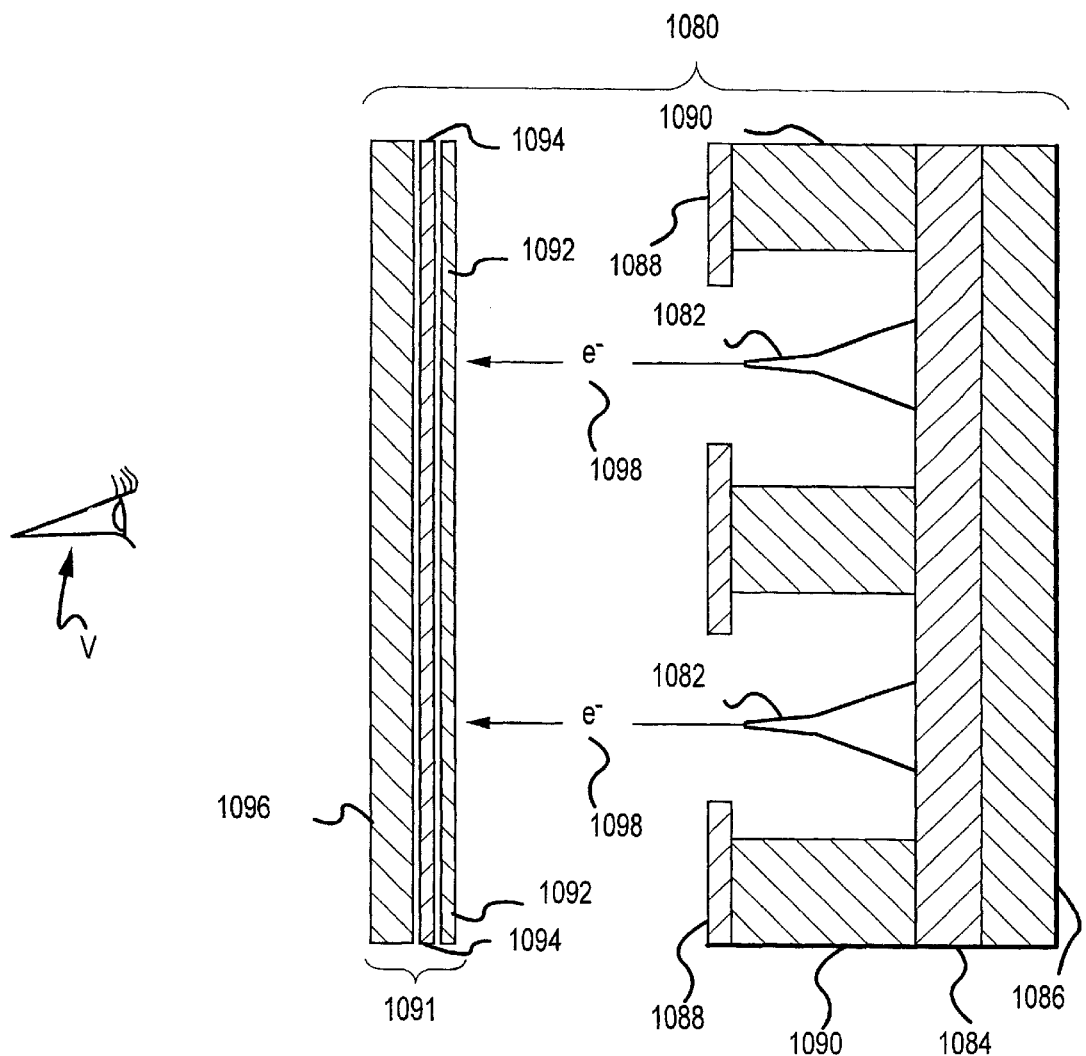
FIG. 53 schematically illustrates a field emission display according to an embodiment of the present invention.

FIG. 53 illustrates a high-magnification, schematic cross-section of an FED device according to an embodiment of the present invention. The FED device 1080 includes a plurality of microtip emitters 1082 mounted on a cathode 1084 which is attached to a backing plate 1086. The cathode is separated from a gate or emitter grid 1088 by an insulating spacer 1090. Opposed to the cathode 1084 and separated by a vacuum is a faceplate assembly 1091 including phosphor pixel 1092 and a transparent anode 1094. The phosphor pixel layers can be deposited using a paste or electrophoretically. The FED can also include a transparent glass substrate 1096 onto which the anode 1094 is printed. During operation, a positive voltage is applied to the emitter grid 1088 creating a strong electric field at the emitter tip 1082. The electrons 1098 migrate to the faceplate 1091 which is maintained at a higher positive voltage. The faceplate collector bias is typically about 1000 volts. Several thousand microtip emitters 1082 can be utilized for each pixel in the display.

Sulfur-containing phosphors which are particularly useful for FED devices include thiogallates such as $SrGa_2S_4$:Eu for green, $SrGa_2S_4$:Ce for blue, ZnS:Ag or Cl for blue and SrS:Ga or Cu for blue. ZnS:Ag or Cu can also be used for higher voltage FED devices. For use in FED devices, these phosphors are preferably coated, such as with a very thin metal oxide coating, since the high electron beam current densities can cause breakdown and dissociation of the sulfur-containing phosphor host material. Dielectric coatings such as $SiO_2$ and $Al_2O_3$ can be used. Further, semi-conducting coatings such as SnO or $In_2O_3$ can be particularly advantageous to absorb secondary electrons.

Coatings for the sulfur-containing FED phosphors preferably have an average thickness of from about 1 to 10 nanometers, more preferably from about 1 to 5 nanometers. Coatings having a thickness in excess of about 10 nanometers will decrease the brightness of the device since the electron penetration depth of 1–2 kV electrons is only about 10 nanometers. Such thin coatings can advantageously be monolayer coatings, as is discussed above.

The primary obstacle to further development of FED's is the lack of adequate phosphor powders. FED's require low-voltage phosphor materials, that is, phosphors which emit sufficient light under low applied voltages, such as less than about 500 volts, and high current densities. The sulfur-containing phosphor powders of the present invention advantageously have improved brightness under such low applied voltages and the coated phosphor particles resist degradation under high current densities. The improved brightness can be attributed to the high crystallinity and high purity of the particles. Phosphor particles with low crystallinity and high impurities due to processes such as milling do not have the desirable high brightness. The phosphor particles of the present invention also have the ability to maintain the brightness and chromaticity over long periods of time, such as in excess of 10,000 hours. Further, the spherical morphology of the phosphor powder improves light scattering and therefore improves the visual properties of the display. The small average size of the particles is advantageous since the electron penetration depth is only several nanometers, due to the low applied voltage.

Figure 54:
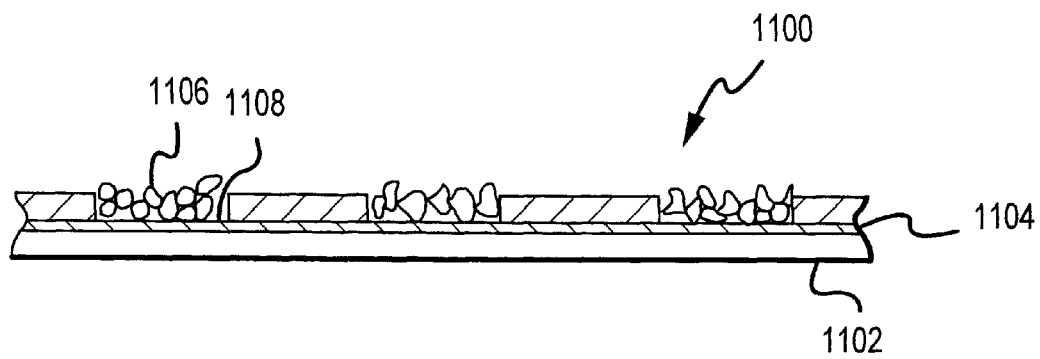
FIG. 54 illustrates pixel regions on a display device according to the prior art.

For each of the foregoing display devices, cathode ray tube devices and flat panel display devices including plasma display panels and field emission devices, it is important for the phosphor layer to be as thin and uniform as possible with a minimal number of voids. FIG. 54 schematically illustrates a lay down of large agglomerated particles in a pixel utilizing conventional phosphor powders. The device 1100 includes a transparent viewing screen 1102 and, in the case of an FED, a transparent electrode layer 1104. The phosphor particles 1106 are dispersed in pixels 1108. The phosphor particles are large and agglomerated and result in a number of voids and unevenness in the surface. This results in decreased brightness and decreased image quality.

Figure 55:
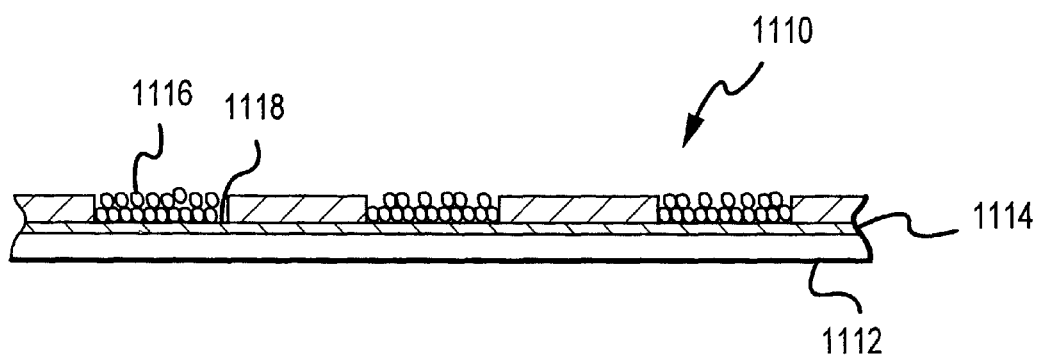
FIG. 55 illustrates pixel regions on a display device according to an embodiment of the present invention.

FIG. 55 illustrates the same device fabricated utilizing powders according to the present invention. The device 1110 includes transparent viewing screen 1112 and a transparent electrode 1114. The phosphor powders 1116 are dispersed in pixels in 1118. The pixels are thinner and more uniform than the conventional pixel. In a preferred embodiment, the phosphor layer constituting the pixel has an average thickness of not greater than about 3 times the average particle size of the powder, preferably not greater than about 2 times the average particle size and even more preferably not greater than about 1.5 times the average particle size. This unique characteristic is possible due to the unique combination of small particle size, narrow size distribution and spherical morphology of the phosphor particles. The device will therefore produce an image having much higher resolution due to the ability to form smaller, more uniform pixels and much higher brightness since light scattering is significantly reduced and the amount of light lost due to non-luminescent particles is reduced.

Electroluminescent displays (EL displays) work by electroluminescence. EL displays are very thin structures which can have very small screen sizes, such as few inches diagonally, while producing a very high resolution image. These displays, due to the very small size, are utilized in many military applications where size is a strict requirement such as in aircraft cockpits, small hand-held displays and heads-up displays. These displays function by applying a high electric potential between two addressing electrodes. EL displays are most commonly driven by an A.C. electrical signal. The electrodes are in contact with a semiconducting phosphor thin-film and the large potential difference creates hot electrons which move through the phosphor, allowing for excitation followed by light emission.

Figure 56:
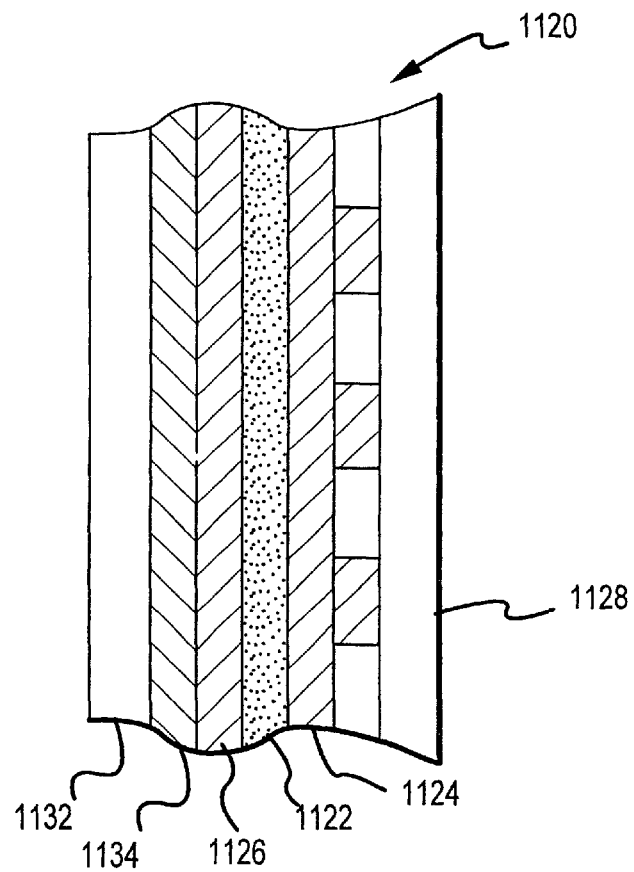
FIG. 56 schematically illustrates a cross-section of an electroluminescent display device according to an embodiment of the present invention.
Figure 57:
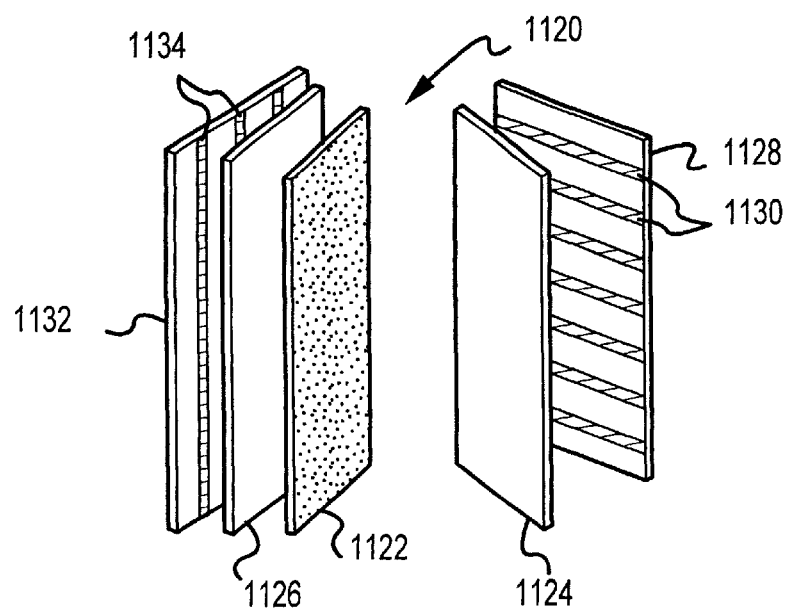
FIG. 57 schematically illustrates an exploded view of an electroluminescent display device according to an embodiment of the present invention.

An EL display is schematically illustrated in FIGS. 56 and 57. The EL display device 1120 includes a phosphor layer 1122 sandwiched between two dielectric insulating layers. 1124 and 1126. On the back side of the insulating layers is a backplate 1128 which includes row electrodes 1130. On the front of the device is a glass faceplate 11 32 which includes transparent column electrodes 11 34, such as electrodes made from transparent indium tin oxide.

While current electroluminescent display configurations utilize a thin film phosphor layer 1122 and do not typically utilize phosphor powders, the use of very small monodispersed phosphor particles according to the present invention is advantageous for use in such devices. For example, small monodispersed particles could be deposited on a glass substrate using a thick film paste and sintered to produce a well connected film and therefore could replace the expensive and material-limited CVD technology currently used to deposit such films. Such a well-connected film could not be formed from large, agglomerated phosphor particles. Similarly, composite phosphor particles are a viable alternative to the is relatively expensive multilayer stack currently employed in electroluminescent displays. Thus, a composite phosphor particle comprising the phosphor and a dielectric material could be used.

Particularly preferred phosphors for use in electroluminescent display applications include the metal sulfides such as ZrS:Cu, BaS Ce, CaS:Ce, SrS:RE (RE=rare earth), and ZnS:Mn. Further, mixed metal sulfides such as (Sr,Ca,Ba)S:Ce can be used. Further, the thiogallate phosphors according to the present invention can also have advantages for use in electroluminescent displays.

Another display device for which the phosphors according to the present invention are useful are liquid crystal displays (LCD), and in particular active matrix liquid crystal displays (AMLCD). Such LCD displays are currently used for a majority of laptop computer display screens. The key element of an LCD device is the liquid crystal material which can be influenced by an electric field to either transmit light or block light.

LCD displays work by producing a light field and filtering light from the field using the liquid crystal material to produce an image. As a result, only about 3% of the light emitted by the underlying phosphor screen is transmitted to the viewer. Therefore, the phosphors according to the present invention having a higher brightness can provide LCD displays having increased brightness and contrast.

Figure 58:
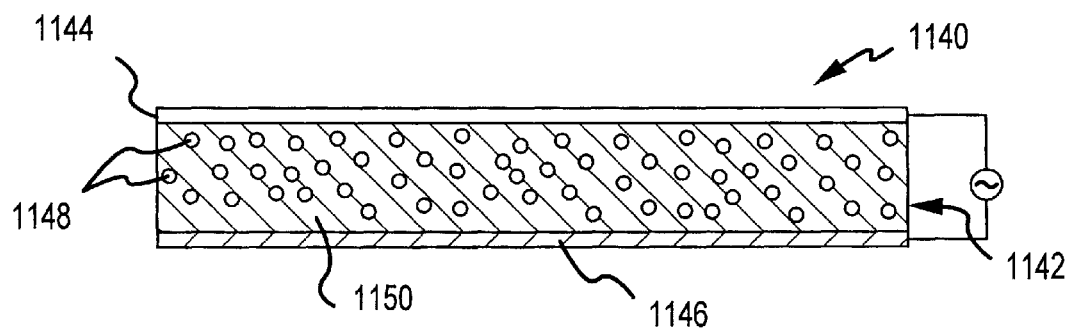
FIG. 58 illustrates an electroluminescent lamp according to an embodiment of the present invention.

Another use for phosphor powders according to the present invention is in the area of electroluminescent lamps. Electroluminescent lamps are formed on a rigid or flexible substrate, such as a polymer substrate, and are commonly used as back lights for membrane switches, cellular phones, watches, personal digital assistants and the like. A simple electroluminescent lamp is schematically illustrated in FIG. 58. The device 1140 includes a phosphor powder/polymer composite 1142 is sandwiched between two electrodes 1144 and 1146, the front electrode 1144 being transparent. The composite layer 1142 includes phosphor particles 1148 dispersed in a polymer matrix 1150.

Electroluminescent lamps can also be formed on rigid substrates, such as stainless steel, for use in highway signage and similar devices. The rigid device includes a phosphor particle layer, a ceramic dielectric layer and a transparent conducting electrode layer. Such devices are sometimes referred to as solid state ceramic electroluminescent lamps (SSCEL). To form such rigid devices, a phosphor powder is typically sprayed onto a rigid substrate.

Electroluminescent lamp manufacturers currently have only simple metal sulfides such as ZnS phosphor powder host material at their disposal. ZnS:Cu produces a blue color, while ZnS:Mn, Cu produces an orange color. These materials have poor reliability and brightness, especially when filtered to generate other colors. Additional colors, higher reliability and higher brightness powders are critical needs for the electroluminescent lamp industry to supply designers with the ability to penetrate new market segments. The phosphor layers should also be thinner and denser, without sacrificing brightness, to minimize water intrusion and eliminate light scattering. Higher brightness electroluminescent lamps require thinner phosphor layers, which requires smaller particle size phosphor powders that cannot produced by conventional methods. Such thinner layers will also use less phosphor powder. Presently available EL lamps utilize powders having an average size of about 5 $\mu$m or higher. The phosphor powders of the present invention having a small particle size and narrow size distribution, will enable the production of brighter and more reliable EL lamps that have an increased life-expectancy. Further, the phosphor powders of the present invention will enable the production of EL lamps wherein the phosphor layer has a significantly reduced thickness, without sacrificing brightness or other desirable properties. Conventional EL lamps have phosphor layers on the order of 100 $\mu$m thick. The powders of the present invention advantageously enable the production of an EL lamp having a phosphor layer that is not greater than about 15 $\mu$m thick, such as not greater than about 10 $\mu$m thick. The phosphor layer is preferably not thicker than about 3 times the weight average particle size, more preferably not greater than about 2 times the weight average particle size.

As discussed above, preferred electroluminescent sulfur-containing phosphors for use in electroluminescent lamps include ZnS:Cu for blue or blue-green and ZnS:Mn, Cu for orange. Other materials that are desirable for EL lamp applications include BaS:RE, Cu or Mn, CaS:RE or Mn, SrS:RE or Mn, and (Sr,Ca,Ba)S:RE (where RE is a rare earth element) for other colors. CaS:Ga or Cu and SrS:Ga or Cu are also useful. The thiogallate phosphors of the present Invention, such as $SrGa_2S_4$ and $CaGa_2S_4$, can be particularly advantageous for use in electroluminescent lamps. As is discussed above, many of these phosphors cannot be produced using conventional techniques and therefore have not been utilized in EL lamp applications. When used in an EL lamp, these phosphors should be coated to prevent degradation of the phosphor due to hydrolysis or other adverse reactions, Preferably, such a coating has an average thickness of from about 2 to 50 nanometers.

As stated above, electroluminescent lamps are becoming increasingly important for back lighting alphanumeric displays in small electronic devices such as cellular phones, pagers, personal digital assistants, wrist watches, calculators and the like. They are also useful in applications such as instrument panels, portable advertising displays, safety lighting, emergency lighting for rescue and safety devices, photographic backlighting, membrane switches and other similar applications. One of the problems associated with electroluminescent devices is that they generally require the application of alternating current (AC) voltage to produce light. A significant obstacle to the development of the useful direct current (DC) electroluminescent (DCEL) devices is a need for a phosphor powder that will function adequately under a DC electric field. The phosphor powder for functioning under a DC electric field should meet at least three requirements: 1) the particles should have a small average particle size; 2) the particles should have a uniform size, that is, the particles should have a narrow size distribution with no large particles or agglomerates; and 3) the particles should have good luminescence,properties, particularly a high brightness. The phosphor powders of the present invention advantageously meet these requirements. Therefore, the phosphor powders of the present invention will advantageously permit the use of electroluminescent devices without requiring an inverter to convert a DC voltage to an AC voltage. Such devices are not believed to be commercially available at this time. When utilized in a device applying DC voltage, it is preferred to coat the phosphor particles with a thin layer of a conductive compound, such as a metal, for example copper metal, or a conductive compound such as copper sulfide.

The sulfur-containing phosphors of the present invention are also useful for security purposes. In this application, phosphors which are undetectable under normal lighting, become visible upon illumination by a particular energy, typically ultraviolet or infrared radiation, emitting characteristic wavelengths, typically in the ultraviolet spectrum.

For security purposes, the phosphor particles are dispersed into a liquid vehicle which can be applied onto a surface by standard ink deposition methods, such as by using an ink jet or a syringe, or by screen printing. The phosphor particles of the present invention, having a small size and narrow size distribution, will permit better control over the printed feature size and complexity. The methodology of the present invention also permits unique combinations of phosphor compounds that are not available using conventional methods. Such taggents can be applied to currency, secure documentation, explosives and munitions, or any other item that may require coding.

Useful phosphor compounds for taggent applications include metal sulfides doped with at least two activator ions, such as SrS:Sm, Ce or CaS:Sm, Eu. Oxysulfides, such as $Y_2O_2S$:Er, Yb are also useful. Such phosphors emit visible light upon excitation by an infrared source. The sulfur-containing phosphor powders of the present invention provide many advantages in such applications. The small, monodispersed nature of the particles makes the particles easy to supply in smaller quantities. Further, different colors for specific security purposes can be achieved by using mixed metal sulfides wherein the ratio of the sulfides is varied to obtain different wavelengths of color, as is discussed above.

Up-convertor phosphors are also useful in immunoassay applications. Immunoassays are bioactive agent detectors designed to detect chemicals in the bloodstream, such as sugars, insulin or narcotics. The phosphor is delivered to the biological substrate and the interaction between the substrate and the underlying phosphor results in a detected color shift which can be correlated with the concentration of the initial bioactive molecule present in the sample. For example, incident infrared light can result in a detectable ultraviolet signal from the phosphor. The up-convertor phosphors of the present invention used for such immunoassay applications preferably have an average particle size of from about 0.1 $\mu$m to about 0.4 $\mu$m and are preferably coated to bind the biologically active molecule. Preferred sulfur-containing phosphors include SrS:Sm, Eu as well as oxysulfides. The particles are frequently coated, such as with $SiO_2$, to enhance to binding of the phosphor to the biological substrate and for biocompatibility.

In addition to the foregoing, the sulfur-containing phosphors of the present invention can also be used as target materials for the deposition of phosphor thin-films by electron beam deposition, sputtering and the like. The particles can be consolidated to form the target for the process. The homogenous concentration of activator ions in the particles will lead to more uniform and brighter film. The phosphor powders can also be used to adjust the color of light emitting diodes.

For many of the foregoing applications, phosphor powders are often dispersed within a paste, or ink, which is then applied to a surface to obtain a phosphorescent layer. These pastes are commonly used for electroluminescent lamps, FED's, plasma displays, CRT's, lamp phosphors and thick-film electroluminescent displays. The powders of the present invention offer many advantages when dispersed in such a paste. For example, the powders will disperse better than non-spherical powders of wide size distribution and can therefore produce thinner and more uniform layers with a reduced lump-count. Such a thick film paste will produce a brighter display. The packing density of the phosphors will also be higher. The number of processing steps can also be advantageously reduced. For example, in the preparation of electroluminescent lamps, two dielectric layers are often needed to cover the phosphor paste layer because many of the phosphor particles will be large enough to protrude through one layer. Spherical particles that are substantially uniform in size will eliminate this problem and the EL lamp will advantageously require one dielectric layer.

One preferred class of intermediate products according to the present invention are thick film paste compositions, also referred to as thick film inks. These pastes are particularly useful for the application of the phosphor particles onto a substrate, such as for use in a flat panel display, as is discussed more fully hereinabove.

In the thick film process, a viscous paste that includes a functional particulate phase, such as phosphor powder, is screen printed onto a substrate. A porous screen fabricated from stainless steel, polyester, nylon or similar inert material is stretched and attached to a rigid frame. A predetermined pattern is formed on the screen corresponding to the pattern to be printed. For example, a UV sensitive emulsion can be applied to the screen and exposed through a positive or negative image of the design pattern. The screen is then developed to remove portions of the emulsion in the pattern regions.

The screen is then affixed to a printing device and the thick film paste is deposited on top of the screen. The substrate to be printed is then, positioned beneath the screen and the paste is forced through the screen and onto the substrate by a squeegee that traverses the screen. Thus, a pattern of traces and/or pads of the paste material is transferred to the substrate. The substrate with the paste applied in a predetermined pattern is then subjected to a drying and heating treatment to adhere the functional phase to the substrate. For increased line definition, the applied paste can be further treated, such as through a photolithographic process, to develop and remove unwanted material from the substrate.

Thick film pastes have a complex chemistry and generally include a functional phase, a binder phase and an organic vehicle phase. The functional phase can include the phosphor powders of the present invention which provide a luminescent layer on a substrate. The particle size, size distribution, surface chemistry and particle shape of the particles all influence the rheology of the paste.

The binder phase is typically a mixture of inorganic binders such as metal oxide or glass frit powders. For example, PbO based glasses are commonly used as binders. The function of the binder phase is to control the sintering of the film and assist the adhesion of the functional phase to the substrate and/or assist in the sintering of the functional phase. Reactive compounds can also be included in the paste to promote adherence of the functional phase to the substrate.

Thick film pastes also include an organic vehicle phase that is a mixture of solvents, polymers, resins or other organics whose primary function is to provide the appropriate rheology (flow properties) to the paste. The liquid solvent assists in mixing of the components into a homogenous paste and substantially evaporates upon application of the paste to the substrate. Usually the solvent is a volatile liquid such as methanol, ethanol, terpineol, butyl carbitol, butyl carbitol acetate, aliphatic alcohols, esters, acetone and the like. The other organic vehicle components can include thickeners (sometimes referred to as organic binders), stabilizing agents, surfactants, wetting agents and the like. Thickeners provide sufficient viscosity to the paste and also acts as a binding agent in the unfired state. Examples of thickeners include ethyl cellulose, polyvinyl acetate, resins such as acrylic resin, cellulose resin, polyester, polyamide and the like. The stabilizing agents reduce oxidation and. degradation, stabilize the viscosity or buffer the pH of the paste. For example, triethanolamine is a common stabilizer. Wetting agents and surfactants are well known in the thick film paste art and can include triethanolamine and phosphate esters.

The different components of the thick film paste are mixed in the desired proportions in order to produce a substantially homogenous blend wherein the functional phase is well dispersed throughout the paste. The powder is often dispersed in the paste and then repeatedly passed through a roll-mill to mix the paste. The roll mill can advantageously break-up soft agglomerates of powders in the paste. Typically, the thick film paste will include from about 5 to about 95 weight percent, such as from about 60 to 85 weight percent, of the functional phase, including the phosphor powders of the present invention.

Some applications of thick film pastes, such as for forming high-resolution display panels, require higher tolerances than can be achieved using standard thick-film technology, as is described above. As a result, some thick film pastes have photo-imaging capability to enable the formation of lines and traces with decreased width and pitch. In this type of process, a photoactive thick film paste is applied to a substrate substantially as is described above. The paste can include, for example, a liquid vehicle such as polyvinyl alcohol, that is not cross-linked. The paste is then dried and exposed to ultraviolet light through a photomask to polymerize the exposed portions of paste and the paste is developed to remove unwanted portions of the paste. This technology permits higher density lines and pixels to be formed. The combination of the foregoing technology with the phosphor powders of the present invention permits the fabrication of devices with resolution and tolerances as compared to conventional technologies using conventional phosphor powders.

Phosphor paste compositions are disclosed in U.S. Pat. No. 4,724,161, U.S. Pat. No. 4,806,389, U.S. Pat. No. 4,902,567 which are incorporated herein by reference in their entirety.

EXAMPLES

In order to demonstrate the advantages of the present invention, the following examples were prepared.

1. Simple Metal Sulfides (SrS:Mn)

1 gram of strontium carbonate ($SrCO_3$) was added to 20 ml of deionized water. The suspension was stirred and about 1 ml of thioacetic acid (HS(O)CR) and 0.003 grams $MnCl_2$ were added. The strontium carbonate rapidly dissolved to form a clear, pale-yellow solution.

The solution was placed into contact with an ultrasonic nebulizer operating at a frequency of about 1.6 MHZ to produce an aerosol of solution droplets. A nitrogen carrier gas was used to carry the droplets into an elongate tubular furnace heated to a temperature of 600–1500° C. The resulting powder was a substantially phase-pure SrS with $Mn^{2+}$ incorporated as an activator ion, a green phosphor. The average particle size was about 1.0 $\mu$m. X-ray diffraction indicated that the particles consisted of phase pure SrS with high crystallinity.

2. Simple Metal Sulfides (ZnS:Mn)

Zinc nitrate were placed into a solution with about two equivalents of thiourea to yield a total of about 3.3 weight percent zinc in the solution. 0.5 mole percent manganese was added to the solution in the form of manganese chloride ($MnCl_2$). The solution was stirred to yield a fine yellow precipitate.

Figure 59:
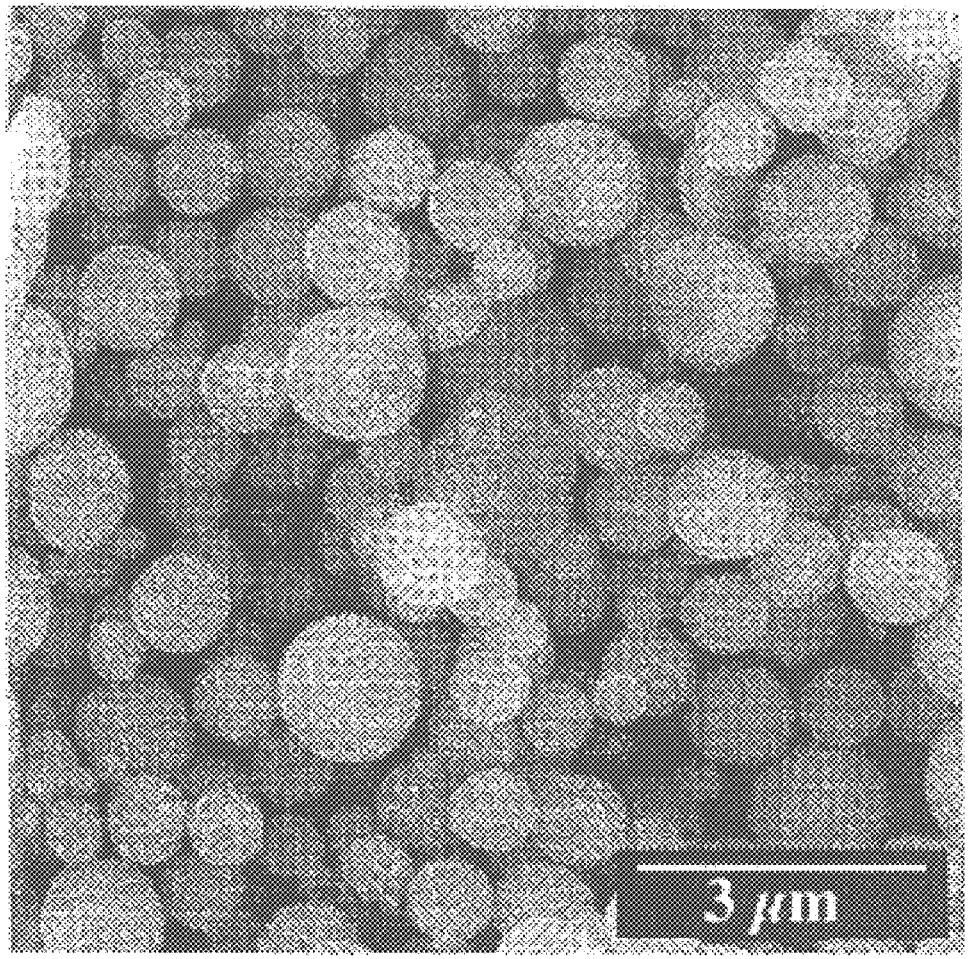
FIG. 59 illustrates a photomicrograph of a sulfur-containing phosphor powder according to an embodiment of the present invention.

The solution was formed into an aerosol as in Example 1 and was carried in nitrogen gas to an elongate tube furnace heated to a peak temperature of 950° C. Aerosol droplets having a size of larger than about 10 $\mu$m were removed from the aerosol using an impactor before entering the furnace. The resulting powder had an average particle size of about 0.75 $\mu$m and included substantially no particles having a size greater than about 1.1 $\mu$m. As is illustrated by FIG. 59, the particles had a substantially spherical morphology and a small particle size.

Figure 60:
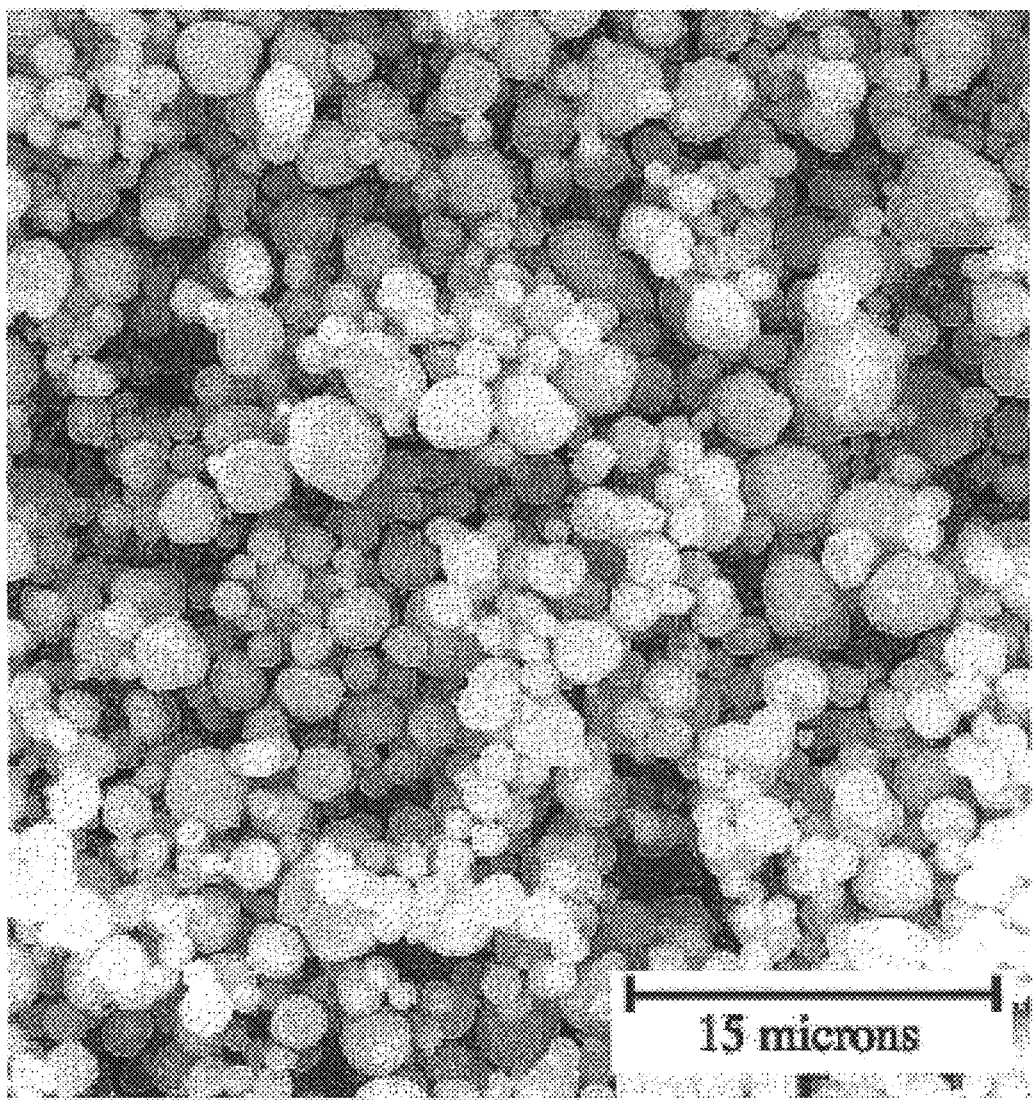
FIG. 60 illustrates a photomicrograph of a sulfur-containing phosphor powder according to an embodiment of the present invention.

Other simple metal sulfide phosphors that were produced in accordance with the present invention in a similar manner to Examples 1 and 2 were CaS, MgS and BaS incorporating various activator ions. An SEM photomicrograph of a BaS:Ce powder produced according to the present invention is illustrated in FIG. 60.

3. Mixed Metal Sulfides ($Ca_{0.5}Sr_{0.5}S$:Ce)

An aqueous solution was prepared by mixing calcium and strontium carbonates with thioacetic acid for a mole ratio of calcium to strontium of about 1:1. About 0.5 mole percent cerium was added in the form of cerium nitrate $Ce(NO_3)_3$. The solution was a atomized as in Example 1 and was carried using nitrogen gas into an elongate tube furnace heated to a peak temperature of 1100° C. The resulting particles had a small average particle size and had a spherical morphology, similar to the powder illustrated in FIG. 59.

Thus, mixed metal sulfide phosphors can be produced in accordance with the present invention. Other examples of mixed metal sulfides which were produced in accordance with this example Include (Ca,Sr)S and (Mg,Sr)S.

4. ZnS:M (Colloid Route)

Two equivalents of thioacetic acid were added to basic zinc carbonate ($Zn_x(OH)_y(CO_3)_z$) and about 0.5 mole percent of a metal dopant was added in the form of a metal salt. After about 30 minutes, the clear solution precipitates a fine yellow powder of ZnS. The fine powder is colloidal in form and had an average particle size of less than about 0.5 micrometers. The solution was atomized to form droplets and was carried into a furnace at 950° C. using nitrogen gas.

Figure 61:
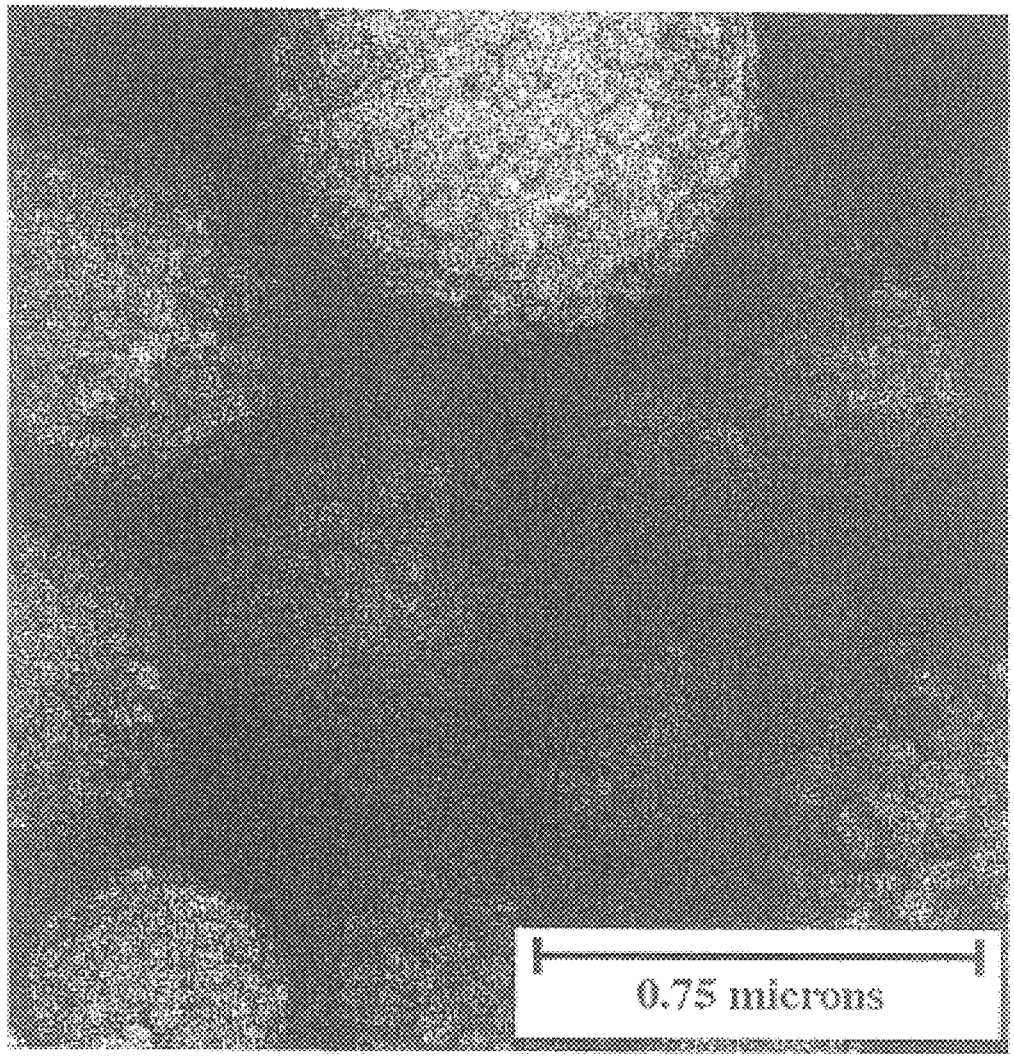
FIG. 61 illustrates a photomicrograph of a sulfur-containing phosphor powder according to an embodiment of the present invention.

The particles had an increased crystallinity as opposed to particles formed from soluble precursors (Example 1). The powder is illustrated in FIG. 61. The increased crystallinity will produce higher brightness in a device such as an FED or electroluminescent lamp.

5. Coated ZnS

Zinc sulfide phosphor powder was coated according to the present invention by contacting coating precursors with the particles at an elevated temperature. Selected coating compounds were alumina, tin oxide and silica. The precursors were Al $(secBuO)_3$ for alumina; $(Me)_2$ $SnCl_2$ and $(nBu)_2Sn(OAc)_2$ for tin oxide ($SnO_2$) and tetraethylorthosilicate (TEOS) for silica. The precursors were introduced into the furnace and contacted with the ZnS particles at a reaction temperature of 500° C. to 700° C. in nitrogen. The ZnS powder was fed into the furnace using a Wright dust feeder and coatings were deposited by reaction in the gas phase to form a coating by a GPC mechanism. The coating improves resistance to degradation from water and other influences during use of the phosphor powders.

6. Annealing of Phosphor Powders

Various phosphor produced in accordance with the present invention were annealed under varying conditions to determine the effect of the annealing treatment.

An SrS:Eu phosphor which was formed at 1000° C. and included 1 atomic weight percent europium was annealed in static argon for 1 minute at temperatures varying from 700° C. to 1100° C. It was observed that the maximum average crystallite size of about 52 nanometers was obtained at about 800° C. A corresponding peak in the photoluminescent intensity was observed corresponding to this annealing temperature.

An SrS:Eu phosphor which was processed at 1100° C. and included 0.25 atomic percent europium was annealed in static argon for 1 hour at various temperatures. A peak in the photoluminescent intensity was observed when the powder was annealed at a temperature of about 950° C. When the same phosphor was annealed in flowing argon for about 30 minutes, a similar peak was observed at about 900° C. Thus, it was concluded that the optimum annealing temperature for this metal sulfide was about 800 to 900° C.

7. Thiogallate Compounds

As is discussed herein, thiogallate compounds are preferably produced using a spray-conversion process. Such a process is required to produce a substantially phase pure thiogallate compound with low impurities and a desirable morphology.

An aqueous solution was formed including 2 mole equivalents gallium nitrate ($Ga(NO_3)_3$) and 1 mole equivalent strontium nitrate ($Sr(NO_3)_2$). About 0.05 mole equivalents of europium nitrate ($Eu(NO_3)_3$) was also added.

The aqueous solution was formed into an aerosol, substantially in accordance with Example 1. The aerosol was carried in air through a furnace heated to a temperature of about 800° C. to spray-convert the solution. The intermediate product was a $SrGa_2O_4$ oxide having a small average particle size and low impurities.

The oxide intermediate product was then roasted at 900° C. under a flowing gas that included $H_2S$ and nitrogen in a 1:1 ratio, for about 20 minutes. The resulting powder was substantially phase pure $SrGa_2S_4$:Eu (3 atomic percent Eu) having good crystallinity and good luminescent characteristics.

While various embodiments of the present invention have been described in detail, it is apparent that modifications and adaptations of those embodiments will occur to those skilled in the art. However, it is to be expressly understood that such modifications and adaptations are within the spirit and scope of the present invention.

What is claimed is:

1. A powder batch comprising metal sulfide phosphor particles wherein said metal sulfide phosphor particles comprise a metal sulfide host material, and wherein said particles are substantially spherical, have a weight average particle size of from 0.3 µm to not greater than about 5 µm and a particle size distribution wherein at least about 90 weight percent of said particles are not larger than twice said average particle size.

2. A powder batch as recited in claim 1, wherein said phosphor particles have a particle size distribution wherein at least about 95 weight percent of said particles are not larger than twice said average particle size.

3. A powder batch as recited in claim 1, wherein said phosphor particles comprise a host material selected from the Group 2 metal sulfides.

4. A powder batch as recited in claim 1, wherein said phosphor particles comprise a metal sulfide host material selected from the group consisting of CaS, SrS and BaS.

5. A powder batch as recited in claim 1, wherein said phosphor particles comprise a host material selected from the Group 12 metal sulfides.

6. A powder batch as recited in claim 1, wherein said phosphor particles comprise a metal sulfide host material selected from the group consisting of ZnS and Cds.

7. A powder batch as recited in claim 1, wherein said phosphor particles further comprise from about 0.02 to about 15 atomic percent of an activator ion.

8. A powder batch as recited in claim 1, wherein said phosphor particles further comprise from about 0.02 to about 15 atomic percent of an activator ion selected from the group consisting of rare-earth elements, Cu, Mn, Ag, Al, Au, Cl, Ga and mixtures thereof.

9. A powder batch as recited in claim 1, wherein said phosphor particles comprise crystallites having an average crystallite size of at least about 25 nanometers.

10. A powder batch as recited in claim 1, wherein said phosphor particles comprise a substantially uniform metal oxide coating on an outer surface thereof.

11. A powder batch comprising mixed metal sulfide phosphor particles comprising a host material having the general formula ($M^1$, $M^2$)S wherein $M^1$ and $M^2$ are selected from Group 2 metals and Group 12 metals, wherein said phosphor particles have a weight average particle size of from 0.3 µm to not greater than about 10 µm and a particle size distribution wherein at least about 90 weight percent of said particles are not larger than twice said average particle size.

12. A powder batch as recited in claim 11, wherein said weight average particle size is not greater than about 5 µm.

13. A powder batch as recited in claim 11, wherein $M^1$ and $M^2$ are selected from the Group 2 metals.

14. A powder batch as recited in claim 11, wherein $M^1$ and $M^2$ are selected from the Group 12 metals.

15. A powder batch as recited in claim 11, wherein said phosphor particles further comprise from about 0.02 to about 15 atomic percent of an activator ion.

16. A powder batch as recited in claim 11, wherein said phosphor particles are substantially spherical.

17. A powder batch as recited in claim 11, wherein said phosphor particles comprise crystallites having an average crystallite size of at least about 25 nanometers.

18. A powder batch as recited in claim 11, wherein said phosphor particles further comprise from about 0.02 to about 15 atomic percent of an activator ion selected from the group consisting of rare-earth elements, Cu, Mn, Ag, Al, Au, Cl, Ga and mixtures thereof.

19. A powder batch as recited in claim 1, wherein said average particle size is from 0.3 µm to about 3 µm.

20. A powder batch as recited in claim 11, wherein said average particle size is from 0.3 µm to about 3 µm.

* * * * *

UNITED STATES PATENT AND TRADEMARK OFFICE
CERTIFICATE OF CORRECTION

PATENT NO. : 6,645,398 B1  
DATED : November 11, 2003  
INVENTOR(S) : Hampden-Smith et al.

Page 1 of 1

It is certified that error appears in the above-identified patent and that said Letters Patent is hereby corrected as shown below:

<u>Column 11,</u>  
Line 18, delete the word "the'transducer", and insert therefore -- the transducer --.

<u>Column 33,</u>  
Line 10, delete the word "trichiloride", and insert therefor -- trichloride --.

<u>Column 48,</u>  
Line 52, delete the word "luminescence,properties", and insert therefor -- luminescence properties --.

<u>Column 54,</u>  
Line 14, delete the word "Cds", and insert therefor -- CdS --.

Signed and Sealed this

Twenty-fourth Day of February, 2004

JON W. DUDAS  
*Acting Director of the United States Patent and Trademark Office*

UNITED STATES PATENT AND TRADEMARK OFFICE
CERTIFICATE OF CORRECTION

PATENT NO.  : 6,645,398 B1 Page 1 of 1
DATED       : November 11, 2003
INVENTOR(S) : Hampden-Smith et al.

It is certified that error appears in the above-identified patent and that said Letters Patent is hereby corrected as shown below:

Column 1,
Line 12, insert the following paragraph:
-- STATEMENT REGARDING FEDERALLY-SPONSORED RESEARCH/ DEVELOPMENT
This invention was made with Government support under contracts N00014-95-C-0278 and N00014-96-C-0395 awarded by the Office of Naval Research. The Government has certain rights in the invention. --

Signed and Sealed this

Twenty-eighth Day of December, 2004

JON W. DUDAS
*Director of the United States Patent and Trademark Office*